(12) United States Patent
Nomura et al.

(10) Patent No.: US 7,120,617 B2
(45) Date of Patent: Oct. 10, 2006

(54) OPERATION CIRCUIT AND OPERATION CONTROL METHOD THEREOF

(75) Inventors: Osamu Nomura, Fukuoka (JP); Takashi Morie, Hiroshima (JP); Teppei Nakano, Fukuoka (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/036,001

(22) Filed: Jan. 18, 2005

(65) Prior Publication Data

US 2005/0122238 A1 Jun. 9, 2005

Related U.S. Application Data

(63) Continuation of application No. PCT/JP2004/015540, filed on Oct. 14, 2004.

(30) Foreign Application Priority Data

Oct. 16, 2003 (JP) ............................. 2003-356626
Oct. 16, 2003 (JP) ............................. 2003-356627

(51) Int. Cl.
*G06N 3/00* (2006.01)
*H03K 23/00* (2006.01)
(52) U.S. Cl. ............................. 706/26; 706/15; 706/35; 706/33
(58) Field of Classification Search .................. 706/26
See application file for complete search history.

(56) References Cited

U.S. PATENT DOCUMENTS 4,077,030 A 2/1978 Helava ..................... 340/183

5,165,010 A * 11/1992 Masuda et al. ............... 706/42

FOREIGN PATENT DOCUMENTS

JP 4-2222 1/1992

OTHER PUBLICATIONS

Kelsuke Korekado, et al.; "A Convolutional Neural Network VLSI for Image Recognition Using Merged/Mixed Analog-Digital Architecture", 2003; pp. 169-176.
Yasoji Suzuki, et al.; "Introduction to Pulse/Digital Circuit", Nikkan Kogyo Shimbun, Jul. 26, 2001; pp. 225-232.
U.S Appl. No. 11/055,283, filed on Feb. 10, 2005.
U.S. Appl. No. 11/078,287, filed on Mar. 14, 2005.

* cited by examiner

*Primary Examiner*—Anthony Knight
*Assistant Examiner*—Nathan H. Brown, Jr.
(74) *Attorney, Agent, or Firm*—Fitzpatrick, Cella Harper & Scinto

(57) ABSTRACT

A product-sum operation circuit includes a pulse width/digital conversion circuit (9) which converts a pulse signal having a pulse width representing an operand value into a digital signal, a sorting circuit (4) which outputs, in descending or ascending order of magnitude, a plurality of operand values Xi converted into digital signals by the pulse width/digital conversion circuit (9), and an accumulated sum circuit (1) which multiplies each operand value output from the sorting circuit (4) by a corresponding operand value Wi and calculates the accumulated sum of multiplication results. The pulse width/digital conversion circuit (9) includes a counter (10) which counts a clock and outputs a count value as a digital signal, and n trailing edge latch circuits (11-0–11-(n−1)) each of which latches a common count value output from the counter at the trailing edge of the input pulse signal.

38 Claims, 72 Drawing Sheets

FIG. 3

| LABEL | OPERAND VALUE Xi | DETECTION FLAG |
|---|---|---|
|  |  |  |
|  |  |  |
|  |  |  |
| MEMORY CELL ARRAY |  |  |
|  |  |  |
|  |  |  |
| ⋮ | ⋮ | ⋮ |
|  |  |  |

FIG. 4

| LABEL | FLAG |
|---|---|
| | 0 |
| | 1 |
| | 0 |
| MEMORY CELL ARRAY | 0 |
| | 0 |
| | 1 |
| ⋮ | ⋮ |
| | |

F I G. 40
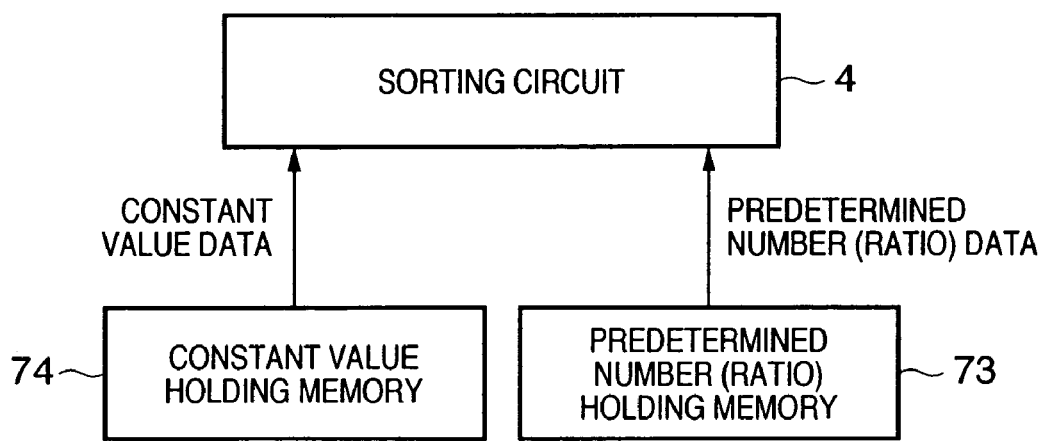

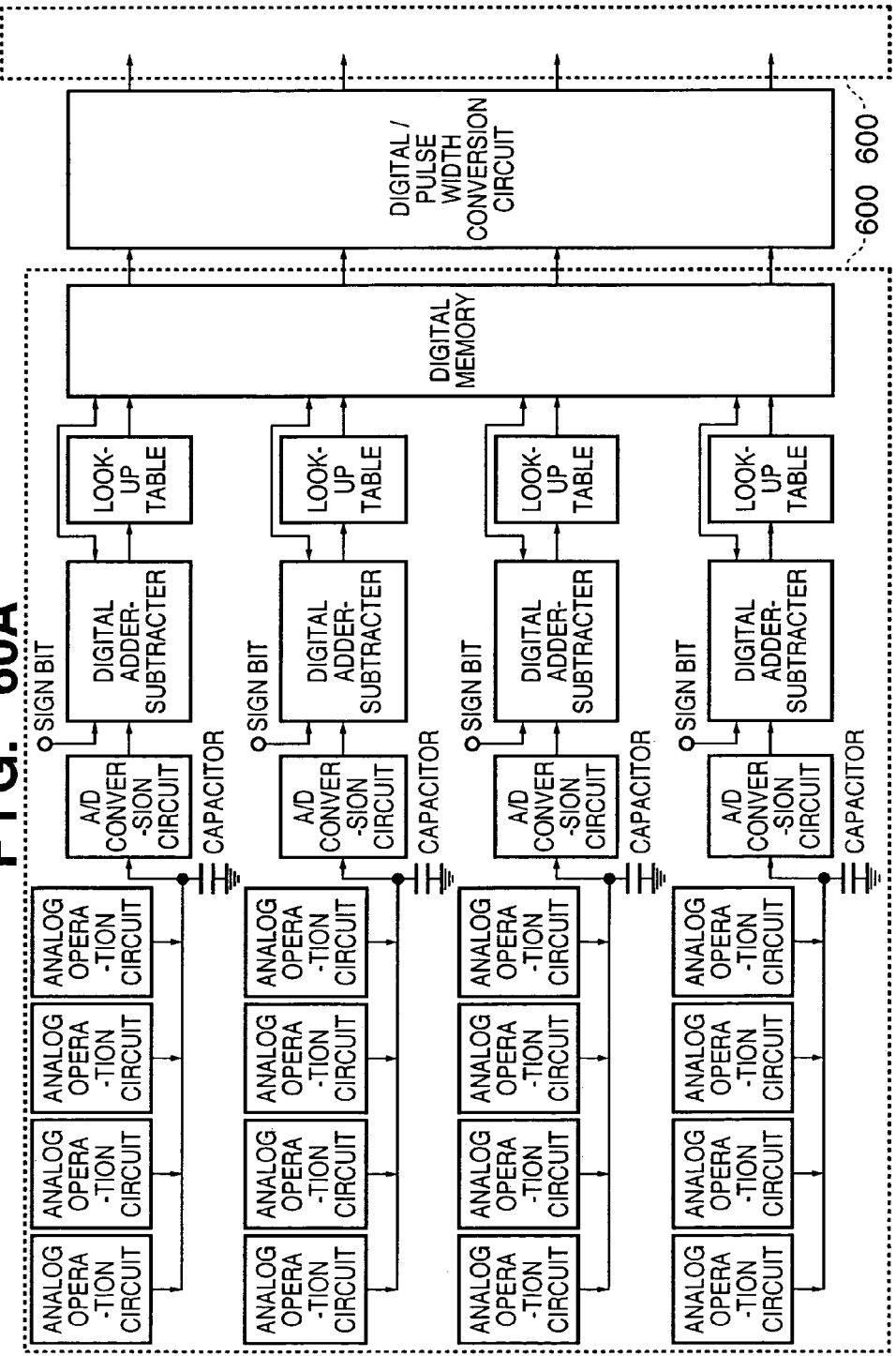

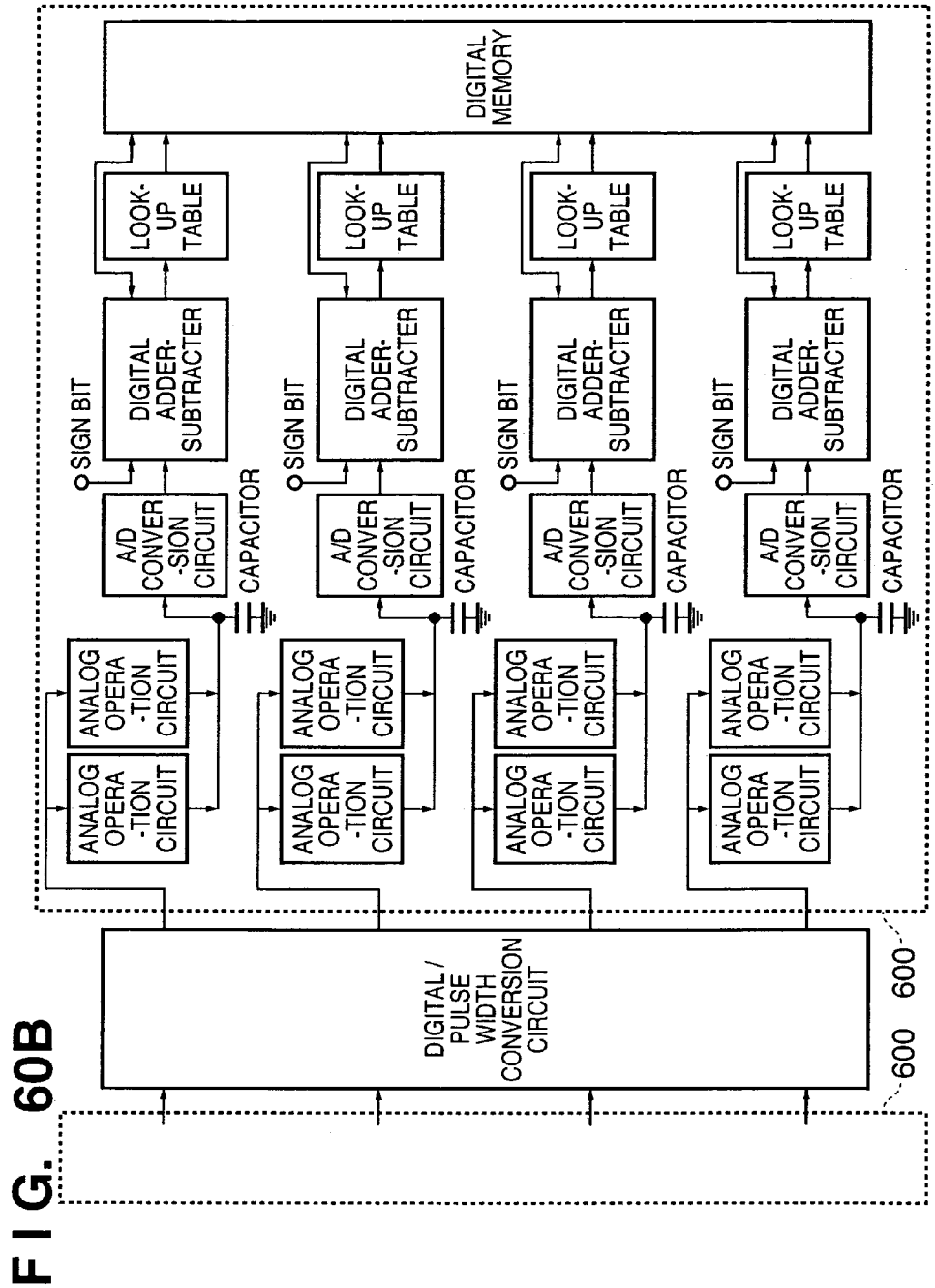
F I G. 60B

OPERATION CIRCUIT AND OPERATION CONTROL METHOD THEREOF

CLAIM OF PRIORITY

This application is a continuation of International Application No. PCT/JP2004/015540, filed on Oct. 14, 2004.

TECHNICAL FIELD

The present invention relates to a product-sum operation circuit which executes multiplication and accumulation in parallel and an operation control method thereof.

BACKGROUND ART

Computers are making leap developments and are used in various scenes in the society these days. However, these computers called Neumann types are very weak in processing (e.g., real-time human face recognition) easy for a human because of their characteristics in processing schemes themselves.

To cope with such processing, research has been done on neural networks as operation processing models which mimic the information processing scheme of the brain.

As a model of neurons which form a neural network, generally, output values from a plurality of units (neurons) are weighted by a synaptic weight, and the products are input to a unit corresponding to a neuron. The sum of input values is further nonlinearly converted and output. That is, in a general neural network, desired processing is realized by product-sum operation and nonlinear conversion in each unit and between units.

As neural network architectures using the neuron model, associative memories which connect units that execute the product-sum operation to each other or pattern recognition models which hierarchically connect units that execute the product-sum operation have been proposed conventionally.

A neural network is a superparallel distributed information processing model. When this is executed by a Neumann computer based on sequential processing, the efficiency is very low. Hence, to put a neural network into practical use, it is effective to form an integrated circuit as dedicated hardware.

In forming an integrated circuit, digital processing by a digital circuit is suitable for storage of input data and controllability. However, when an analog operation circuit is used as an operation circuit which implements the above-described product-sum operation or nonlinear conversion, the number of elements can greatly be reduced as compared to a digital operation circuit.

That is, to put a neural network into practical use, it is effective to apply digital circuits and analog circuits to an operation processing unit in which their characteristic features effectively function and ultimately form an integrated circuit in which both the digital and analog circuits are mixed.

In this case, the interface unit which connects a digital circuit and an analog circuit must input/output data in a signal format suitable for a corresponding circuit.

For example, to make a digital memory to hold a PWM (Pulse Width Modulation) signal having information in the pulse width, the PWM signal is converted into a digital value by a pulse width/digital conversion circuit. Then, the PWM signal is input to and held in the digital memory.

In addition, to output an analog voltage value accumulated in a capacitor as a PWM signal, the analog voltage value is converted into a pulse having a time width proportional to the analog voltage value by a comparator and output.

When the above-described methods are combined to temporarily convert an analog voltage into a PWM signal and then cause a pulse width/digital conversion circuit to convert the generated PWM signal into a digital value, A/D conversion can be realized.

As the D/A conversion circuit to convert a digital value into an analog voltage value, a combination of a digital/pulse width conversion circuit, switched current source, and capacitor is often used.

More specifically, a digital value is converted into a pulse whose width has a value proportional to the digital value by the digital/pulse width conversion circuit. The switched current source is turned on/off by the pulse to accumulate charges proportional to the pulse width in the capacitor. Accordingly, the digital value is finally converted into an analog value as the voltage value of the capacitor.

The digital/pulse width conversion circuit in the D/A conversion circuit indicates a circuit which has a function of converting a digital input value into a pulse having a time width proportional to the digital input value. Well-known circuits compare the count value output from a counter operated by a clock with a digital input value and make the pulse output fall when both values coincide (e.g., Japanese Patent Laid-Open No. 4-2222).

FIG. 43 is a block diagram showing an example of a conventional digital/pulse width conversion circuit (FIG. 1 of Japanese Patent Laid-Open No. 4-2222). The conventional digital/pulse width conversion circuit shown in FIG. 43 comprises a strobe detection circuit 101, latch circuit 102, counter 103, digital comparator 104, and JK flip-flop 105.

Upon receiving a strobe signal NOT(STB), the strobe detection circuit 101 outputs timing enable signals E1 and E2 at the leading edge of a first clock CLK. The timing enable signal E1 changes to L level at the leading edge of the next clock. On the other hand, the timing enable signal E2 is always at H level while a clear signal NOT(reset) is at H level.

The latch circuit 102 latches 16 digital data bits D0 to D16 which are output from an external device and outputs them as latch data Q0 to Q15. The 16-bit counter 103 counts the clocks CLK and outputs count values C0 to C15. When the count value reaches FFFF, the counter 103 outputs a count out signal C.O. The digital comparator 104 compares the latch data Q0 to Q15 with the count values C0 to C15. The digital comparator 104 outputs H level to the JK flip-flop 105 until the count values C0 to C15 exceed the latch data Q0 to Q15. When the count values C0 to C15 exceed the latch data Q0 to Q15, the digital comparator 104 inverts the output value to L level.

At the start of the processing cycle, the output signal from the digital comparator 104 is input to an input terminal J of the JK flip-flop 105. An output Q of the JK flip-flop 105 holds H level. At the leading edge of the first clock CLK after the output signal from the digital comparator 104 is inverted to L level, the JK flip-flop 105 inverts the output Q to L level. Upon receiving the count out signal C.O., the JK flip-flop 105 returns the output Q to H level.

With this arrangement, pulses having time widths proportional to the values of the digital data D0 to D16 are output to the output Q of the JK flip-flop 105.

A pulse width/digital conversion circuit will be described next. Conventionally, a pulse width/digital conversion circuit is widely used in an integral A/D converter. Its technical contents are disclosed in, e.g., Yasoji Suzuki & Masahiro Yoshida, "Introduction to Pulse/Digital Circuit", Nikkan Kogyo Shimbun, issued Jul. 26, 2001, pp. 225–232.

FIG. 44 is a circuit diagram of a conventional pulse width/digital conversion circuit used in an integral A/D converter.

A conventional pulse width/digital conversion circuit 111 has a simple arrangement including an AND gate circuit 112 and counter 113. An input pulse PW which has undergone digital/pulse width conversion and a clock CLK are input to the AND gate circuit 112). The AND gate circuit 112 outputs a gate signal g as the AND of the input pulse PW and clock CLK to the counter 113.

The counter 113 counts the leading edges of the input gate signal g and outputs the count value as an m-bit digital output D={D0, . . . , Dm−1}.

According to this arrangement, when the input pulse PW is at H level, the AND gate 112 is enabled.

When the input pulse PW is at L level, the AND gate 112 is desabled. While the AND gate 112 is enabled, the clock CLK is output as the gate signal g. The counter 113 counts the clock output as the gate signal g. With this operation, a count value proportional to the width of the input pulse PW is obtained as the digital output D={D0, . . . , Dm−1}.

In a product-sum operation circuit which executes multiplication and accumulation in parallel, using a digital/pulse width conversion circuit, a D/A conversion circuit using a digital/pulse width conversion circuit, and an A/D conversion circuit using a pulse width/digital conversion circuit is very effective because their structures are simple.

However, when the digital/pulse width conversion circuit is used in an apparatus which executes digital/pulse width conversion of a number of digital input values in parallel and outputs a modulated pulse, the circuit area and power consumption increase in proportion to the number of digital/pulse width conversion circuits operating in parallel.

To execute digital/pulse width conversion of a number of digital input values in parallel, a plurality of digital/pulse width conversion circuits shown in FIG. 43 are arranged in parallel, and the digital input values are input to the digital/pulse width conversion circuits, respectively. When pulses output from the digital/pulse width conversion circuits are extracted, digital/pulse width conversion can be executed in parallel.

In this case, however, the circuit area of each digital/pulse width conversion circuit increases in proportion to the number of circuits. In addition, the switching operation by the clock is frequently executed. For this reason, when the driving powers of all the digital/pulse width conversion circuits are totaled, a considerably large power is consumed. Hence, in an apparatus such as a portable device which requires downsizing and low power consumption, it is difficult to use digital/pulse width conversion circuits to execute digital/pulse width conversion of a number of digital input values in parallel.

Similarly, when the pulse width/digital conversion circuit shown in FIG. 44 is used in an apparatus which executes pulse width/digital conversion of a number of pulse inputs in parallel and outputs a digital value, the total power consumption of the pulse width/digital conversion circuits 111 is considerably high.

More specifically, when the pulse width/digital conversion circuit 111 shown in FIG. 44 is used for each pulse input, a number of counters 113 execute the switching operation in parallel. For this reason, even when each counter 113 comprises, e.g., a CMOS, the charge/discharge power consumption in charge/discharge of the load capacitance in switching by the counter 113 is high. The increase in charge/discharge power consumption becomes conspicuous as the number of pulse inputs increases.

In addition, when a number of counters 113 operate in parallel, the switching noise of the counters 113 increases. Hence, a measure against noise in the entire circuit is necessary.

DISCLOSURE OF INVENTION

It is an object of the present invention to provide a product-sum operation circuit which uses a digital/pulse width conversion circuit which converts a plurality of digital input values into pulse widths in parallel while saving the area and reducing power consumption and a pulse-width/digital conversion circuit which operates at low power consumption and can reduce noise generated from the circuit.

In order to achieve the above object, for example, according to an aspect of the present invention, there is provided a product-sum operation circuit comprising a pulse width/digital conversion circuit which converts a pulse signal having a pulse width representing an operand value into a digital signal, a sorting circuit which outputs, in descending or ascending order of magnitude, a plurality of operand values converted into digital signals by the pulse width/digital conversion circuit, a multiplication circuit which multiplies each operand value output from the sorting circuit by a corresponding operand value, and an accumulated sum circuit which calculates an accumulated sum of multiplication results by the multiplication circuit, wherein the pulse width/digital conversion circuit comprises a counter which counts a clock and outputs a count value as a digital signal, and a plurality of trailing edge latch circuits each of which latches a common count value output from the counter at a trailing edge of the input pulse signal.

According to another aspect of the present invention, there is provided a method of executing a product-sum operation, comprising the steps of converting a pulse signal having a pulse width representing an operand value into a digital signal, outputting, in descending or ascending order of magnitude, the plurality of operand values converted into the digital signals, multiplying each output operand value by a corresponding operand value, and calculating an accumulated sum of multiplication results, wherein the step of converting the pulse signal into the digital signal comprises the steps of causing a counter to count a clock and output a count value as a digital signal, and causing a plurality of trailing edge latch circuits to latch a common count value output from the counter at a trailing edge of the input pulse signal.

Other and further objects, features and advantages of the present invention will be apparent from the following descriptions taken in conjunction with the accompanying drawings, in which like reference characters designate the same or similar parts throughout the figures thereof.

BRIEF DESCRIPTION OF DRAWINGS

The accompanying drawings, which are incorporated in and constitute a part of the specification, illustrate embodiments of the invention and, together with the descriptions, serve to explain the principle of the invention.

FIG. 3 is a view showing an example of the memory cell structure of an associative memory circuit which is formed by the functions of an input value holding circuit and sorting circuit according to the first embodiment;

FIG. 4 is a view showing an example of the memory cell structure of a memory according to the first embodiment;

FIG. 40 is a block diagram showing a sorting circuit, predetermined value (ratio) holding memory, and constant value holding memory in a product-sum operation circuit according to the 13th embodiment;

FIGS. 60A and 60B are block diagrams showing the arrangement of a neural network circuit according to the 20th embodiment;

BEST MODE FOR CARRYING OUT THE INVENTION

Preferred embodiments of the present invention will now be described in detail in accordance with the accompanying drawings.

FIRST EMBODIMENT

Figure 1:
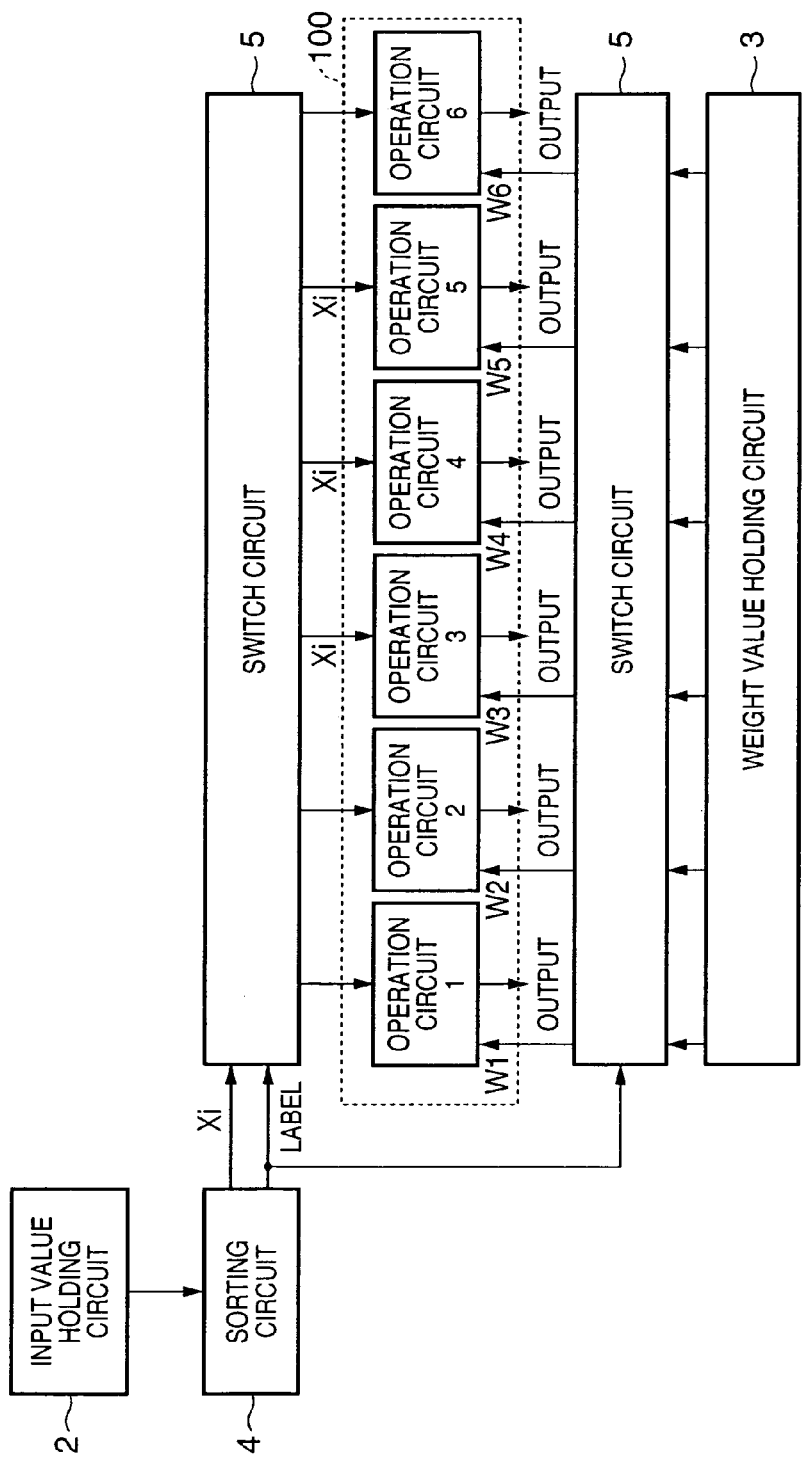
FIG. 1 is a block diagram showing an example of the overall arrangement of a product-sum operation circuit according to the first embodiment.

FIG. 1 is a block diagram showing a product-sum operation circuit according to this embodiment.

As shown in FIG. 1, the product-sum operation circuit according to this embodiment includes an operation unit 100 including a plurality of operation circuits (operation circuits 1 to 6 in the example shown in FIG. 1), an input value holding circuit 2 which holds operand values $X_i$, a weight value holding circuit 3 which holds operand values $W_i$, a sorting circuit 4 which outputs the operand values $X_i$ in descending order of magnitude, and a switch circuit 5 to input the operand value $X_i$ and $W_i$ to an operation circuit corresponding to the label of the operand value $X_i$. Note that i of the operand value $X_i$ and operand value $W_i$ is a suffix representing different X and W and takes a natural number such as 1, 2, 3, . . . (this also applies to the following description).

Figure 2:
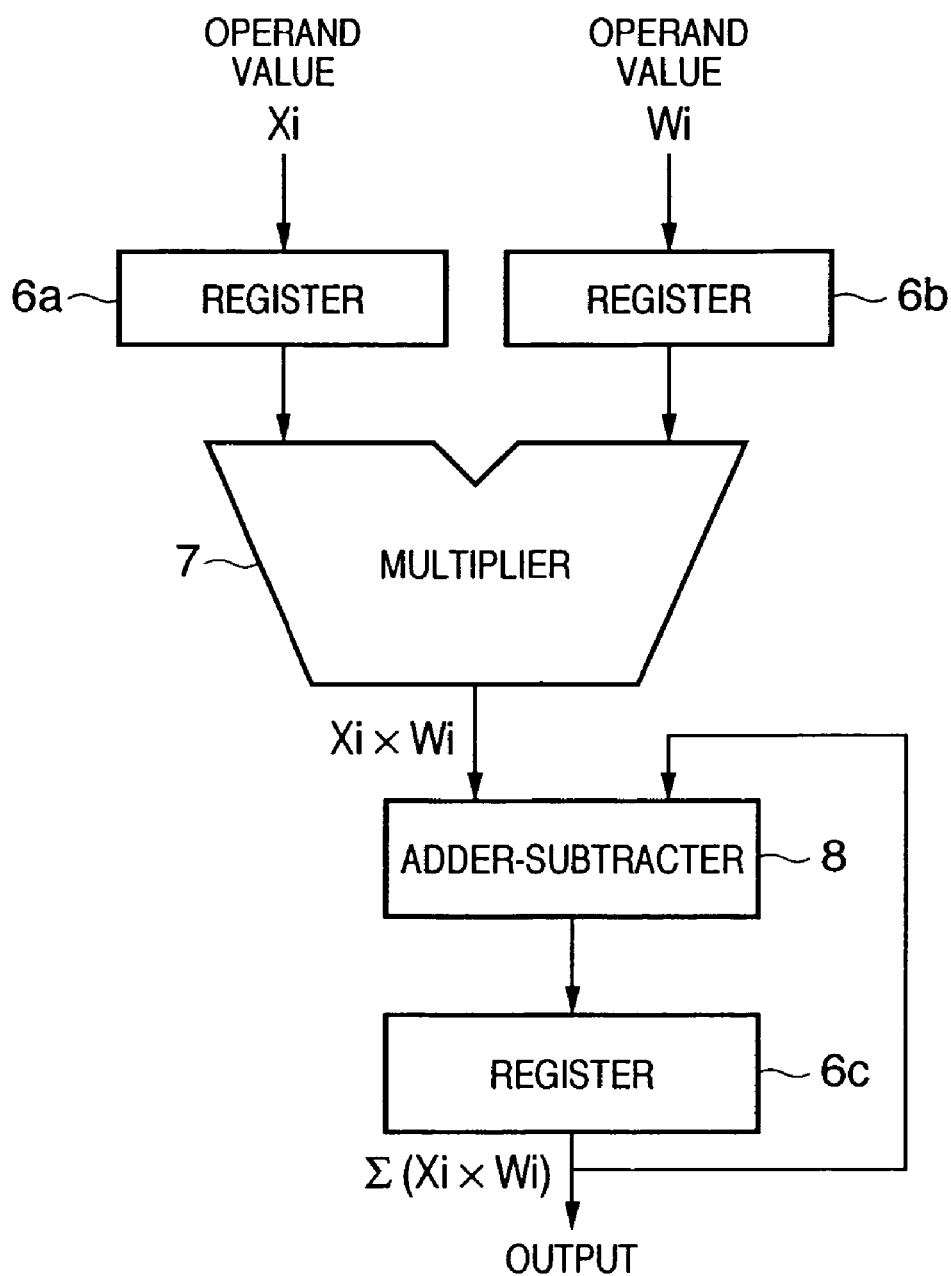
FIG. 2 is a block diagram showing an arrangement example of a digital operation circuit according to the first embodiment.

FIG. 2 shows a digital operation circuit in which operation circuit 1 is formed as a digital circuit. Operation circuits 2 to 6 also have the same arrangement. As shown in FIG. 2, the digital operation circuit according to this embodiment includes three registers 6a to 6c, a multiplier 7, and an adder-subtracter 8.

Operation processing by the product-sum operation circuit according to this embodiment will be described below.

As shown in FIG. 1, the plurality of operand values $X_i$ are held in the input holding circuit 2 and sorted and output by the sorting circuit 4 in descending order of magnitude. In this embodiment, if there are operand values $X_i$ having the same value, they are output in an arbitrary order. Instead, an appropriate order may be set in advance.

Subsequently, the label the operand value $X_i$ has is input from the sorting circuit 4 to the switch circuit 5. The switch circuit 5 executes switching in accordance with the label to input the operand value $X_i$ output from the sorting circuit 4 to operation circuits corresponding to the label. Either one operation circuit or a plurality of operation circuits can correspond to the label of the operand value $X_i$. In the example to be described in this embodiment, a plurality of operation circuits correspond to a label.

In this embodiment, the processing executed by the input holding circuit 2 and sorting circuit 4 is implemented by using an associative memory circuit. FIG. 3 shows an example of the memory cell structure of the associative memory circuit. As shown in FIG. 3, the associative memory circuit holds the values of the operand values $X_i$ and the labels of the operand values $X_i$. The processing executed by the input holding circuit and sorting circuit 4 can be implemented by reading out the operand values $X_i$ and their labels one by one in descending order of magnitude using the general function of the associative memory circuit.

That is, the associative memory circuit has a function of comparing an input search value with held data and outputting data having a coincident value. The sorting function can be realized (conversely, data may be read out in ascending order of magnitude of the operand values $X_i$) by inputting search values to the associative memory circuit sequentially in descending order of magnitude from a value corresponding to the maximum operand value $X_i$, and sequentially reading out data having coincident values. In this embodiment, as described above, the function of the input holding circuit 2 and sorting circuit 4 is implemented by the associative memory circuit. However, the detailed circuit arrangement is not the gist of the present invention. Any other circuit arrangement can be used if it can execute similar processing.

The plurality of operand values $W_i$ output from the weight value holding circuit 3 are input to predetermined operation circuits. In this embodiment, even for the operand value $W_i$, the switch circuit 5 executes switching in accordance with the label of each operand value $X_i$, as in the operand value $X_i$, to input the operand value $W_i$ to a predetermined operation circuit determined by the label.

Unlike this embodiment, the operation circuit to which the operand value $W_i$ should be input may be set in advance independently of the label of the operand value $X_i$. In addition, the value of the operand value $W_i$ input to each operation circuit may remain unchanged or change between operations.

In this embodiment, the weight value holding circuit 3 can be formed by a general SRAM circuit. However, like the associative memory, any other circuit arrangement can be used if it can execute similar processing. By executing the above-described processing, the operand values Xi and operand values Wi are input to predetermined operation circuits. In this embodiment, predetermined operation circuits (i.e., circuits in which operation processing is to be executed) are operation circuits 3 to 5 in FIG. 1.

The operation processing to be executed in the predetermined operation circuits to which both the operand values Xi and the operand values Wi are input will be described. The operation processing is not executed in an operation circuit to which no operand value Xi is input.

In the operation circuit, the operand value Xi and operand value Wi are temporarily held in the register 6a and register 6b, respectively. Then, Xi×Wi is operated by the multiplier 7. The multiplication result of Xi×Wi is input to the adder-subtracter 8, added/subtracted to/from the result held in the register 6c. The result is held in the register 6c.

By repeating the above-described processing, the accumulation value of a plurality of multiplication results of Xi×Wi is held in the register 6c. When a predetermined number of accumulations are ended, the accumulation value is output. As described above, the operand values Xi to be held in the register 6a are input in descending order of magnitude by the processing in the sorting circuit 4. The operand values Xi having the same value are continuously input. For these reasons, as compared to a case in which the operand values Xi are input at random, the data transition frequency in the register becomes low, and power consumption by data transition can be reduced.

In this embodiment, the operand value Xi itself is input from the sorting circuit 4 to the operation circuit. In searching the operand values Xi in descending order of magnitude in the associative memory circuit, the value held in the register 6a in the operation circuit may be changed only when the value Xi changes. In this case, not the operand value Xi itself but a flag signal which instructs to appropriately update the value in the register 6a is input from the sorting circuit 4 to the operation circuit.

In this embodiment, the sorting circuit 4 sorts the operand values Xi in descending order of magnitude. Even when the operand values Xi are sorted in ascending order of magnitude, the same effect as described above can be obtained.

Figure 4:
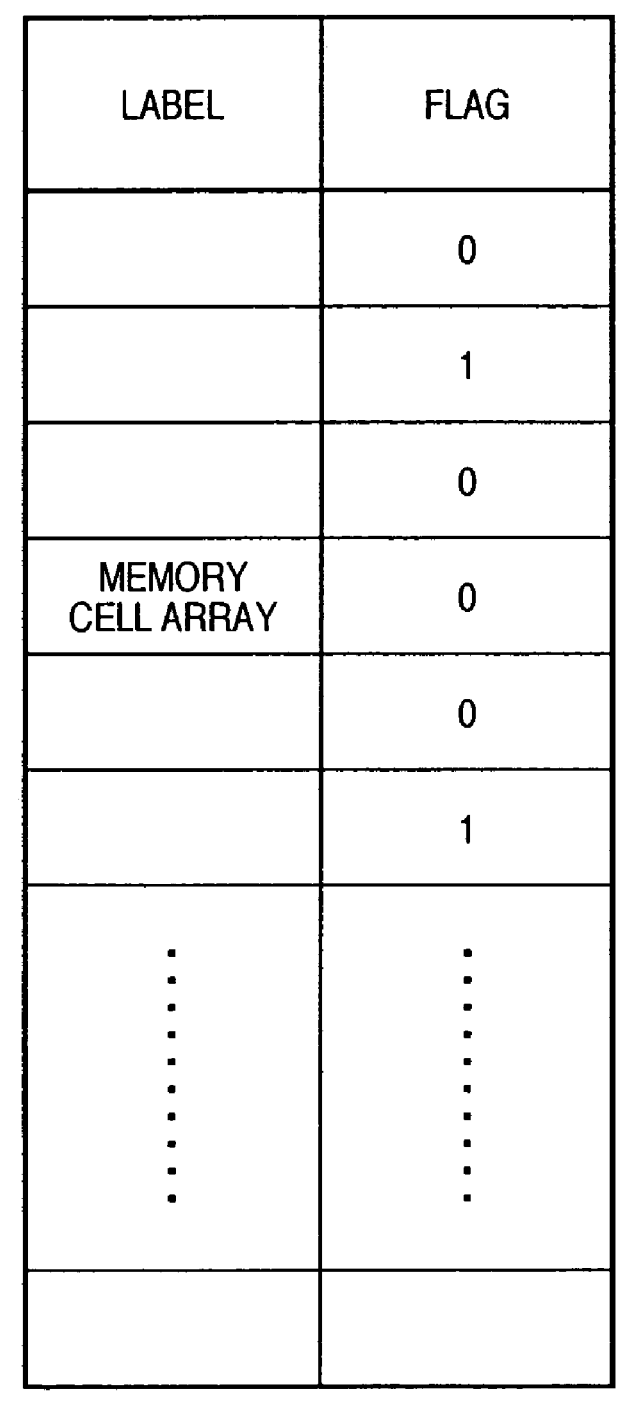

In this embodiment, the outputs from the associative memory circuit are directly input to the operation unit 100 and the switch circuit 5. The data of the operand values Xi which are output from the associative memory circuit in descending order of magnitude may temporarily be input to and held in a memory such as an SRAM and then input from the SRAM to the operation unit 100 and the switch circuit 5. In this case, the label and value of each operand value may be held in the memory. Instead of the value, a flag representing the position where the values of the operand values Xi arranged in descending order of magnitude change may be held, as described above. FIG. 4 shows an example of the memory cell structure when a flag is held in the SRAM.

A case in which the operand value Xi is input to the input value holding circuit 2 as a PWM signal in this embodiment will be described next with reference to FIG. 5.

Figure 5:
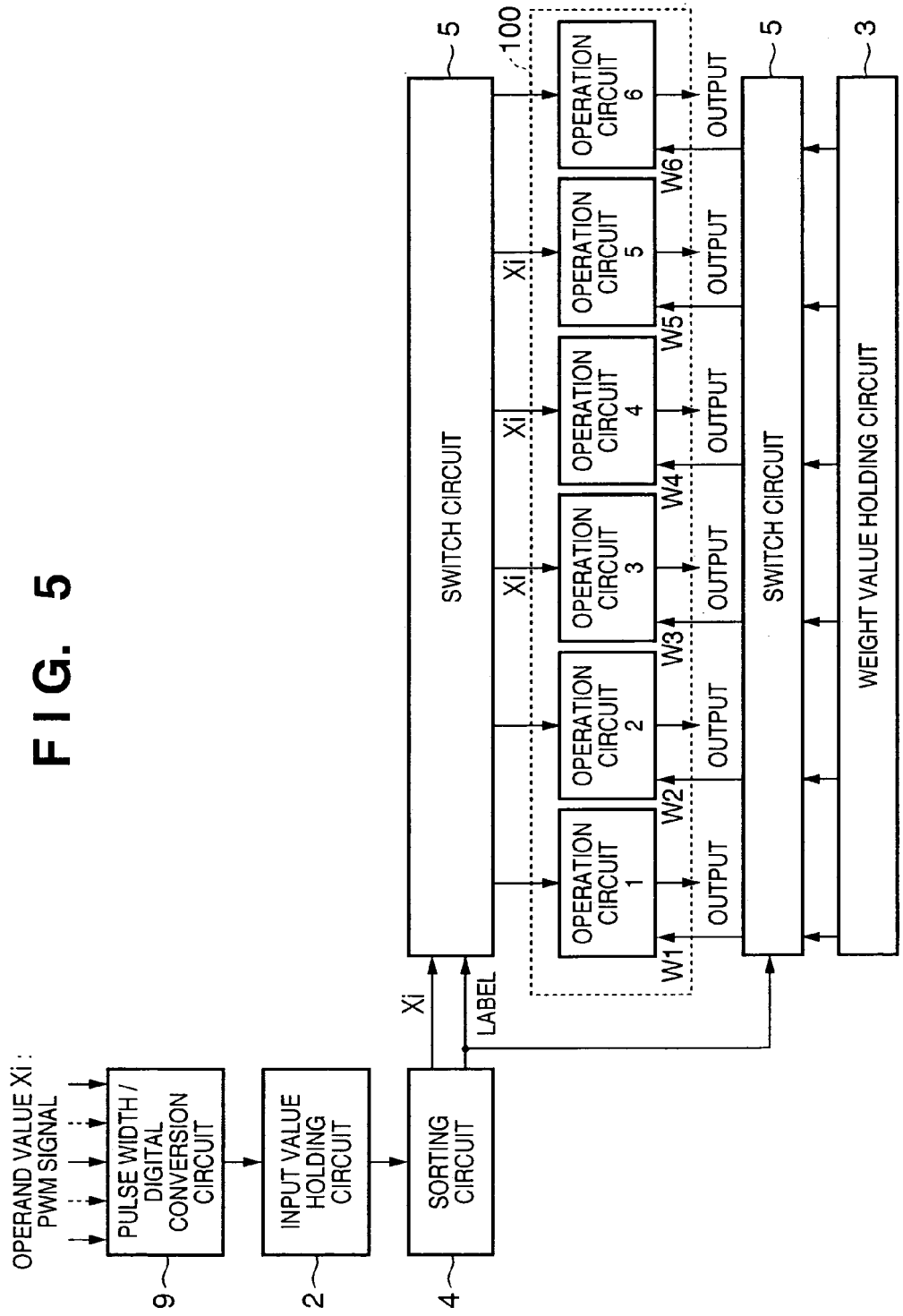
FIG. 5 is a block diagram showing another example of the overall arrangement of the product-sum operation circuit according to the first embodiment.

The arrangement shown in FIG. 5 is the same as the above-described arrangement (FIG. 1) of this embodiment except a pulse width/digital conversion circuit 9 is arranged at the preceding stage of the input holding circuit 2. More specifically, each operand value Xi input as a PWM signal is converted into a digital signal by the pulse width/digital conversion circuit 9 and then held in the input value holding circuit 2. The pulse width/digital conversion circuit 9 will be described here.

The characteristic of the PWM signal will be described briefly. In the PWM (Pulse Width Modulation) signal, the width of the pulse waveform has information. The PWM signal has both a digital characteristic resistant to noise (a characteristic representing that binary information of high and low levels are held in the voltage direction) and an analog characteristic capable of expressing continuous information by one pulse (a characteristic representing that continuous information is held in the time direction).

Figure 6:
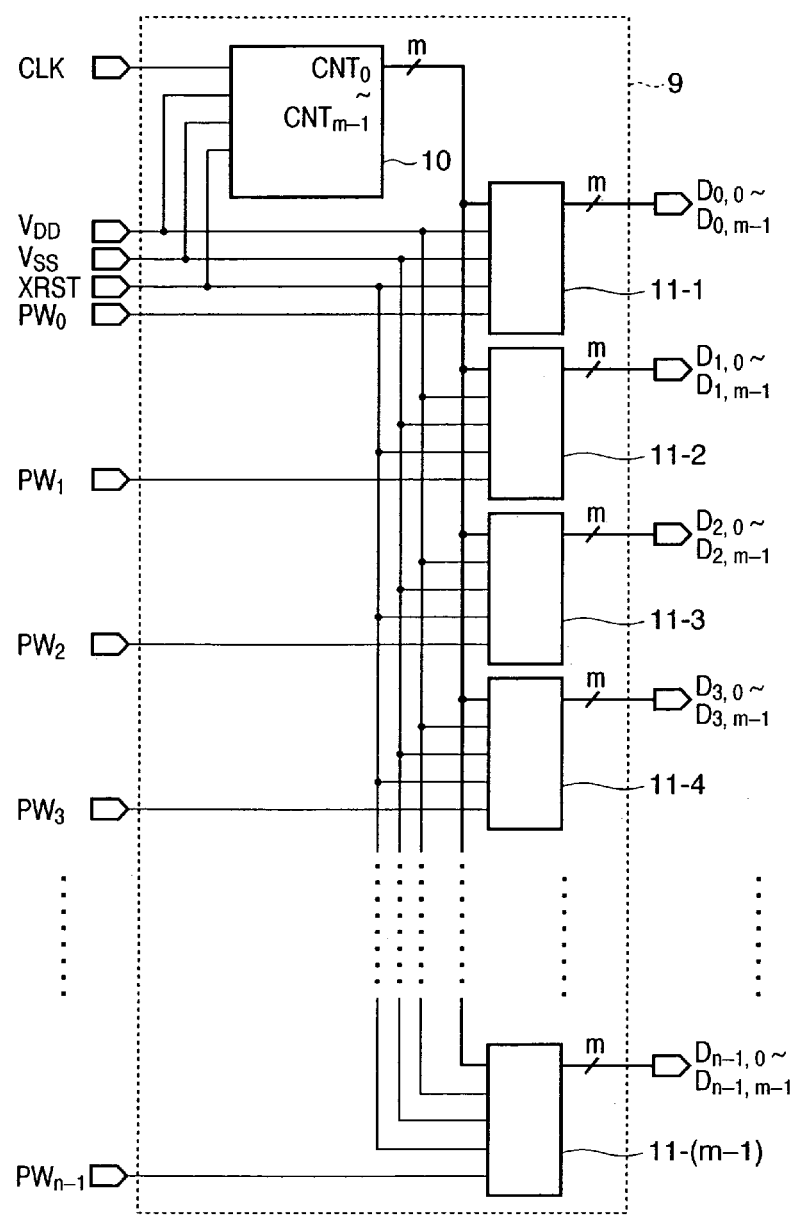
FIG. 6 is a circuit diagram showing an arrangement example of a pulse width/digital conversion circuit according to the second embodiment.

FIG. 6 is a circuit diagram showing the arrangement of the pulse width/digital conversion circuit 9.

The pulse width/digital conversion circuit 9 of this embodiment comprises a counter 10 and n (n>2) trailing edge latch circuits 11-0 to 11-(n−1). A clock CLK, pulse output trigger XRST, and n PWM signals PW0 to PWn−1 are input externally to the pulse width/digital conversion circuit 9. A power supply voltage VDD and substrate voltage VSS are applied to the pulse width/digital conversion circuit 9.

A pulse train having a predetermined period is input to the clock CLK. The pulse output trigger XRST instructs the start of output of the input pulses PW0 to PWn−1. Inverted pulses having a period M-times (M≧2m) the period of the clock CLK and a time width corresponding to the clock period are output to the pulse output trigger XRST.

The counter 10 counts the externally input clock CLK and outputs count values CNT0 to CNTm−1 as m digital signal bits. Each trailing edge latch circuit 11-i (i∈{0, 1, ..., n−1}) latches the count values CNT0 to CNTm−1 output from the counter 10 at the trailing edge of an externally input PWM signal PWi. Each trailing edge latch circuit 11-i outputs the latched count values CNT0 to CNTm−1 as m digital output bits Di,0 to Di,m−1.

Figure 7:
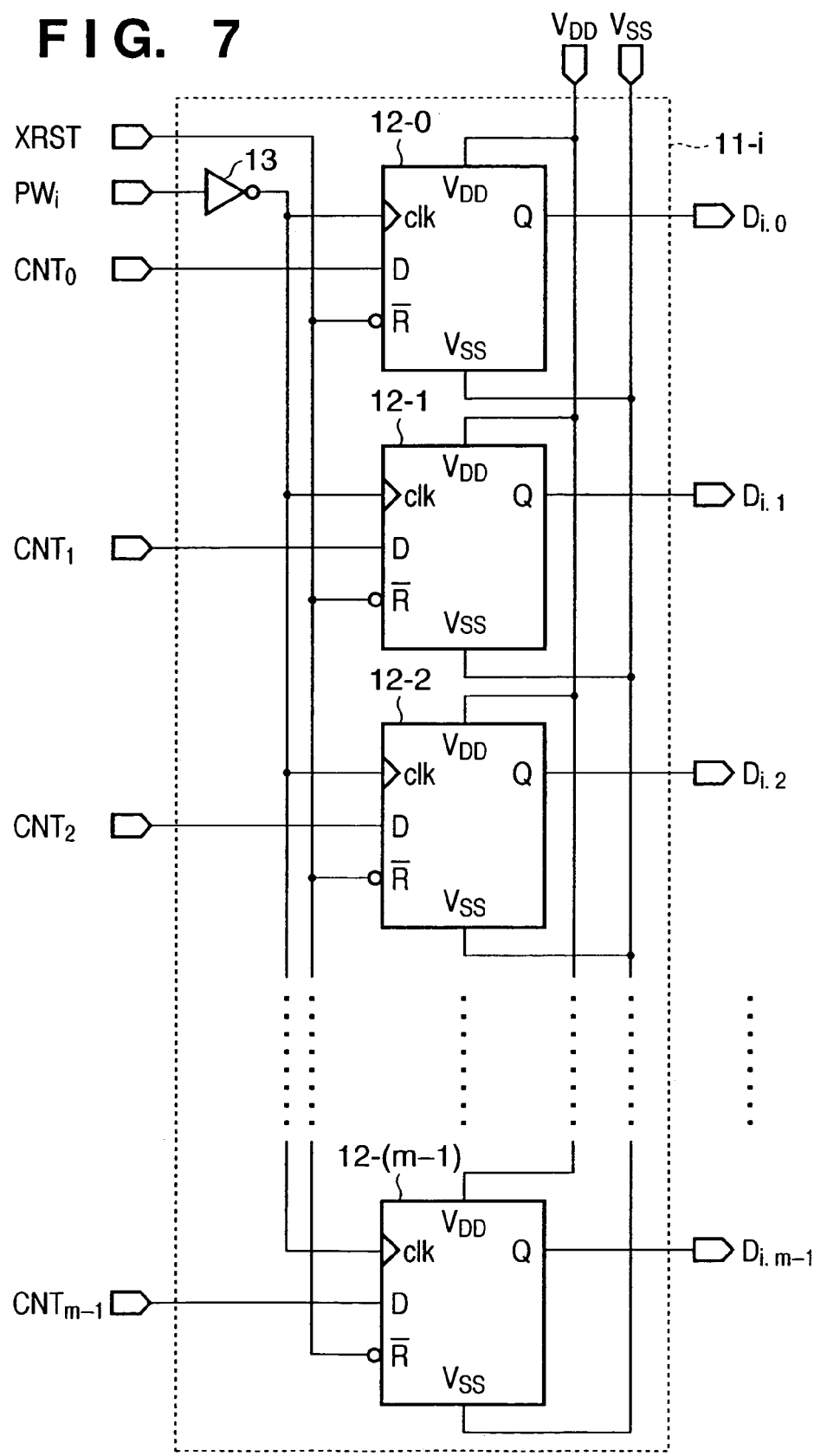
FIG. 7 is a circuit diagram showing an example of the internal arrangement of a trailing edge latch circuit according to the first embodiment.

FIG. 7 is a circuit diagram showing the internal arrangement of the trailing edge latch circuit 11-i shown in FIG. 6.

The trailing edge latch circuit 11-i (iÅ{0, 1, ..., n−1}) includes m latches 12-0 to 12-(m−1) and an inverter 13. The level of the PWM signal PWi input to the trailing edge latch circuit 11-i is inverted by the inverter 13. Then, the PWM signal PWi is input to clock input terminals clk of the latches 12-0 to 12-(m−1). The count values CNT0 to CNTm−1 from the counter 10 are input to data input terminals D of the latches 12-0 to 12-(m−1), respectively. The pulse output trigger XRST is input to reset input terminals NOT(R) of the latches 12-0 to 12-(m−1). Data output from output terminals Q of the latches 12-0 to 12-(m−1) are output to the outside as the digital output data Di=(Di,0 to Di,m−1).

Figure 8:
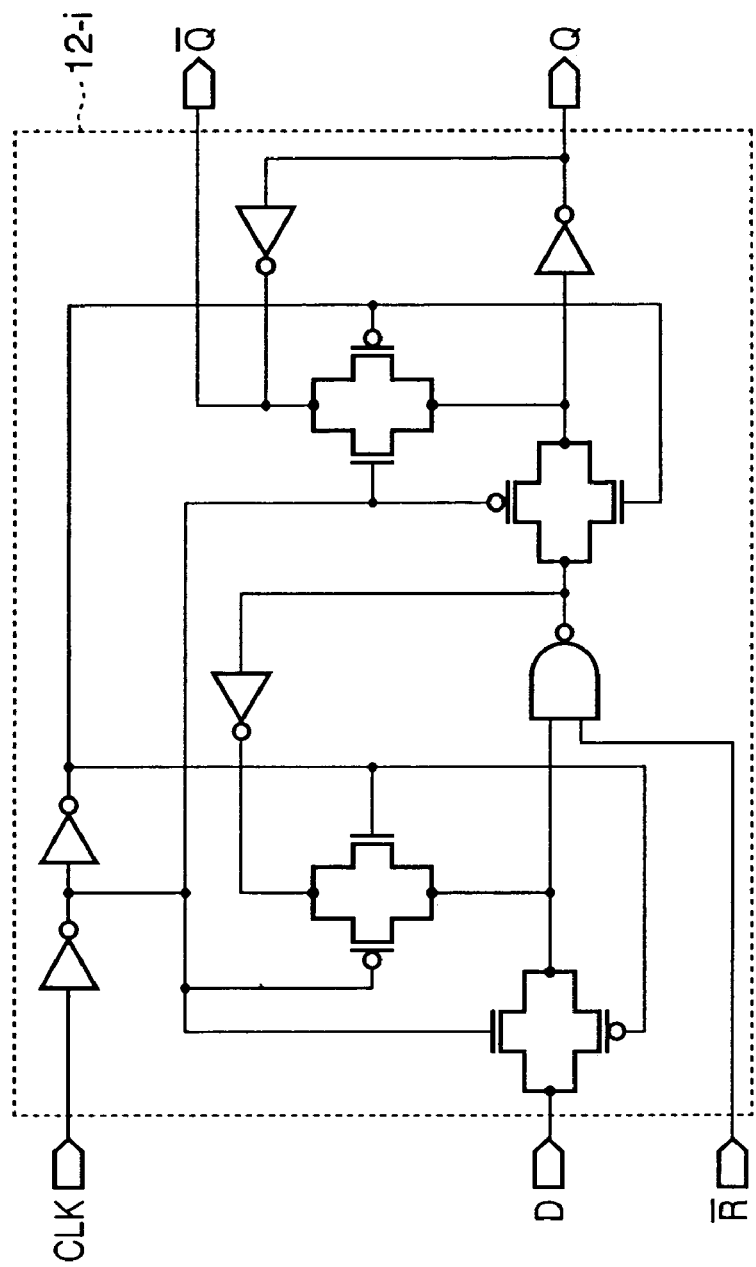
FIG. 8 is a circuit diagram showing an example of the internal arrangement of the trailing edge latch circuit according to the first embodiment.

As each of the latches 12-0 to 12-(m−1), a synchronous D flip-flop with an asynchronous reset input as shown in FIG. 8.

The operation of the pulse width/digital conversion circuit 9 according to this embodiment having the above arrangement will be described below.

Figure 9:
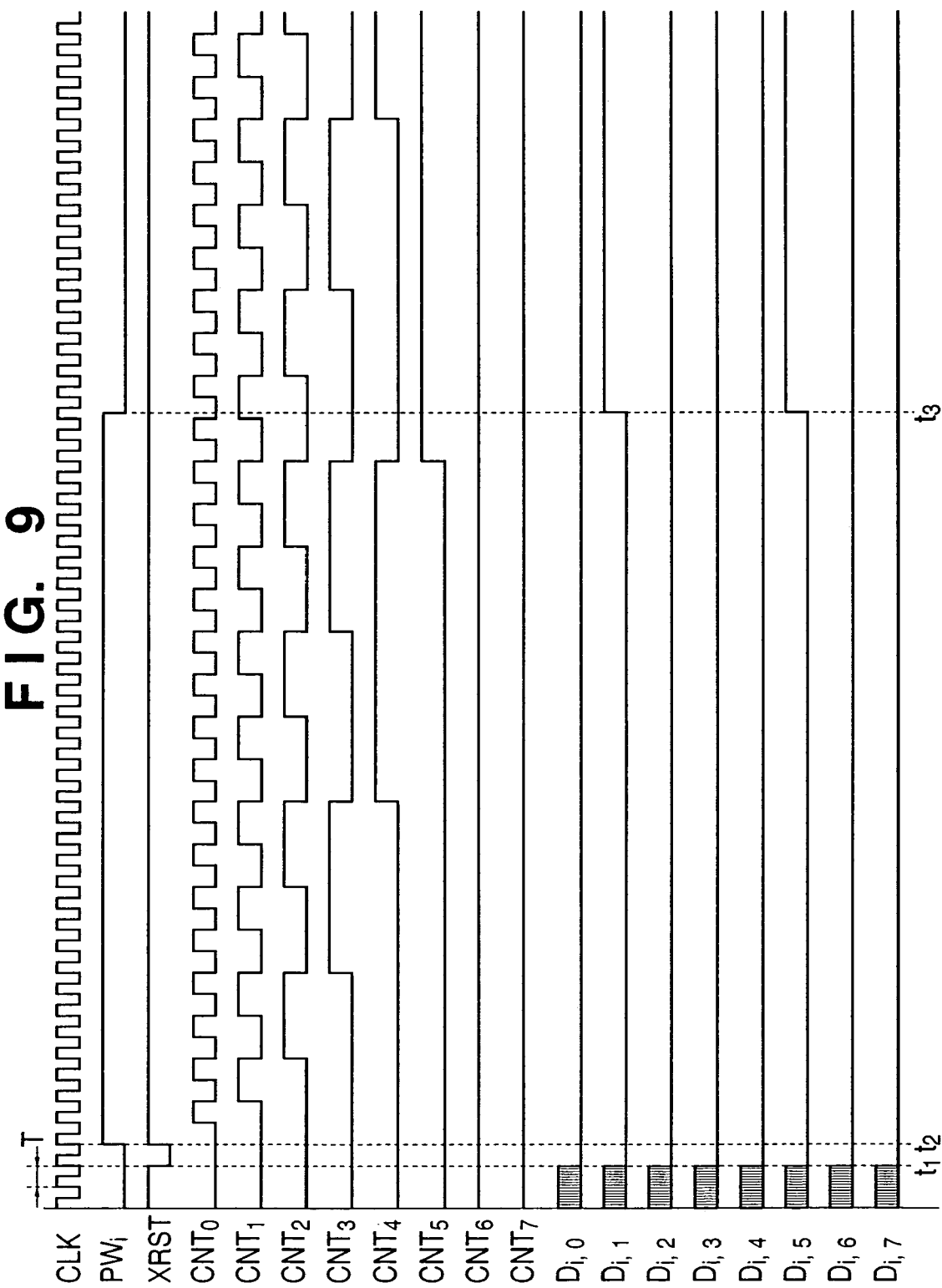
FIG. 9 is a timing chart showing a change in each signal level of the pulse width/digital conversion circuit according to the first embodiment.

FIG. 9 is a timing chart showing a change in each signal level of the pulse width/digital conversion circuit 9 according to this embodiment. Pulses having a predetermined period T and a width T/2 are continuously input to the clock CLK. The pulse output trigger XRST outputs an inverted pulse having the width T at time t1. Accordingly, the outputs from the latches 12-0 to 12-(m−1) are reset, and all the digital output data Di are reset to 0.

Output of the PWM signals PWi (i∈{0, 1, ..., n−1}) starts from the leading edge of the pulse output trigger XRST (time t2). At the same time, the counter 10 starts counting the clock CLK. At the leading edge of the clock CLK, the counter 10 increments the count value by one. The PWM signal PWi is input in synchronism with the start of counting by the counter 10.

At time t3, the PWM signal PWi is inverted from H level to L level. Accordingly, the level of an output NOT(PWi) from the inverter 13 rises from L level to H level. Each latch 12-j (jÅ{0, 1, . . . , m−1}) latches the level of a count value CNTj input to the data input terminal D at the leading edge of the output NOT(PWi) from the inverter 13 and outputs the count value CNTj from the data output terminal Q.

Each trailing edge latch circuit 11-i (i∈{0, 1, . . . , n−1}) latches a count value CNT(i)={CNT(i)0, CNT(i)1, . . . , CNT(i)m−1}) of the counter 10 at the trailing edge of the PWM signal PWi. The count value CNT(i) is proportional to the pulse width of the PWM signal PWi.

When at least a time 2m·T has elapsed from the start of counting by the counter 10, the digital output values from all the trailing edge latch circuits 11-0 to 11-(n−1) are determined (the values are sometimes determined before that). When the digital output values from the trailing edge latch circuits 11-0 to 11-(n−1) are extracted after the determination time, digital values proportional to the pulse widths of the PWM signals PW0 to PWn−1 can be obtained. That is, pulse width/digital conversion is ended.

As described above, each trailing edge latch circuit 11-i (i∈{0, 1, . . . , n−1}) latches the count value CNT output from the common counter 10 at the trailing edge of the PWM signal PWi. The counter 10 only switches the output value (count value CNT) against the parasitic capacitance of the wiring line to output the count value CNT to each trailing edge latch circuit 11-i. Power consumption at the time of switching is low. Hence, the power consumption can largely be reduced as compared to a circuit using the conventional pulse width/digital conversion.

Evaluation was actually executed by computer simulation. When the conventional pulse width/digital conversion circuit as shown in FIG. 40 was used as each trailing edge latch circuit to execute pulse width/digital conversion of 80 PWM signals PW0 to PW79 in parallel, the power consumed was estimated as 226 mW. To the contrary, when the pulse width/digital conversion circuit 9 according to this embodiment was used, power consumption in executing pulse width/digital conversion of the same input pulses was 6.6 mW. Hence, the power consumption can be suppressed to about 1/50.

In addition, since only one counter is used, switching noise generated at switching by the counter can be suppressed. The S/N ratio of the circuit increases. Hence, the jitter error which is generated at the time of pulse width/digital conversion when jitter noise is added to the pulse width can be minimized. Accordingly, the circuit can also be used for high-speed pulse width/digital conversion.

Since the trailing edge latch circuits 11-0 to 11-(n−1) latch the output value CNT from the common counter 10, the switching timing of the count value CNT to the input pulses PW0 to PWn−1 does not vary. For this reason, any variation in timing error between the input pulses PW0 to PWn−1 by the jitter at the time of switching by the counter 10 can be prevented.

Figure 10:
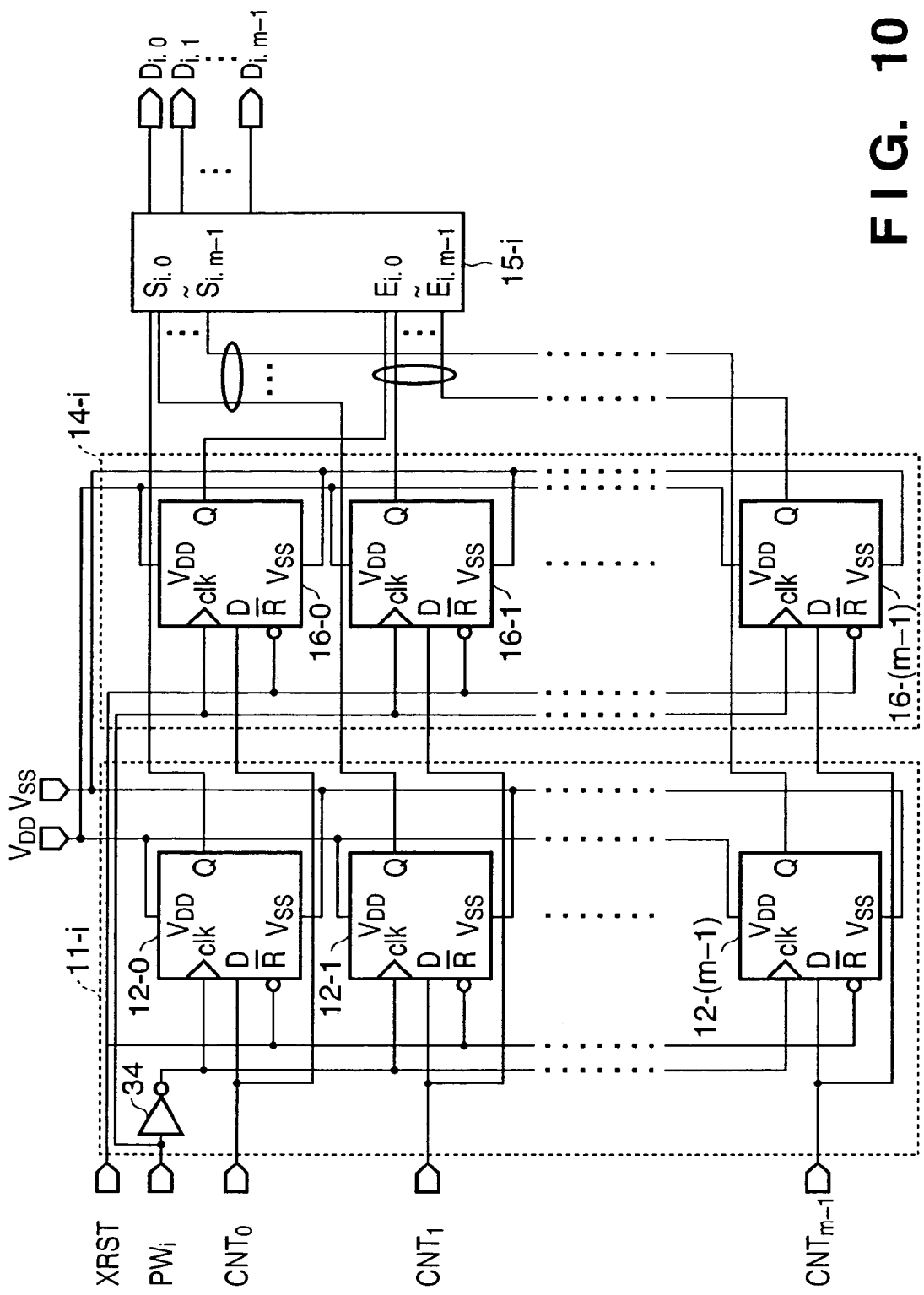
FIG. 10 is a circuit diagram showing arrangement examples of a trailing edge latch circuit, leading edge latch circuit, and subtraction circuit of another pulse width/digital conversion circuit according to the first embodiment.

For the pulse width/digital conversion circuit, each of the trailing edge latch circuits 11-0 to 11-(n−1) in the pulse width/digital conversion circuit 9 shown in FIG. 6 may be replaced with a circuit shown in FIG. 10.

A circuit in which each of the trailing edge latch circuits 11-0 to 11-(n−1) in the pulse width/digital conversion circuit 9 is replaced with the circuit shown in FIG. 10 will be described below in detail. The arrangements of the trailing edge latch circuit 11-i (i∈{0, 1, . . . , n−1}), latches 12-0 to 12-(m−1), and inverter 13 in FIG. 10 are the same as in FIG. 7, and a description thereof will be omitted. As a characteristic feature, the pulse width/digital conversion circuit according to this embodiment further comprises a leading edge latch circuit 14-i (i∈{0, 1, . . . , n−1}) and a subtraction circuit 15-i.

The leading edge latch circuit 14-i latches the count value CNT output from the counter 10 at the leading edge of the PWM signal PWi. The subtraction circuit 15-i calculates a difference by subtracting a digital output value and Si={Si,0 to Si,m−1} from the leading latch circuit 14-i from a digital output value Ei={Ei,0 to Ei,m−1} from the trailing edge latch circuit 11-i and outputs the digital output value Di={Di,0 to Di,m−1}.

The leading edge latch circuit 14-i comprises latches 16-0 to 16-(m−1) corresponding to the m count value bits CNT0 to CNTm−1, like the trailing edge latch circuit 11-i. Each of the latches 16-0 to 16-(m−1) includes a synchronous D flip-flop with an asynchronous reset input shown in FIG. 8, like the latches 12-0 to 12-(m−1).

However, the PWM signals PWi are directly input to the clock input terminals clk of the latches 16-0 to 16-(m−1) in the leading edge latch circuit 14-i without passing through the inverter 13. Hence, each of the latches 16-0 to 16-(m−1) latches the count value CNT of the counter 10 at the leading edge of the PWM signal PWi.

The operation of the pulse width/digital conversion circuit 9 having the above arrangement will be described below.

Figure 11:
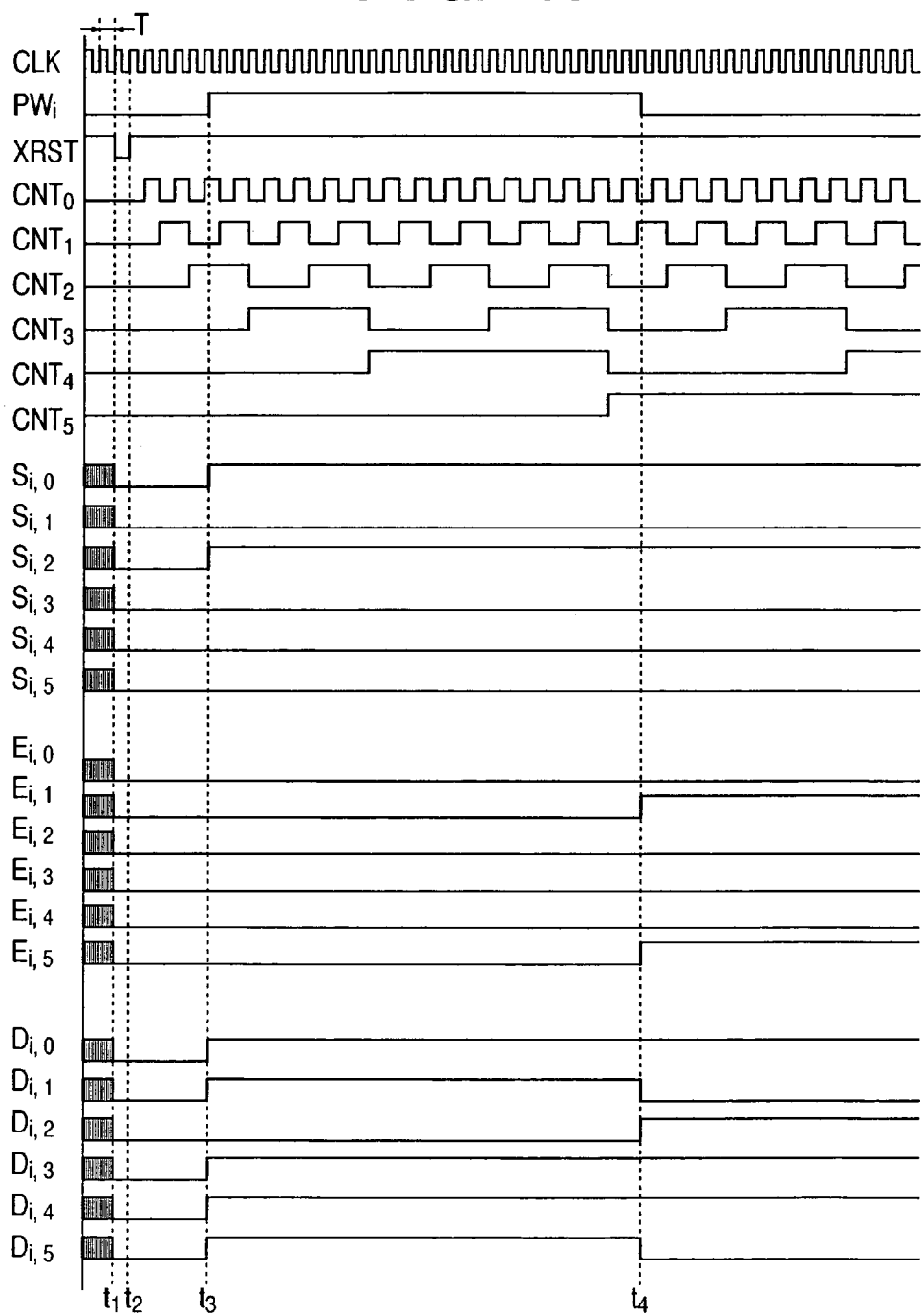
FIG. 11 is a timing chart showing a change in each signal level of another pulse width/digital conversion circuit according to the first embodiment.

FIG. 11 is a timing chart showing a change in each signal level of the pulse width/digital conversion circuit 9 according to this embodiment.

Pulses having the predetermined period T and the width T/2 are continuously input to the clock CLK. The pulse output trigger XRST outputs an inverted pulse having the width T at the time t1. Accordingly, the outputs from the latches 12-0 to 12-(m−1) and 16-0 to 16-(m−1) are reset, and all the digital output data Ei and Si are reset to 0.

The counter 10 starts counting the clock CLK from the leading edge of the pulse output trigger XRST (time t2). At the leading edge of the clock CLK, the counter 10 increments the count value by one.

At the appropriate time t3 after the time t2, output of the PWM signal PWi (i∈{0, 1, . . . , n−1}) starts. A latch 16-j (j∈{0, 1, . . . , m−1}) of the leading edge latch circuit 14-i latches the output CNTj from the counter 10 and outputs the value CNTj from its data output terminal Q as the digital output value Si={Si,0 to Si,m−1}.

At time t4, the PWM signal PWi is inverted from H level to L level. Accordingly, the level of the output NOT(PWi) from the inverter 13 rises from L level to H level. Each latch 12-j (j∈{0, 1, . . . , m−1}) latches the level of the count value CNTj input to its data input terminal D at the leading edge of the output NOT(PWi) from the inverter 13 and outputs the count value CNTj from its data output terminal Q as the digital output value Ei={Ei,0 to Ei,m−1}.

The subtraction circuit 15-i calculates a difference by subtracting the digital output value and Si={Si,0 to Si,m−1) from the leading latch circuit 14-i from the digital output value Ei={Ei,0 to Ei,m−1} from the trailing edge latch circuit 11-i and outputs the digital output value Di=(Di,0 to Di,m−1). Hence, from the time t3, the digital output value Di=(Di,0 to Di,m−1} is directly proportional to the pulse width of the PWM signal PWi.

When at least the time 2m·T has elapsed from the start of counting by the counter 10, the digital output values from all the trailing edge latch circuits 11-0 to 11-(n−1) and subtraction circuits 15-0 to 15-(n−1) are determined (the values are sometimes determined before that). When the digital output values from the subtraction circuits 15-0 to 15-(n−1) are extracted after the determination time, the digital values Di=(Di,0 to Di,m−1) proportional to the pulse widths of the PWM signals PW0 to PWn−1 can be obtained. That is, pulse width/digital conversion is ended.

As described above, in this embodiment, the count value of the counter 10 is latched at the leading and trailing edges of each PWM signal. The difference between the values is calculated and output as a digital output value. For this reason, the leading edges of the PWM signals PWi need not be synchronized. In addition, the leading edge of each PWM signal PWi and the count start timing of the counter 10 need not be synchronized, either.

Hence, even in the circuit to which PWM signals are input asynchronously, the pulse width/digital conversion circuit according to this embodiment can be used.

Instead of using the subtraction circuit 15-i, the digital output values Si and Ei may be output to the outside, subtraction may be executed by using an externally prepared subtracter.

SECOND EMBODIMENT

The second embodiment will be described with reference to views of a detailed processing arrangement. The arrangement of a processing circuit to execute a product-sum operation method of this embodiment is shown in FIG. 1, as in the first embodiment.

Figure 12:
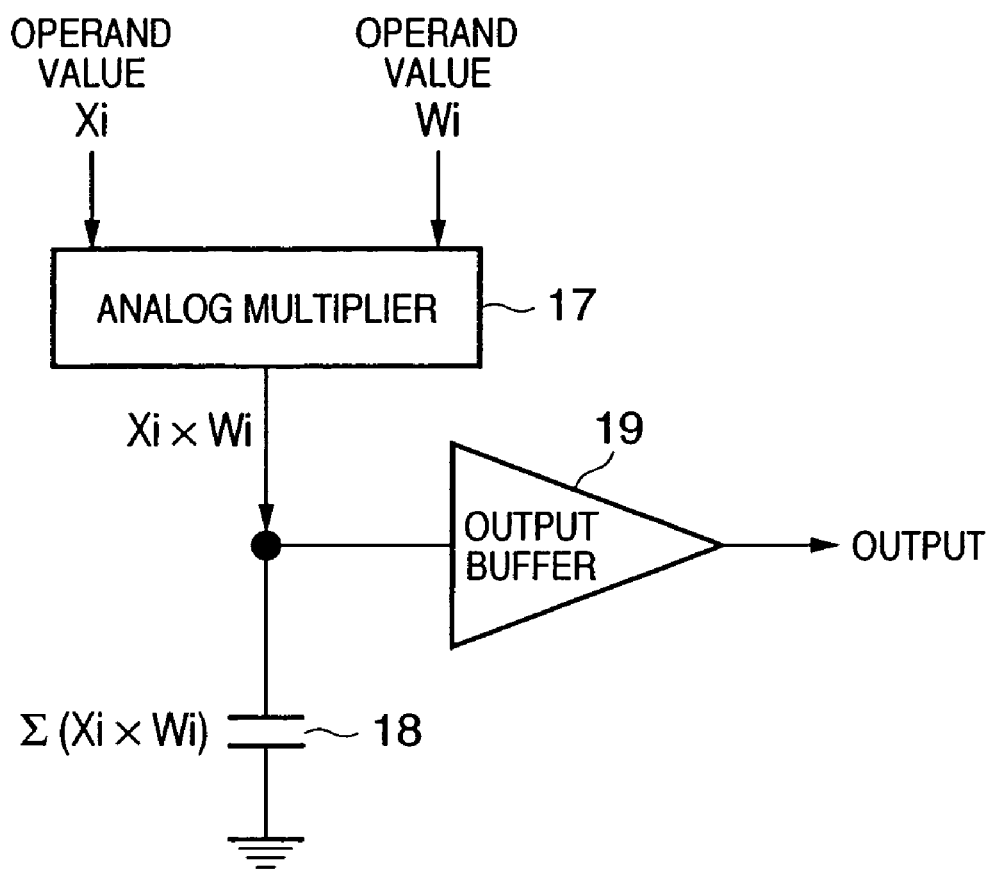
FIG. 12 is a block diagram showing an arrangement example of an analog operation circuit according to the second embodiment.

FIG. 12 shows an analog operation circuit which forms operation circuit 1 as an analog circuit. Operation circuits 2 to 6 also have the same arrangement. As shown in FIG. 12, the analog operation circuit of this embodiment includes an analog multiplier 17, capacitor 18, and output buffer 19.

Figure 13:
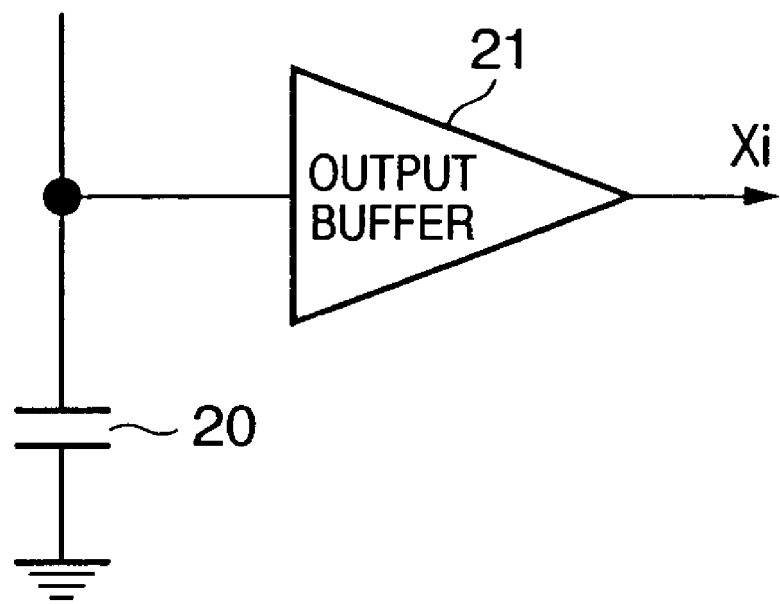
FIG. 13 is a circuit diagram showing an arrangement example of an input value holding circuit according to the second embodiment.

FIG. 13 shows an input value holding circuit 2 including an analog memory. In this embodiment, the analog memory is assumed to include a capacitor 20 and output buffer 21. However, any other circuit may be used as long as it has the same function.

Figure 14:
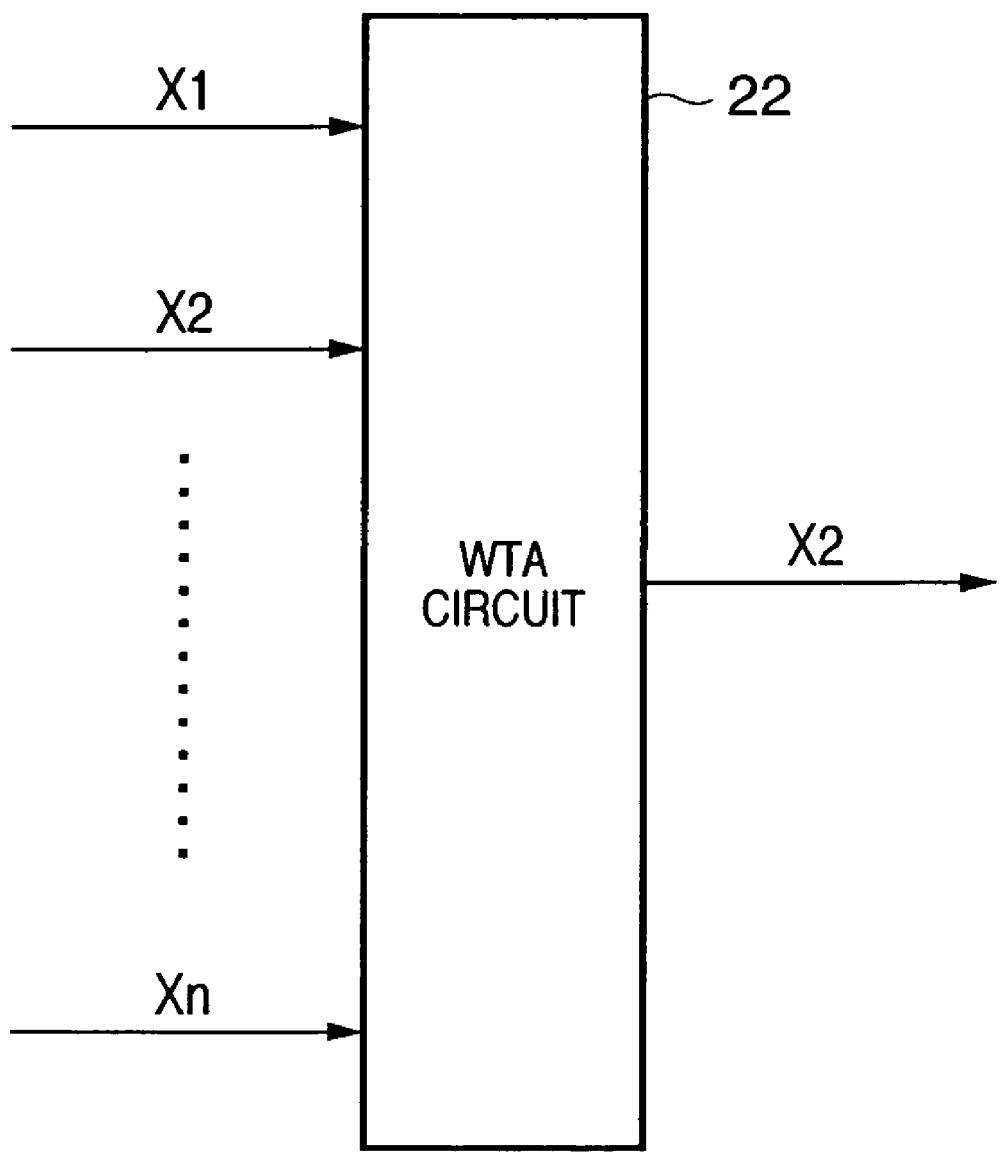
FIG. 14 is a circuit diagram showing an arrangement example of a sorting circuit according to the second embodiment.

FIG. 14 shows a sorting circuit 4 including a WTA circuit 22.

The processing using the product-sum operation method according to this embodiment will be described with reference to the above-described drawings.

The basic operation processing is the same as in the first embodiment, and a description thereof will be omitted. Individual processing operations of the input holding circuit 2, weight holding circuit 3, sorting circuit 4, and operation circuits 1 to 6 different from the first embodiment will be described below. In this embodiment, the case with the pulse width/digital conversion circuit described in the first embodiment will be excluded.

As shown in FIG. 13, the input holding circuit 2 of this embodiment includes the capacitor 20 and output buffer 21. The value of an operand value Xi is held as a voltage value accumulated in the capacitor 20. The operand values Xi held in the input holding circuit 2 are input to the switch circuit 5 in descending order of magnitude by the sorting circuit 4.

In this embodiment, the processing executed by the sorting circuit 4 is implemented by using the WTA circuit 22, as shown in FIG. 14. The WTA circuit is short for a Winner-Take-All circuit and has a function of outputting an input value having a maximum value (or a minimum value may be output). When the operand values Xi are input to the WTA circuit 22, the operand value Xi having a maximum value is output.

Next, when the group of operand values Xi except the precedingly output operand value Xi is input, the operand value Xi having the second largest value is output.

By repeating this operation, the operand values are always output in descending order of magnitude, and the sorting operation is executed.

In this embodiment, if there are operand values Xi having the same value, they are output in an arbitrary order. Instead, an appropriate order may be set in advance. At this time, the label each operand value has is also held simultaneously. As the holding circuit, either a digital memory or an analog memory which implements the same function may be used.

In this embodiment, an analog circuit is used as the sorting circuit 4. However, an associative memory may be used, as in the first embodiment. In this case, the output from the associative memory is D/A-converted and then input to the operation circuit. As the D/A conversion circuit which executes the D/A conversion, a D/A circuit including a digital/pulse width conversion circuit 23, switched current sources 24, capacitors 25, and buffers 26 shown in FIG. 15 will be described.

Figure 15:
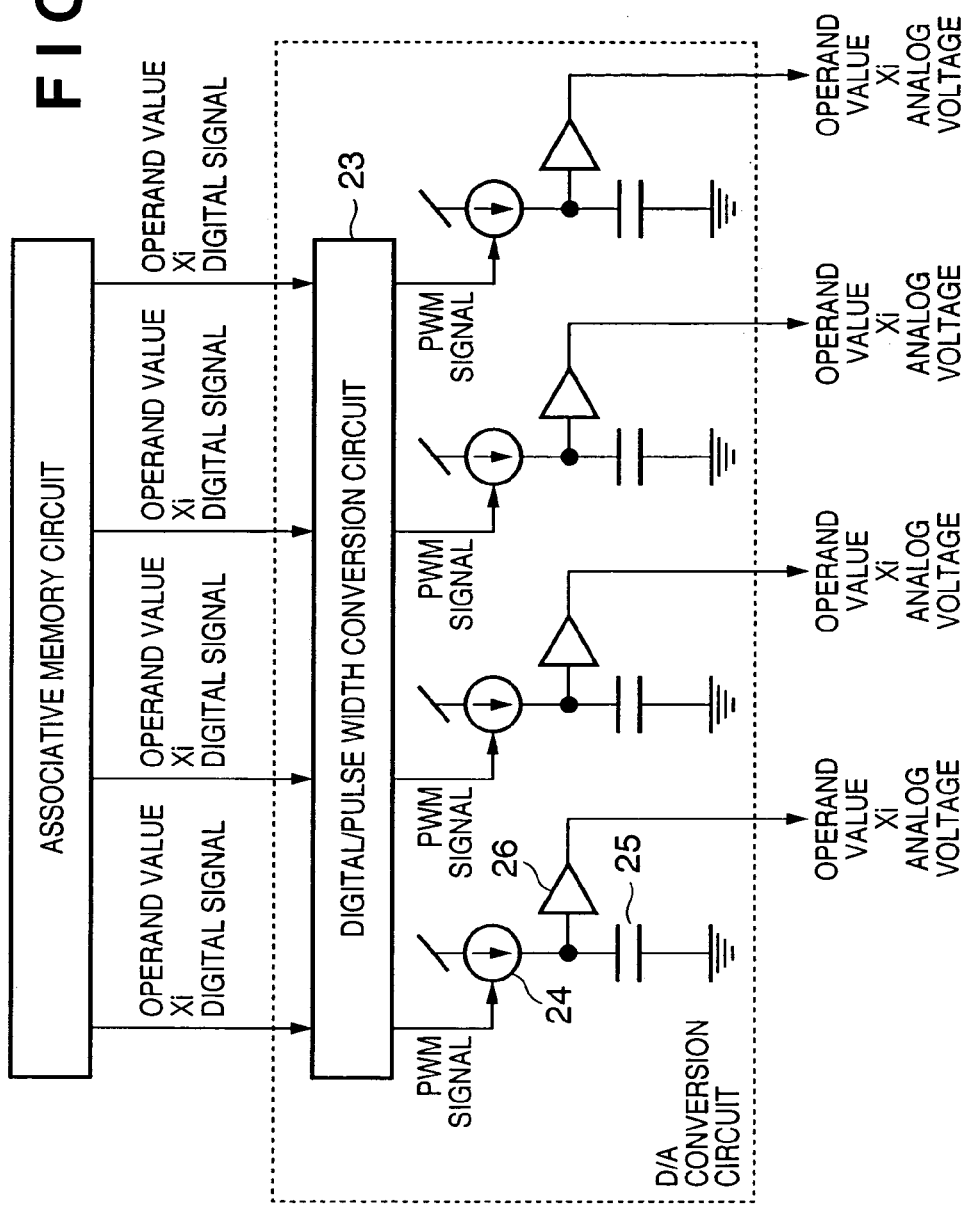
FIG. 15 is a circuit diagram showing an arrangement example of a D/A conversion circuit according to the second embodiment.

As shown in FIG. 15, in the D/A conversion circuit, digital values corresponding to the operand values Xi are input from the digital memory (associative memory circuit) to the digital/pulse width conversion circuit 23. The digital/pulse width conversion circuit 23 converts each input digital value into a pulse signal having a time width proportional to the digital input value and outputs it.

Figure 16:
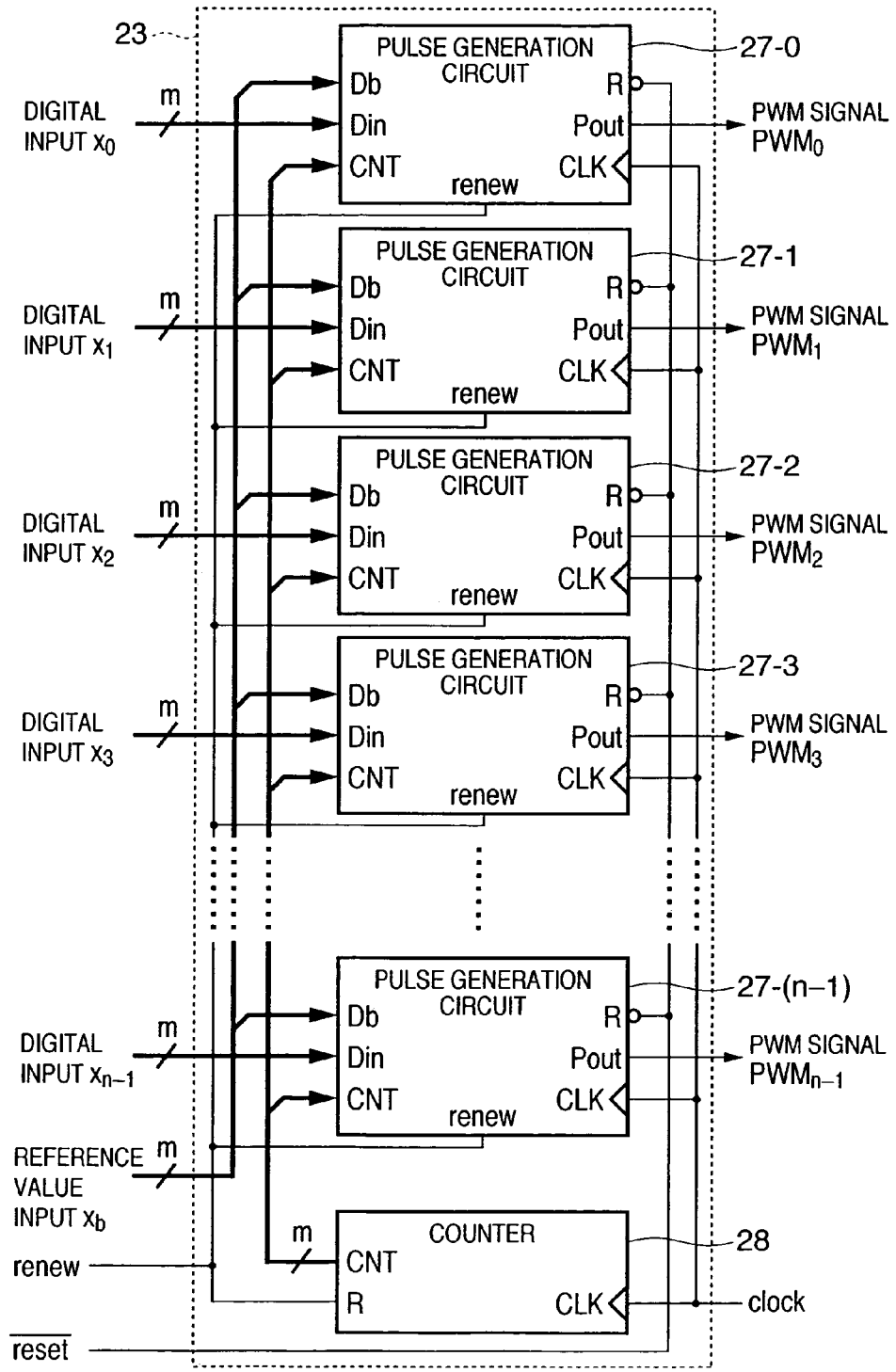
FIG. 16 is a circuit diagram showing an arrangement example of a digital/pulse width conversion circuit according to the second embodiment.

As shown in FIG. 16, the digital/pulse width conversion circuit 23 according to this embodiment comprises a plurality of pulse generation circuits 27-0 to 27-(n−1) arranged in parallel and a counter 28. Data input terminals Din of the pulse generation circuits 27-0 to 27-(n−1) receive m-bit digital input values x0 to xn−1, respectively. PWM signals PWM0 to PWMn−1 proportional to the digital input values x0 to xn−1 are output from pulse output terminals Pout of the pulse generation circuits 27-0 to 27-(n−1), respectively.

The counter 28 counts an externally input clock clock and outputs an m-bit count value. The clock clock is also commonly input to clock input terminals clk of the pulse generation circuits 27-0 to 27-(n−1). The count value output from the counter 28 is commonly input to count value input terminals CNT of the pulse generation circuits 27-0 to 27-(n−1).

In addition, an m-bit reference value xb is commonly input to reference value input terminals Db of the pulse generation circuits 27-0 to 27-(n−1). The reference value xb designates the timings of the leading edges of the PWM signals PWM0 to PWMn−1.

Figure 17:
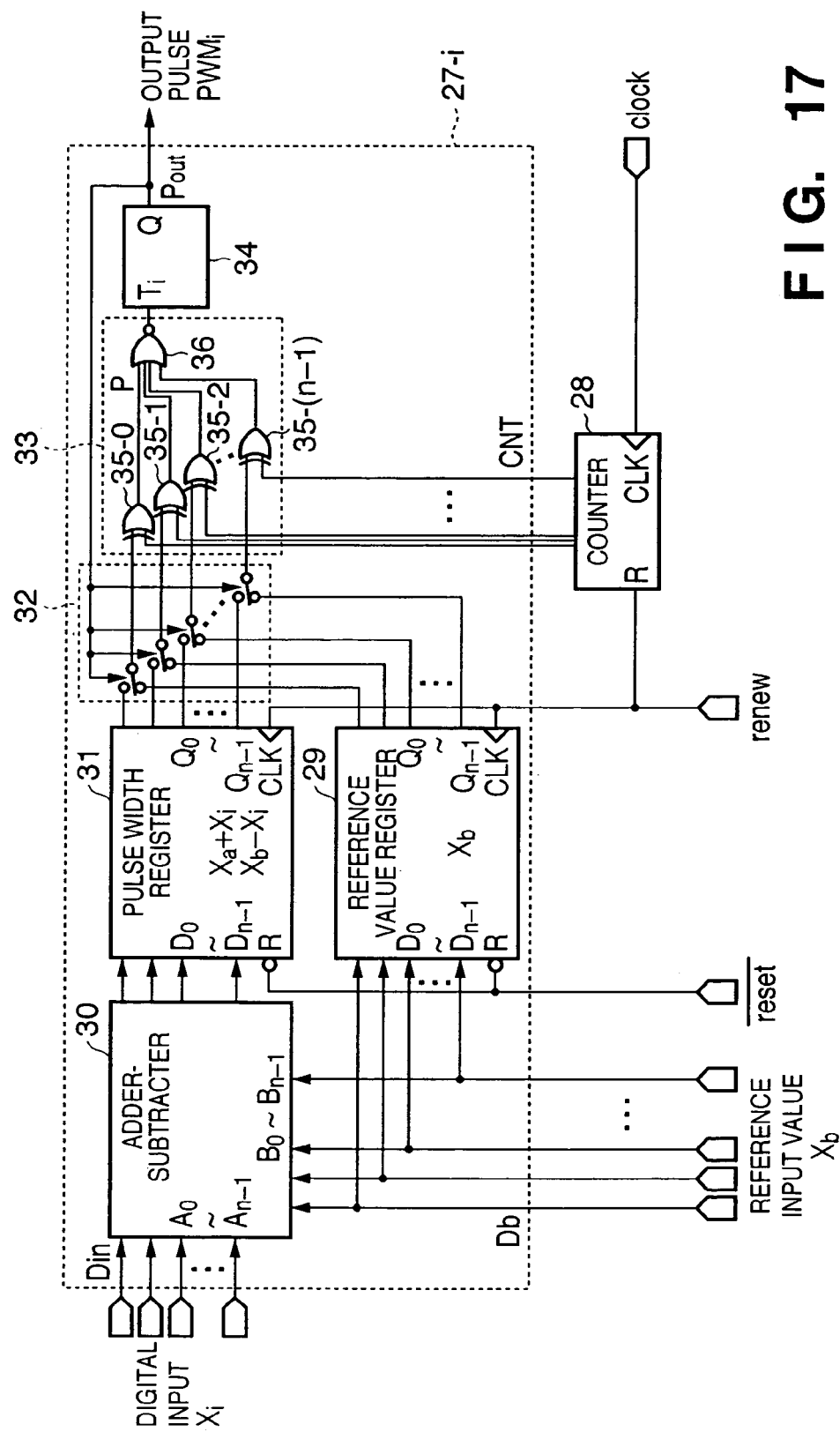
FIG. 17 is a block diagram showing an arrangement example of each pulse generation circuit according to the second embodiment.

FIG. 17 is a block diagram showing the arrangement of each pulse generation circuit shown in FIG. 16. A pulse generation circuit 27-i (i∈{0, 1, . . . , n−1}) comprises a reference value register 29, adder-subtracter 30, pulse width register 31, switching circuit 32, timing trigger generation circuit 33, and output pulse inverting circuit 34.

The reference value register 29 latches the reference value xb and outputs the latched reference value xb. The adder-subtracter 30 outputs a sum xi+xb of the reference value xb and an input value xi which is an externally input digital value. The pulse width register 31 latches the output value (sum xi+xb) from the adder-subtracter 30 at the leading edge of an update input renew.

When an output PWM signal PWMi output from the output pulse inverting circuit 34 has a false value (L level), the switching circuit 32 outputs the digital value xb latched by the reference value register 29. When the output PWM signal PWMi output from the output pulse inverting circuit 34 has a true value (H level), the switching circuit 32 executes switching to output the digital value xi+xb latched by the pulse width register 31.

The timing trigger generation circuit 33 compares each bit of the digital value output from the switching circuit 32 with each bit of the count value CNT output from the counter 28 and generates a trigger when both bits perfectly coincide. The timing trigger generation circuit 33 includes m EXOR gates 35-0 to 35-(m−1) and a NOR gate 36. An output bit from the switching circuit 32 is input to one of the inputs of each of the EXOR ates 35-0 to 35-(m−1). An output bit from the counter 28 is input to the other input of each of the EXOR gates 35-0 to 35-(m−1). Outputs P0 to Pm−1 from the EXOR gates 35-0 to 35-(m−1) are input to the NOR gate 36. The NOR gate 36 outputs the inverted output of the OR of the outputs P0 to Pm−1 from the EXOR gates 35-0 to 35-(m−1) to the output pulse inverting circuit 34.

More specifically, the digital input values xi (i∈{0, 1, ..., n−1}), the reference values xb, and the output values CNT from the counter are respectively given by $$xi = (xi,0, xi,1, \ldots, xi,m-1) \tag{1}$$

$$xb = (xb,0, xb,1, \ldots, xb,m-1) \tag{2}$$

$$CNTi = (CNTi,0, CNTi,1, \ldots, CNTi,m-1) \tag{3}$$

In this case, an output Ti from the timing trigger generation circuit 33 is given by $$T_i = \bigwedge_{j=0}^{m-1} \overline{x_{b,j} \otimes CNT_{i,j}} \tag{4}$$

when the output value Pout from the output pulse inverting circuit 34 is at L level. The output Ti is given by $$T_i = \bigwedge_{j=0}^{m-1} \overline{(x_b + x_i)_j \otimes CNT_{i,j}} \tag{5}$$

when the output value Pout from the output pulse inverting circuit 34 is at H level.

The output pulse inverting circuit 34 inverts the truth value of the output PWM signal PWMi when the timing trigger generation circuit 33 generates a trigger. The output pulse inverting circuit 34 includes a synchronous T flip-flop (to be referred to as a "T-FF" hereinafter). The output value from the NOR gate 36 is input to a trigger input terminal T of the output pulse inverting circuit 34. The common clock clock is input to a clock terminal clk of the T-FF. The output PWM signal PWMi is output from an output terminal Q of the output pulse inverting circuit 34.

Figure 18:
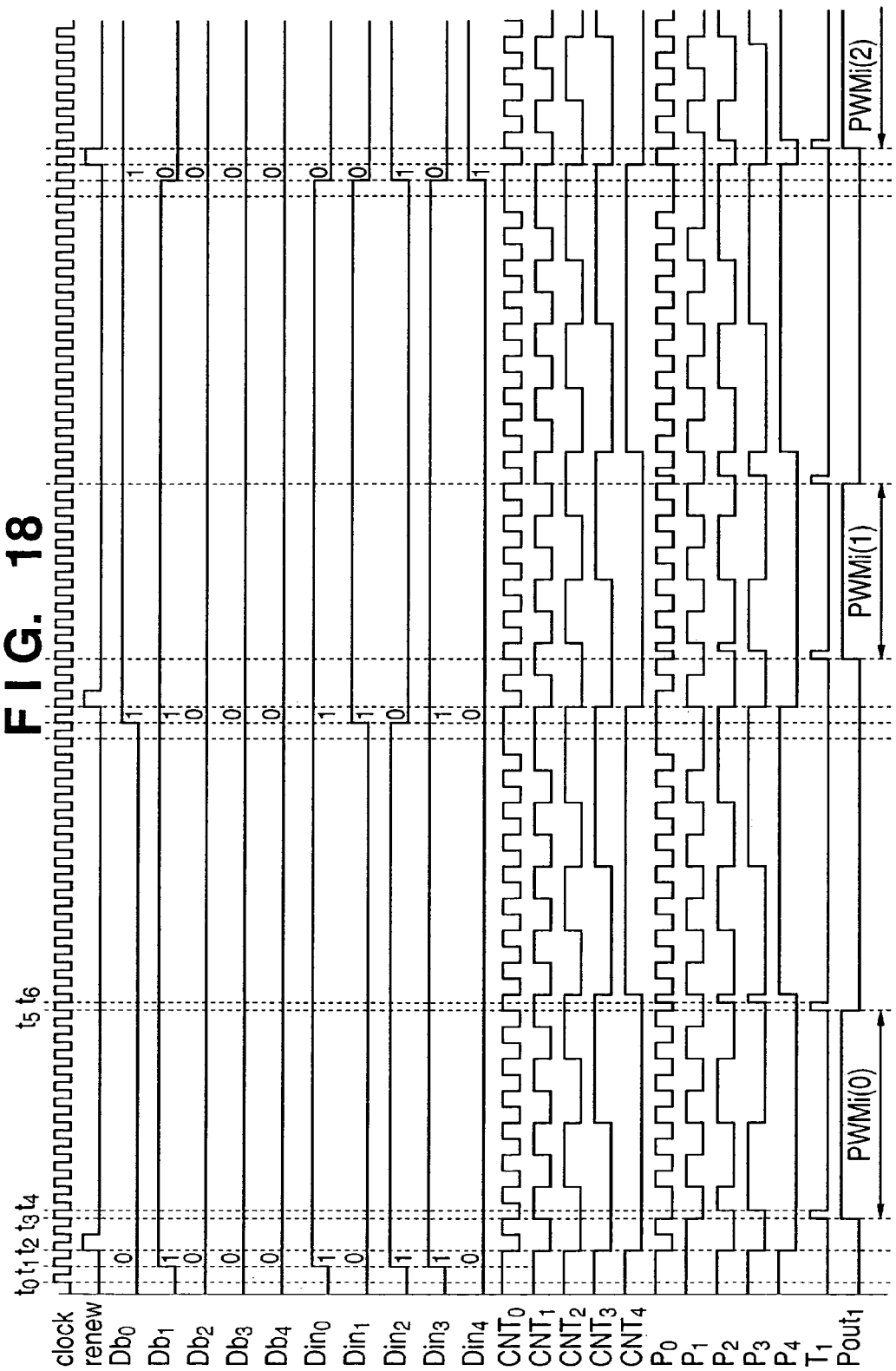
FIG. 18 is a timing chart showing the operation of the digital/pulse width conversion circuit according to the second embodiment.

The operation of the digital/pulse width conversion circuit according to this embodiment having the above-described arrangement will be described below with reference to the timing chart shown in FIG. 18.

At time t1, the input value xi and reference value xb are input from an external circuit to each pulse generation circuit 27-i. At time t2, the update signal renew is input to a reset input node R of the counter 28 and the clock input nodes CLK of the reference value register 29 and pulse width register 31 in each pulse generation circuit 27-i. Upon receiving the update signal renew, the reference value register 29 and pulse width register 31 latch the reference value xb and input value xi at the leading edge of the update signal renew.

The reference value register 29 outputs the latched reference value xb. The pulse width register 31 outputs the latched sum xi+xb. At the time t1, the output from the output pulse inverting circuit 34 has L level. For this reason, the switching circuit 32 outputs the value xb input from the reference value register 29. The counter 28 resets the count value CNT to 0 and starts counting at the leading edge of the update signal renew.

The counter 28 counts up. At time t3, the count value CNT from the counter 28 coincides with the reference value xb as the output value from the switching circuit 32. At this time, the output Ti from the timing trigger generation circuit 33 is inverted to H level. Accordingly, the output Pout from the output pulse inverting circuit 34 is inverted from L level to H level, and output of the output PWM signal PWMi starts.

At time t4, when the output Pout from the output pulse inverting circuit 34 is inverted to H level, the input to the switching circuit 32 is switched so that the switching circuit 32 outputs the value xb+xi input from the pulse width register 31. Accordingly, the output values from the EXOR gates 35-0 to 35-(m−1) also change. When xi≠0, the output values from the EXOR gates 35-0 to 35-(m−1) never become 0 simultaneously. Hence, the output Ti from the timing trigger generation circuit 33 is inverted to L level.

The counter 28 counts up. At time t5, the count value CNT from the counter 28 coincides with the sum xb+xi as the output value from the switching circuit 32. At this time, the output Ti from the timing trigger generation circuit 33 is inverted to H level. Accordingly, the output Pout from the output pulse inverting circuit 34 is inverted from H level to L level, and output of the output PWM signal PWMi is stopped. In this way, the output PWM signal PWMi having a time width proportional to the digital input value xi is generated, and digital/pulse width conversion is executed.

At time t6, when the output from the output pulse inverting circuit 34 is inverted to L level, the input to the switching circuit 32 is switched so that the switching circuit 32 outputs the value xb input from the reference value register 29. Accordingly, the output values from the EXOR gates 35-0 to 35-(m−1) also change. When xi≠0, the output values from the EXOR gates 35-0 to 35-(m−1) never become 0 simultaneously. Hence, the output Ti from the timing trigger generation circuit is inverted to L level.

The counter 28 continues to count until it counts up. During this time, the counter value and the output value xb from the switching circuit never coincide. Hence, the output from the output pulse inverting circuit 34 holds L level. When the counter 28 counts up, it stops counting, and one cycle is thus ended. After the counter 28 counts up, the output values (all are H level) at the time of count-up are maintained until the reset input node R is inverted to H level again.

In the above-described way, each pulse generation circuit 27-i outputs the output PWM signal PWMi having a time width proportional to the input value xi. At this time, each pulse generation circuit 27-i compares the count value output from the common counter 28 with the reference value xb or sum xb+xi. Power consumption is much smaller than in a circuit in which all the pulse generation circuits 27-i have counters. For this reason, the power consumption of the digital/pulse width conversion circuit can be reduced.

In this embodiment, the timing trigger generation circuit 33 generates the timings of the leading edge and trailing edge of the output PWM signal PWMi by using the reference value register 29, pulse width register 31, and switching circuit 32. With this arrangement, the pulse width of the output PWM signal PWMi can accurately be proportional to the input value xi without being affected by the circuit delay.

In this embodiment, the leading edges of the output pulses of the pulse generation circuits 27-0 to 27-(n−1) are adjusted by the reference value xb. In the present invention, the trailing edges of the output pulses may be adjusted. In this case, the adder-subtracter 30 outputs a difference xb−xi by subtracting the input value xi as the digital value input from an external circuit from the reference value xb. When the output PWM signal PWMi output from the output pulse inverting circuit 34 has a true value (H level), the switching circuit 32 outputs the digital value xb latched by the reference value register 29. When the output PWM signal PWMi output from the output pulse inverting circuit 34 has a false value (L level), the switching circuit 32 executes switching to output the digital value xb−xi latched by the pulse width register 31.

Instead of preparing the adder-subtracter 30 in each pulse generation circuit 27-i, a result obtained by adding or subtracting the original input value to or from the reference value xb may be supplied as the digital input signal xi. The digital/pulse width conversion circuit according to this embodiment may be different from that described above and may have another form to be described below.

Figure 45:
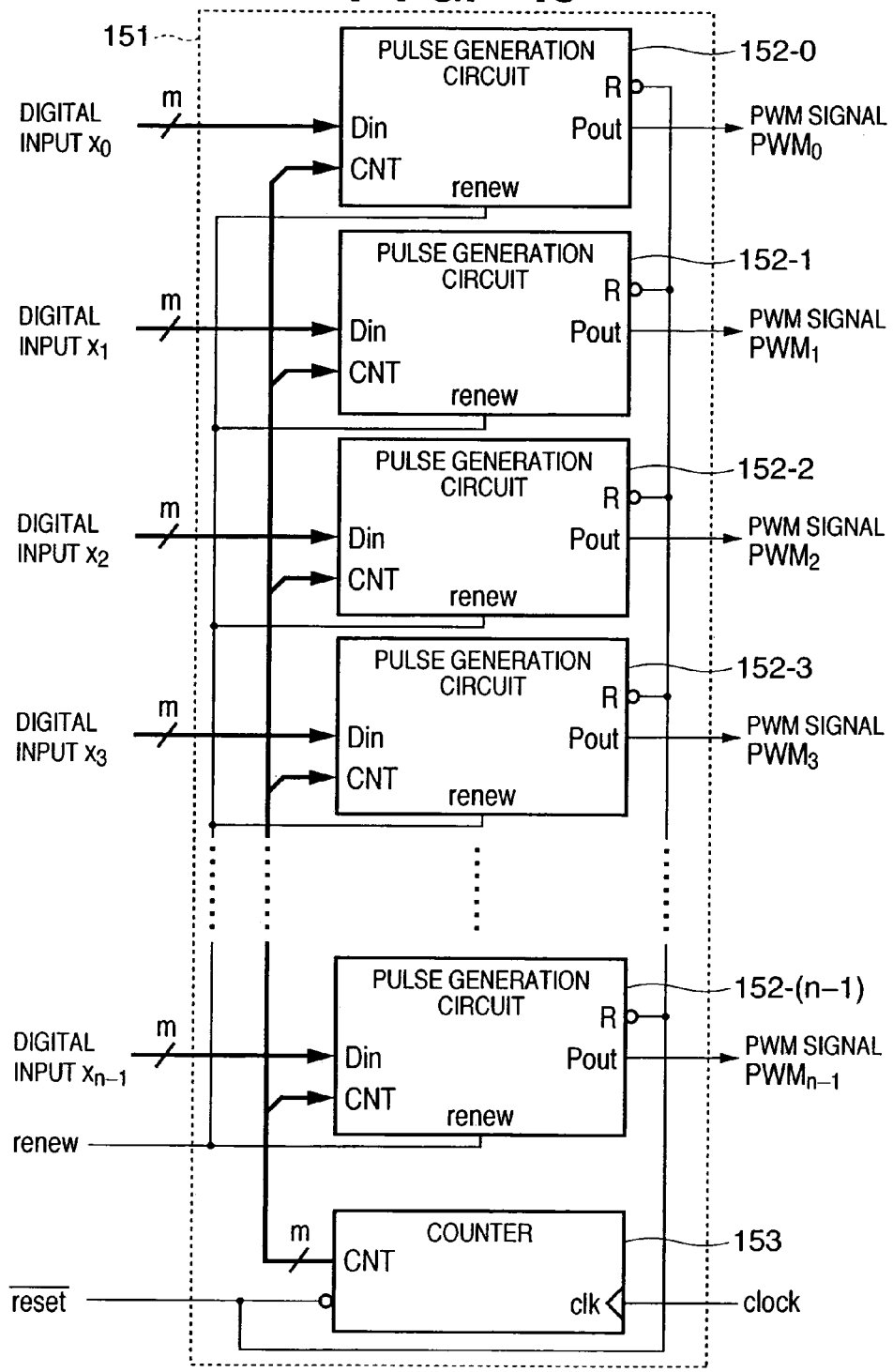
FIG. 45 is a block diagram showing another digital/pulse width conversion circuit according to the second embodiment.

For example, as shown in FIG. 45, another digital/pulse width conversion circuit 151 according to this embodiment comprises a plurality of pulse generation circuits 152-0 to 152-(n−1) arranged in parallel and a counter 153. The data input terminals Din of the pulse generation circuits 152-0 to 152-(n−1) receive the m-bit digital input values x0 to xn−1, respectively. The PWM signals PWM0 to PWMn−1 having time widths proportional to the digital input values x0 to xn−1 are output from the pulse output terminals Pout of the pulse generation circuits 152-0 to 152-(n−1), respectively.

The counter 153 counts the externally input clock clock and outputs an m-bit count value. The count value output from the counter 153 is commonly input to the counter value input terminals CNT of the pulse generation circuits 152-0 to 152-(n−1).

Figure 46:
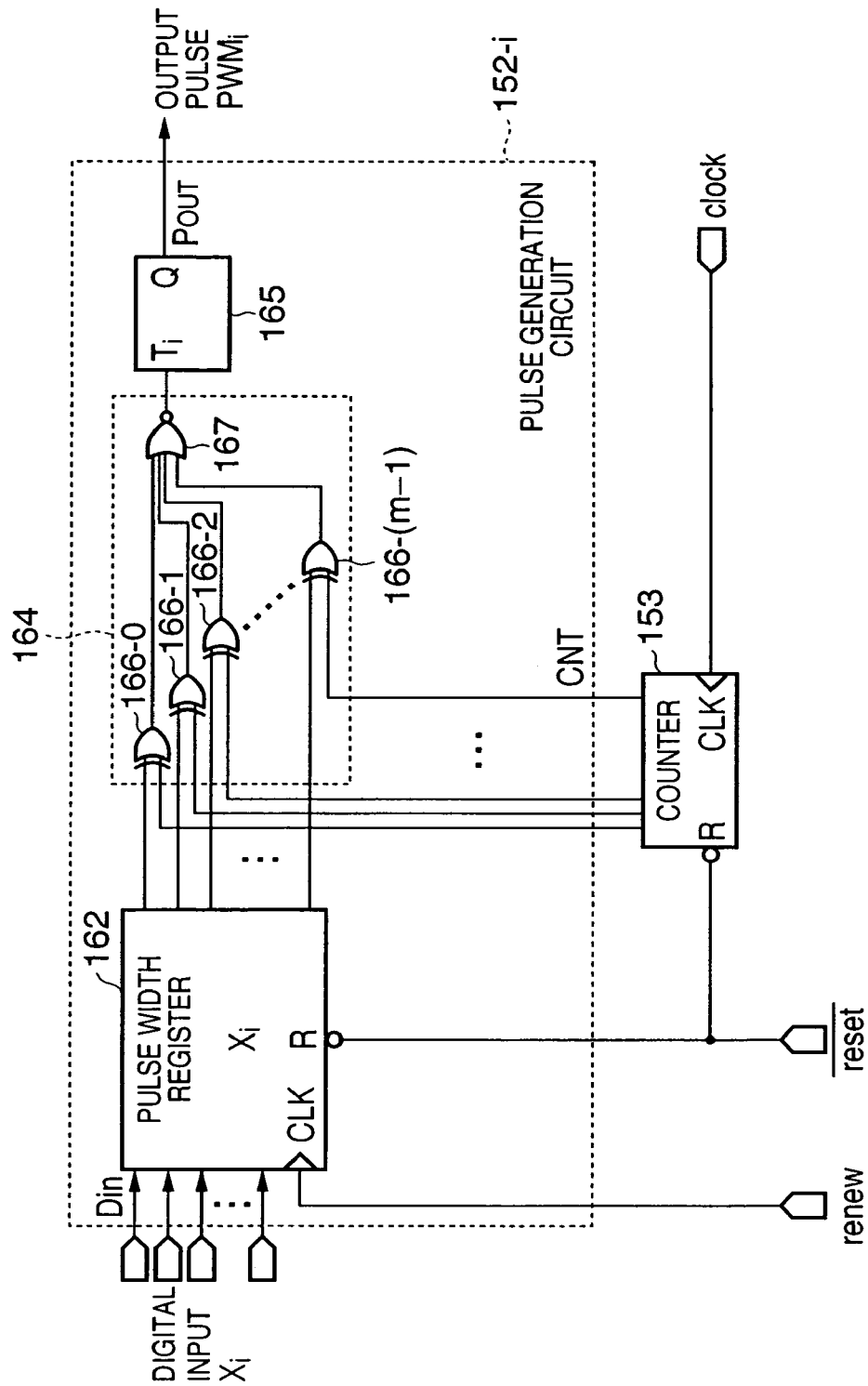
FIG. 46 is a block diagram showing another arrangement example of the pulse generation circuit according to the second embodiment.

FIG. 46 is a block diagram showing the arrangement of each pulse generation circuit shown in FIG. 45. A pulse generation circuit 152-i (i∈{0, 1, . . . , n−1}) comprises a pulse width register 162, timing trigger generation circuit 164, and output pulse inverting circuit 165.

The pulse width register 162 latches the input value xi as the externally input m-bit digital value at the leading edge of the update input renew and outputs the value xi to the output node. The timing trigger generation circuit 164 compares each of the m bits of the digital value output from the pulse width register 162 with each of the m bits of the count value output from the counter 153 and generates a trigger when both bits perfectly coincide.

The timing trigger generation circuit 164 includes m EXOR gates 166-0 to 166-(m−1) and a NOR gate 167. An output bit from the pulse width register 162 is input to one of the inputs of each of the EXOR gates 166-0 to 166-(m−1). An output bit from the counter 153 is input to the other input of the EXOR gates 166-0 to 166-(m−1). The outputs P0 to Pm−1 from the EXOR gates 166-0 to 166-(m−1) are input to the NOR gate 167. The NOR gate 167 outputs the inverted output of the OR of the outputs P0 to Pm−1 from the EXOR gates 166-0 to 166-(m−1) to the output pulse inverting circuit 165.

More specifically, the digital input values xi (i∈(0, 1, . . . , n−1}) and the output values CNT from the counter are respectively given by equations (1) and (3). In this case, the output Ti from the timing trigger generation circuit 164 is given by $$T_i = \bigwedge_{j=0}^{m-1} \overline{x_{i,j} \otimes CNT_{i,j}} \qquad (6)$$

In this case, it is assumed that xi≠0.

As is apparent from equation (6), the output Ti from the timing trigger generation circuit 164 becomes 1 when the digital input value xi and the output value CNT from the counter coincide in all bits. The output pulse inverting circuit 165 inverts the truth value of the output pulse PWMi when the timing trigger generation circuit 164 generates a trigger. The output pulse inverting circuit 165 includes a T flip-flop (to be referred to as a "T-FF" hereinafter). The output value from the NOR gate 167 is input to the trigger input terminal T of the output pulse inverting circuit 165. The pulse PWMi is output from the output terminal Q of the output pulse inverting circuit 165.

Figure 47:
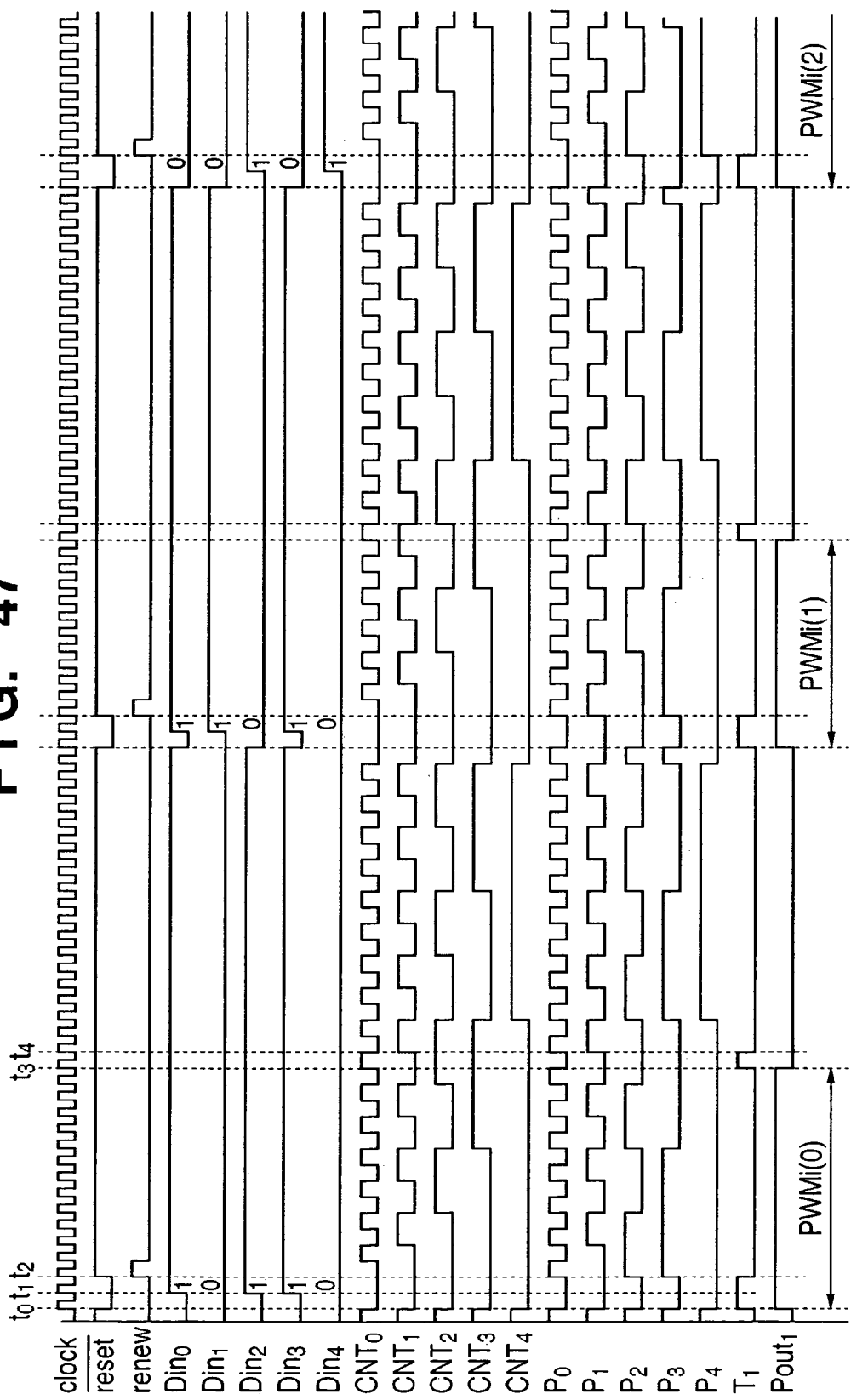
FIG. 47 is a timing chart showing the operation of another digital/pulse width conversion circuit according to the second embodiment.

The operation of the digital/pulse width conversion circuit according to this embodiment having the above-described arrangement will be described below with reference to the timing chart shown in FIG. 47.

In the initial state immediately after powering on, all the count values CNT of the counter 153 are assumed to be at H level, and the input value xi is 0. In this state, at time t0, a reset input reset which is input to the counter 153 and pulse width register 162 is enabled (L level). Accordingly, all the count values CNT of the counter 153 are reset to 0. When the reset signal reset is set to L level, the pulse width register 162 resets all the held storage values to 0. Then, the count value CNT from the counter 153 coincides with the output value from the pulse width register 162. The output Ti from the timing trigger generation circuit 164 is inverted from L level to H level. Hence, the output Pout from the output pulse inverting circuit 165 is inverted to H level, and output of pulses to the output Pout starts.

At the time t1, the input value xi (Xi≠(0, 0, . . . , 0)) is input from an external circuit to each pulse generation circuit 152-i. At this time, since the reset signal reset input to the pulse width register 162 is at L level, all the outputs from the pulse width register 162 remain 0.

At the time t2, the reset input reset is disabled (H level), and the update signal renew is inverted from L level to H level. The update signal renew is input to the clock input node CLK of each pulse width register 162. When the update signal renew is inverted to H level, the pulse width register 162 latches the input value xi at that time. Accordingly, the pulse width register 162 outputs the input value xi. On the other hand, the count value CNT of the counter 153 still remains 0. Since the output from the pulse width register 162 no longer coincides with the count value CNT from the counter 153, the output T from the timing trigger generation circuit 164 is inverted from H level to L level. When the reset signal reset is inverted from L level to H level, the counter 153 starts counting the clock clock. At this time, the pulse width register 162 continues to output the latched input value xi.

With the clock clock, the counter 153 counts up. At the time t3, the count value CNT from the counter 153 coincides with xi as the output value from the switching circuit 163. At this time, the output value T from the timing trigger generation circuit 164 is inverted from. L level to H level. Accordingly, the output Pout from the output pulse inverting circuit 165 is inverted from H level to L level. With this operation, the width of the pulse PWMi of the output Pout from the output pulse inverting circuit 165 is determined. This pulse width is proportional to the digital input value xi. That is, digital/pulse width conversion is executed.

At the time t4 after the elapse of one clock from the time t3, the counter 153 counts up. The count value CNT from the counter 153 no longer coincides with the output value xi from the switching circuit 163. Then, the output Ti from the timing trigger generation circuit 164 is inverted from H level to L level.

The counter 153 continues to count until it counts up. During this time, the count value CNT from the counter 153 and the input value xi never coincide. Hence, the output Ti from the timing trigger generation circuit 164 holds L level, and the output from the output pulse inverting circuit 165 also holds L level. When the counter 153 counts up, all the count values of the counter 153 become 0, and one cycle is thus ended. Subsequently, the same cycle as described above is repeated.

In the above-described way, each pulse generation circuit 152-i (i=0, . . . , n−1) outputs the output pulse PWMi having a time width proportional to the input value xi (strictly speaking, this time width contains an offset corresponding to two clocks during the period in which the reset signal is at L. This can be coped with by, e.g., subtracting 2 from xi in advance). At this time, each pulse generation circuit 152-i compares the count value CNT output from the common counter 153 with the digital input value xi. Power consumption is much smaller than in a circuit in which all the pulse generation circuits 152-i have counters.

More specifically, when all the pulse generation circuits 152-i have counters, at least one switching device is switched for each clock in each counter. Hence, when, e.g., a CMOS is used as a switching device, a through current or a charge/discharge current to the load flows at the time of switching. For this reason, the power consumption of the entire digital/pulse width conversion circuit is high.

On the other hand, when one counter 153 is driven, and each pulse generation circuit 152-i switches the pulse with reference to the output value from the common counter 153, as in this embodiment, the through current or charge/discharge current to the load generated at the time of switching is small, and power consumption is also low. Hence, the power consumption of the digital/pulse width conversion circuit 151 can be reduced. In addition, since the common counter 153 is used, the circuit layout area decreases, and the digital/pulse width conversion circuit 151 can be made compact.

Subsequently, as shown in FIG. 15, the PWM signal ON/OFF-controls the operation of the switched current source 24.

More specifically, in this embodiment, while the PWM signal is High, the switch is ON, and a predetermined current is supplied to the capacitor 25. While the PWM signal is Low, the switch is OFF, and current supply to the capacitor 25 stops. As a result, the capacitor 25 accumulates a charge amount proportional to the time width of the PWM signal.

In the capacitor 25, the charge amount accumulated through the buffer 26 can be referred to as a voltage value. This is input to the analog operation circuit as an analog voltage value corresponding to the operand value Xi, as shown in FIG. 15.

The above-described detailed circuit arrangement of the sorting circuit 4 is not the gist of the present invention. Any other circuit arrangement can be used if it can realize the same function.

Figure 19:
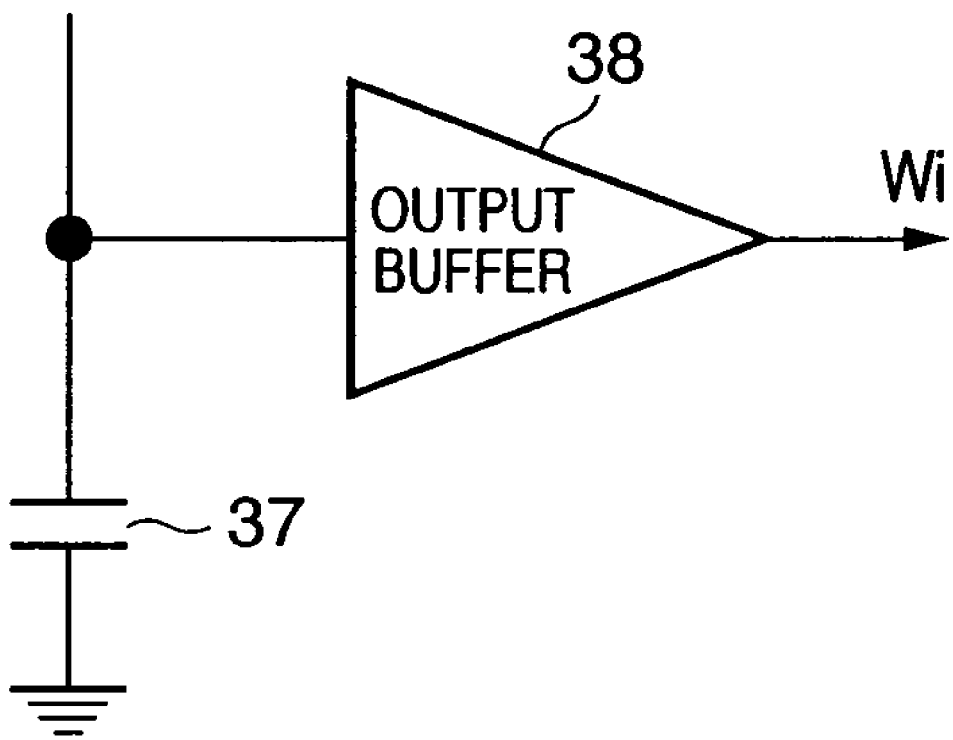
FIG. 19 is a block diagram showing an arrangement example of a weight holding circuit according to the second embodiment.
Figure 20:
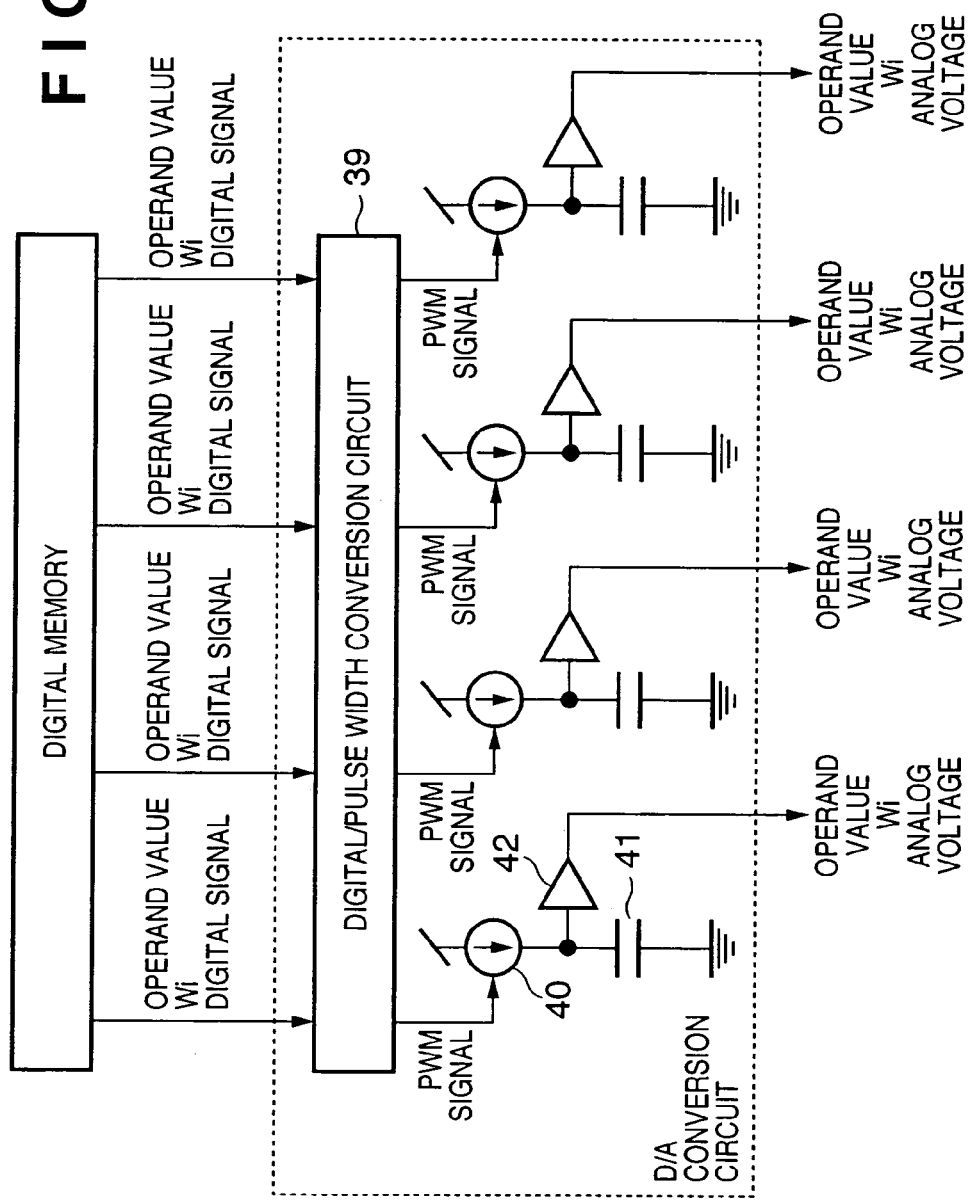
FIG. 20 is a block diagram showing an arrangement example of a D/A conversion circuit according to the second embodiment.

The weight holding circuit 3 will be described next. The weight holding circuit 3 includes a capacitor 37 and output buffer 38, like the input value holding circuit 2, as shown in FIG. 19. The weight holding circuit 3 holds the value of an operand value Wi as a voltage value accumulated in the capacitor 37. For the weight holding circuit 3, as shown in FIG. 20, the value of the operand value Wi held in a digital memory (e.g., an SRAM) may be D/A-converted and held in the above-described weight holding circuit as an analog value. In this case, the steps of processing by the D/A conversion circuit is the same as those of the D/A conversion circuit when an associative memory is used, as described above, and a description thereof will be omitted.

Operation processing executed in the predetermined operation circuit to which the operand value Xi and operand value Wi are input as analog voltage values will be described next.

As shown in FIG. 12, the operation circuit according to this embodiment is formed as an analog operation circuit including the analog multiplier 17, capacitor 18, and output buffer 19. The operand values Xi and Wi are input to the analog multiplier 17 as analog voltages and Xi×Wi is operated. The value of the operand value Wi input to each operation circuit may remain unchanged or change between operations.

The multiplication result of Xi×Wi is expressed by a charge amount and added and accumulated in the capacitor 18. In this embodiment, the multiplication result by the analog multiplier 17 is assumed to be output as a charge amount. However, any other method of outputting the multiplication result as, e.g., a voltage value can be used as long as the same function as described above can be realized.

By repeating the above-described processing, the accumulation value of a plurality of multiplication results of Xi×Wi is held in the capacitor 18. When a predetermined number of accumulations are ended, the accumulation value is output through the output buffer 19.

As in the first embodiment, the analog voltage value corresponding to the operand value Xi is input to a predetermined operation circuit by switching the switch circuit in correspondence with the label of the operand value Xi, although there is the difference between a digital value and an analog value. In addition, the operation processing is not executed in an operation circuit to which no operand value Xi is input, as in the first embodiment.

In this embodiment, the analog voltage value corresponding to the operand value Wi is switched by the switch circuit in accordance with the label of the operand value Xi and input to a predetermined operation circuit determined by the label, like the operand value Xi, although there is the difference between a digital value and an analog value. As a method different from the embodiment, the predetermined operation circuit to which the analog voltage value corresponding to the operand value Wi should be input may be set in advance independently of the label of the operand value Xi, as in the first embodiment.

As described above, the operand values Xi input to the operation circuit as an analog voltage are input in descending order of magnitude by the sorting circuit. The operand values Xi having the same value are continuously input. For these reasons, as compared to a case in which the operand values Xi are input at random, the voltage variation becomes small, and the time lag and power consumption caused by the voltage variation can be reduced.

In this embodiment, the sorting circuit sorts the operand values Xi in descending order of magnitude. Even when the operand values Xi are sorted in ascending order of magnitude, the same effect as described above can be obtained.

THIRT EMBODIMENT

Figure 21:
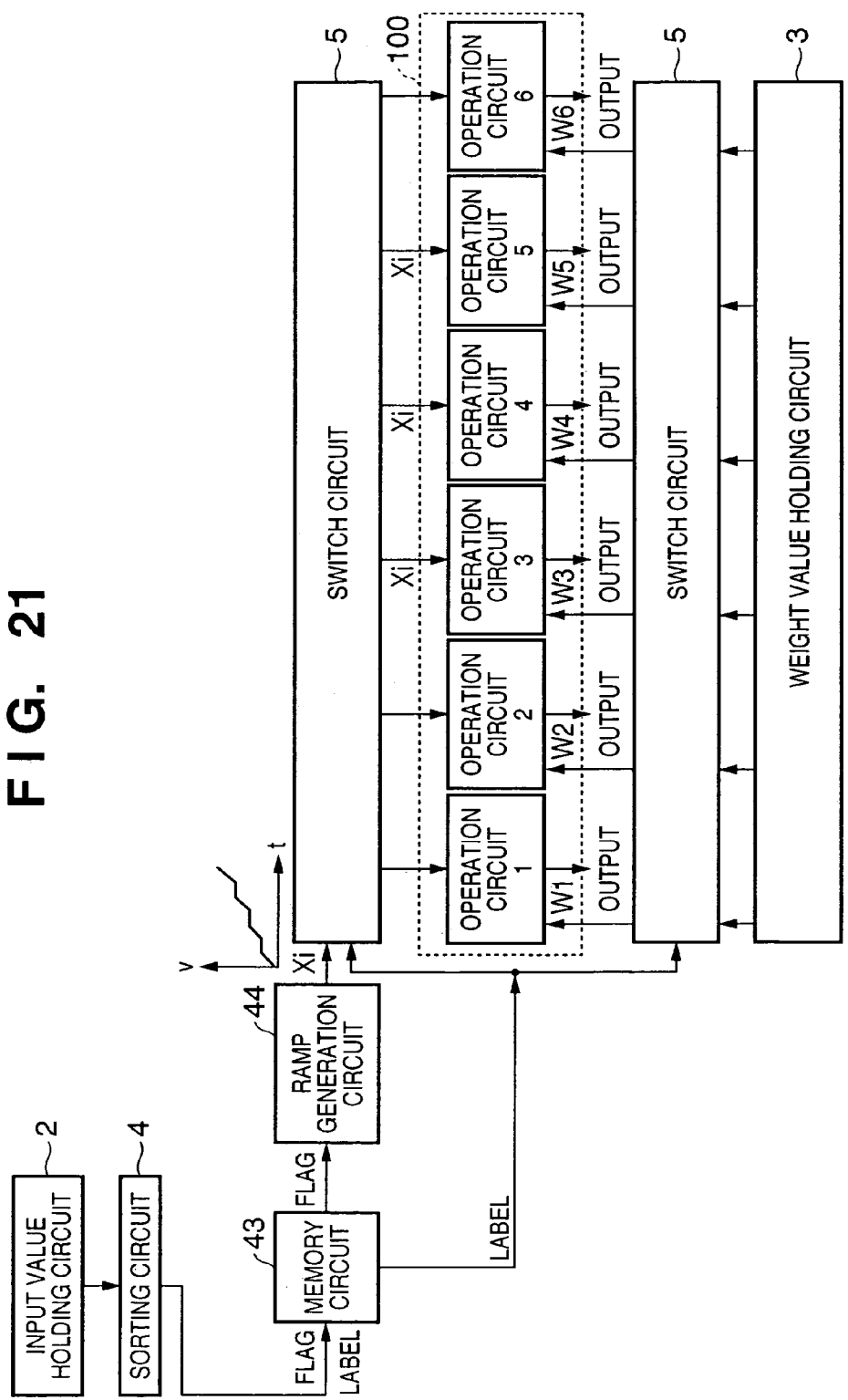
FIG. 21 is a block diagram showing an example of the overall arrangement of a product-sum operation circuit according to the third embodiment.

The third embodiment will be described with reference to views of a detailed processing arrangement. FIG. 21 shows the arrangement of a processing circuit to execute a product-sum operation method according to this embodiment.

Figure 22:
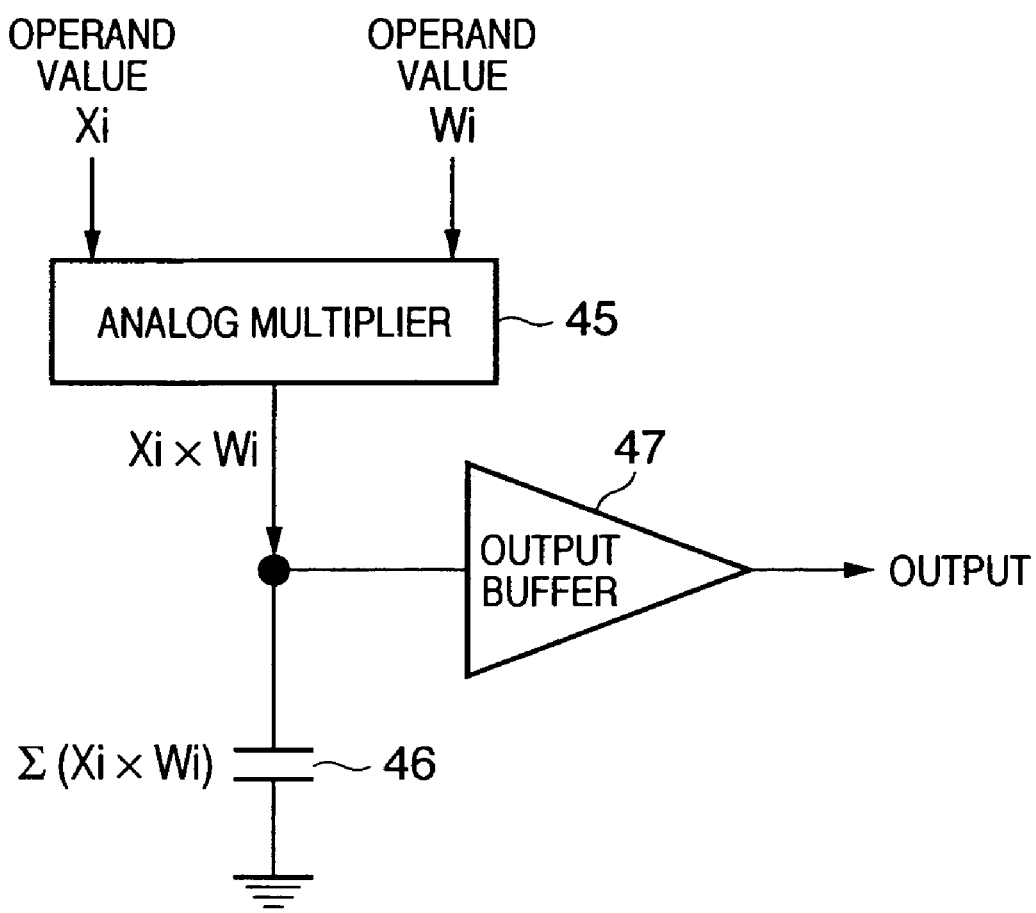
FIG. 22 is a block diagram showing an arrangement example of an analog operation circuit according to the third embodiment.
Figure 23:
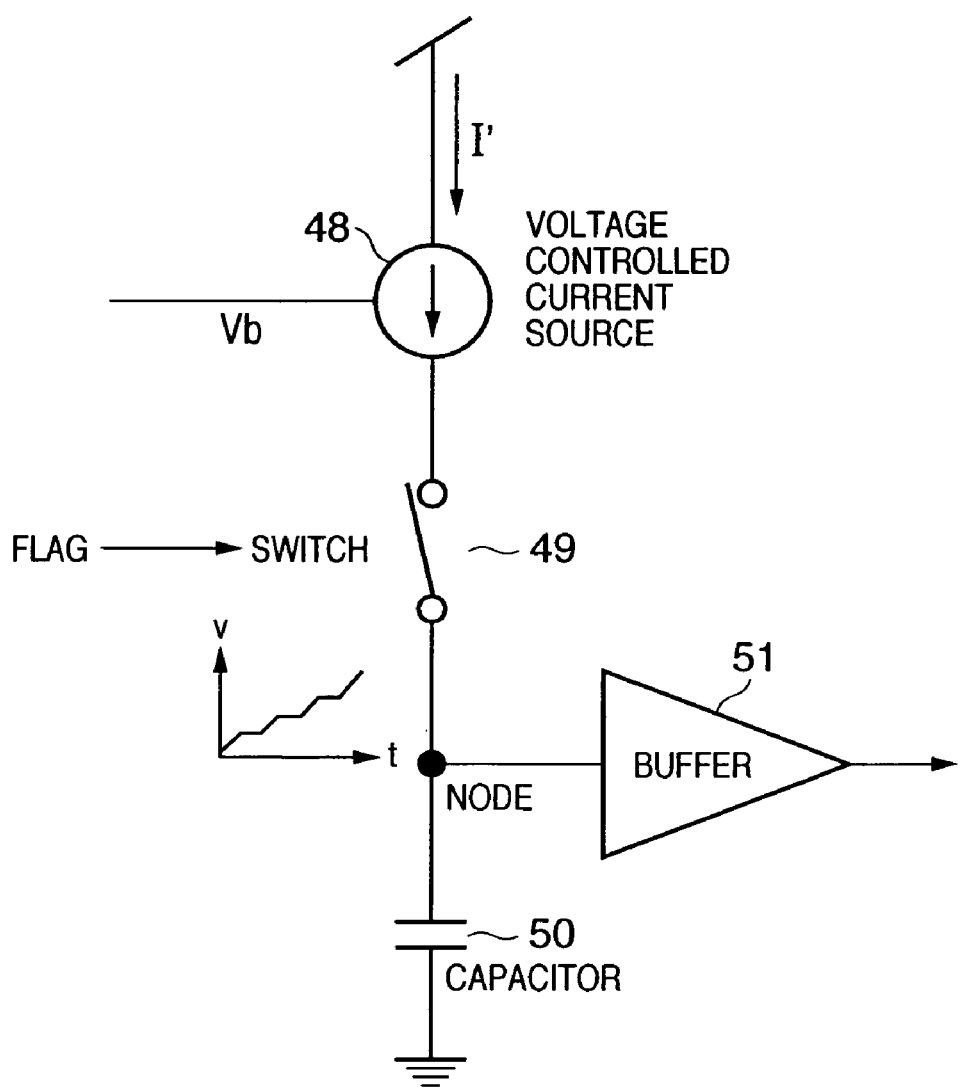
FIG. 23 is a block diagram showing an arrangement example of a ramp generation circuit according to the third embodiment.

FIG. 22 shows an analog operation circuit in which an operation circuit is formed as an analog circuit. Operation circuits 2 to 6 also have the same arrangement. As shown in FIG. 22, the analog operation circuit according to this embodiment comprises an analog multiplier 45, capacitor 46, and output buffer 47. FIG. 23 shows a ramp generation circuit 44.

An input value holding circuit 2 and a sorting circuit 4 include an associative memory circuit, as in the first embodiment. A memory circuit 43 is formed at the subsequent stage of the sorting circuit 4. In addition, the ramp generation circuit 44 is formed at the subsequent stage of the memory circuit 43. The output from the ramp generation circuit 44 is input to a switch circuit 5. The memory circuit 43 of this embodiment includes, e.g., an SRAM.

The processing using the product-sum operation method according to this embodiment will be described with reference to the above-described drawings. The associative memory circuit holds the values of operand values Xi and the labels the operand values Xi have.

As the general function of the associative memory circuit, it searches the operand values Xi in descending order of magnitude and outputs the labels. Simultaneously, for the search value in searching the operand values Xi in descending order of magnitude, only when the search value is decreased by one unit, the flag of a pulse signal is output (in this embodiment, flag=1 is output). (As a method different from this embodiment, for the search value in searching the operand values Xi in ascending order of magnitude, only when the search value is increased by one unit, the flag of a pulse signal may be output).

As shown in FIG. 21, the labels and flags are input to and held in the memory circuit 43 at the subsequent stage in correspondence with each other in searching order (i.e., in descending order of magnitude). Subsequently, the memory circuit 43 outputs the labels and flags in the holding order (i.e., in descending order of magnitude). The labels are input to the switch circuit 5. The flags are input to the ramp generation circuit 44.

The ramp generation circuit 44 will be described next. The ramp generation circuit 44 includes a voltage controlled current source 48 biased to a predetermined voltage value Vb, a capacitor 50, a switch 49, and a buffer 51, as shown in FIG. 23. When the flag is input to the ramp generation circuit 44 to turn on the switch 49, a predetermined current is supplied from the voltage controlled current source 48 and accumulated in the capacitor 50.

The flag is set to 1 only when the search value in the associative memory decreases by one unit. For this reason, the switch 49 is turned on when the search value decreases by one unit. Hence, the voltage value of the node in the ramp generation circuit 44 changes as indicated by the waveform shown in FIG. 23. More specifically, voltage values which correspond to the operand values Xi in descending order of magnitude and monotonically increase are generated ("monotonically" also means a case in which a constant value is exhibited over time. This also applies to the following description).

As the voltage values corresponding to the operand values Xi in descending order of magnitude, voltage values which monotonically increase are set. However, voltage values which monotonically decrease may be set depending on the analog multiplier to be described later. This can be implemented by, in the ramp generation circuit 44, removing charges from the capacitor 50 which accumulates predetermined charges in the initial state by the voltage controlled current source.

Subsequently, the monotonically increasing voltage value generated by the ramp generation circuit 44 is input to the switch circuit 5. The switch circuit 5 executes switching in correspondence with the input label and inputs the monotonically increasing voltage value to predetermined operation circuit 1 determined by the label.

Operation circuit 1 will be considered. Only when operation circuit 1 coincides with the predetermined operation circuit determined by the label, the monotonically increasing voltage value is input. When the label output from the memory circuit 43 changes, and operation circuit 1 does not coincide with the predetermined operation circuit determined by the label, switching is executed, and the monotonically increasing voltage value is not input. That is, in operation circuit 1, the monotonically increasing voltage value is sampled in accordance with the output timing of the label. This means that an appropriate voltage value corresponding to the operand value Xi is input at the switching timing by the label.

The operation processing is not executed in operation circuit 1 to which no operand value Xi is input, as in the second embodiment. The operation processing in the weight holding circuit 3 is the same as in the second embodiment, and a description thereof will be omitted.

Subsequently, in the analog operation circuit, as shown in FIG. 22, the operand value Xi and operand value Wi input to the analog multiplier 45 are multiplied. Charges corresponding to the operation result are accumulated in the capacitor 46. The processing in the analog operation circuit is the same as in the second embodiment, and a description thereof will be omitted. In this embodiment, the operand value Xi may be input to the input value holding circuit 2 as a PWM signal. In this case, the PWM signal input processing steps are the same as in the first embodiment, and a description thereof will be omitted.

FOURTH EMBODIMENT

In this embodiment, a circuit in which another circuit arrangement is used as the analog operation circuit according to the second or third embodiment will be described. Arrangements except the analog operation circuit are the same as in the second and third embodiments.

Figure 24:
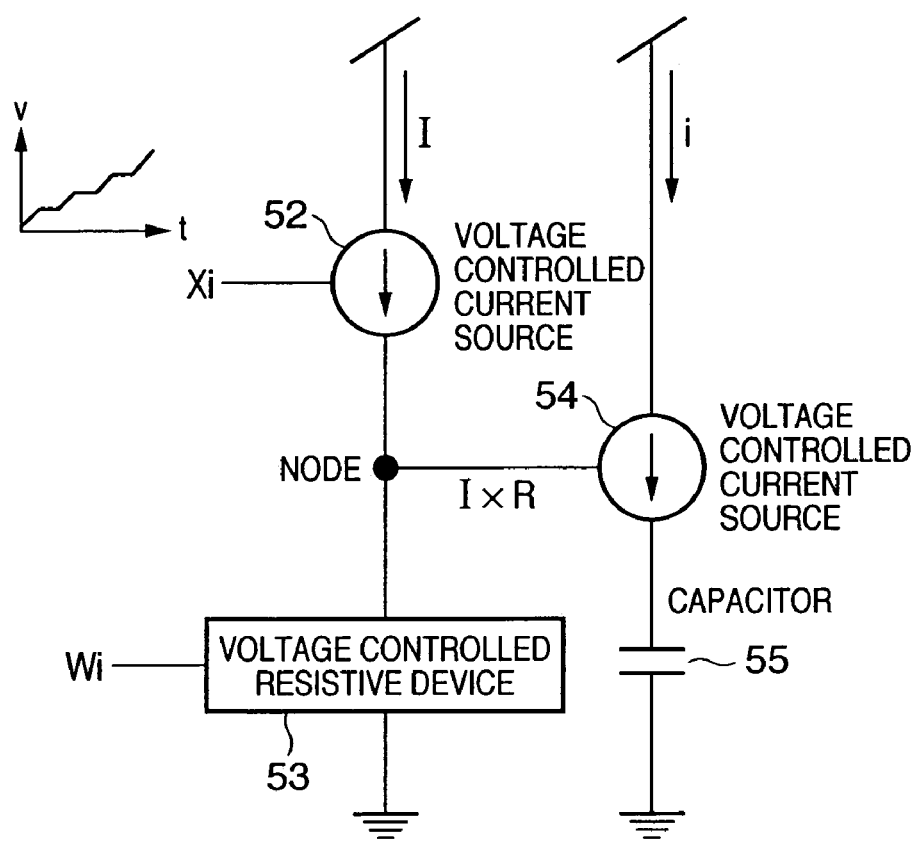
FIG. 24 is a block diagram showing an arrangement example of an analog operation circuit according to the fourth embodiment.

FIG. 24 shows the analog operation circuit to be described in this embodiment. As shown in FIG. 24, the analog operation circuit includes a voltage controlled current source 52, voltage controlled resistive device 53, and capacitor 55. As an operand value Xi, a voltage value which monotonically increases over time is input to the voltage controlled current source 52 as a control voltage.

Figure 26:
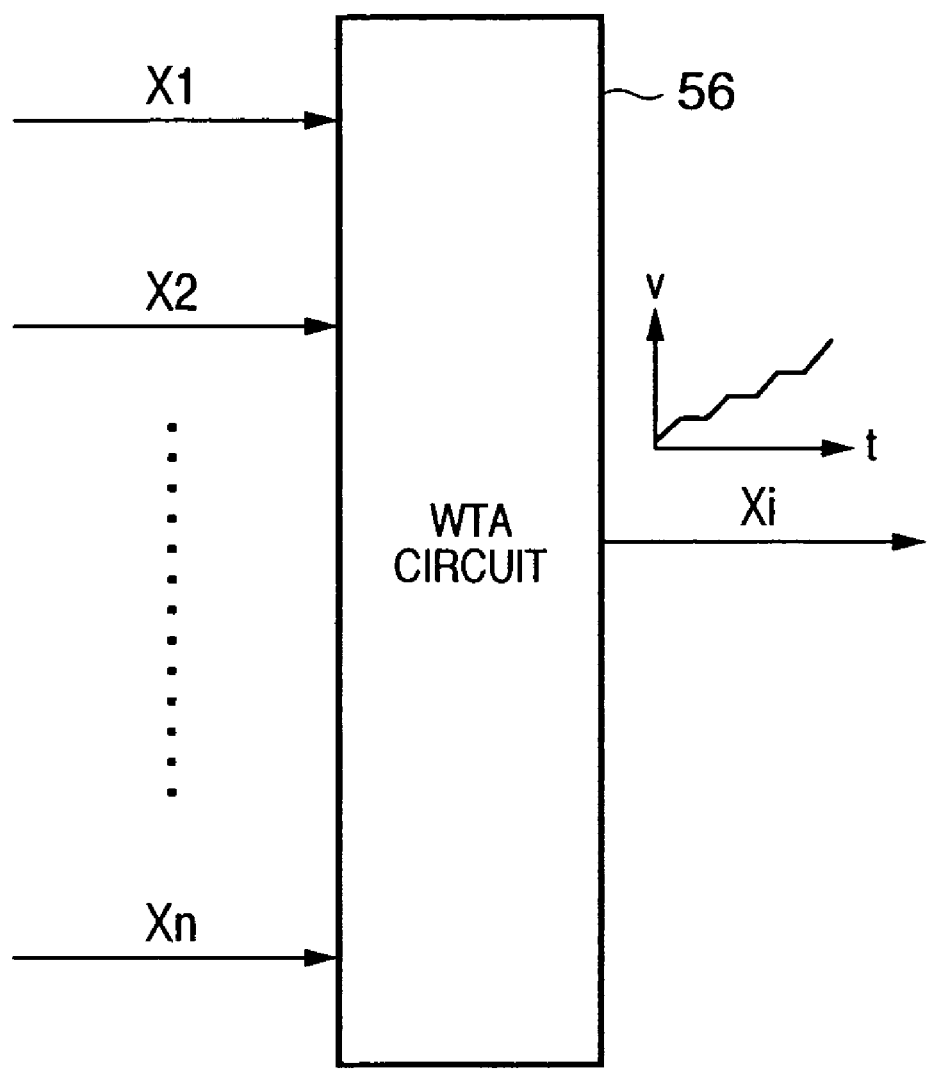
FIG. 26 is a block diagram showing an arrangement example of a ramp generation circuit according to the fourth embodiment.

The voltage value input here, which monotonically increases over time, is generated by causing a WTA circuit 56 to output the voltage values corresponding to the operand values Xi in descending order of magnitude as continuous analog voltage value, as shown in FIG. 26. The voltage value which monotonically increases over time may be generated by using a memory circuit and a ramp generation circuit, as in the third embodiment. In this case, the input value holding circuit and sorting circuit include digital circuits, as in the third embodiment.

In this case, the operand value Xi may be input to the input value holding circuit as a PWM signal. The PWM signal input processing steps in this case are the same as in the first embodiment, and a description thereof will be omitted.

Figure 25:
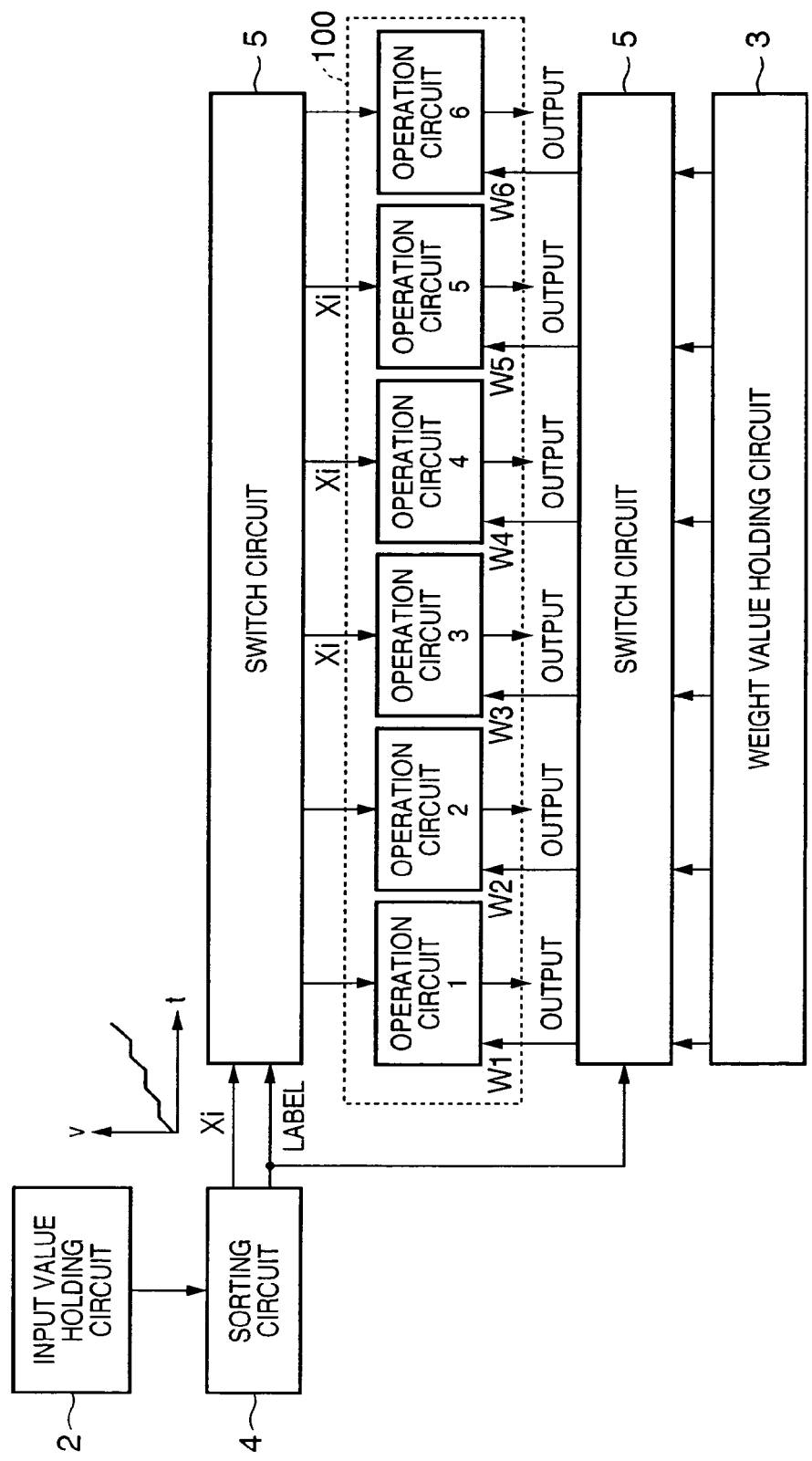
FIG. 25 is a block diagram showing an example of the overall arrangement of a product-sum operation circuit according to the fourth embodiment.

Subsequently, as shown in FIG. 25, the voltage value output from the WTA circuit 56 (sorting circuit 4), which monotonically increases over time, is input to an operation unit 100 through a switch circuit 5. In the analog operation circuit, the monotonically increasing voltage value is referred to at a certain timing. Accordingly, as described in the second or third embodiment, voltage values corresponding to the operand values Xi are input in descending order of magnitude as the control voltage of the voltage controlled current source 52 of the analog operation circuit corresponding to the label. The voltage controlled current source 52 may be formed by using the saturation characteristic of a MOS transistor or may have a differential structure.

An analog voltage value corresponding to an operand value Wi is input to the voltage controlled resistive device 53 of the analog operation circuit as a control voltage; The voltage controlled resistive device 53 indicates a predetermined resistance value R in accordance with the input analog voltage value. The voltage controlled resistive device 53 may be formed by using the linear characteristic of a MOS transistor or may have a differential structure.

Subsequently, a current I of the voltage controlled current source 52 determined by the analog voltage value corresponding to the operand value Xi referred to at a predetermined operation timing flows to the voltage controlled resistive device 53 (the resistance value at this time is R) determined by the analog voltage value corresponding to the operand value Wi. Then, an operation result of Xi×Wi is observed as a voltage value corresponding to I×R in the node shown in FIG. 13. The voltage of the node is further input to a voltage controlled current source 54 as a control voltage. Accordingly, a current i determined by I×R flows to the capacitor.

The voltage controlled current source 54 may be formed by using the saturation characteristic of a MOS transistor or may have a differential structure. When the switching interval of the switch circuit 5 is set to a predetermined time, charges corresponding to I×R×(switching interval) can be accumulated in the capacitor 55.

When the above-described operation is repeated, the accumulation result is held in the capacitor 55 as a charge amount.

In this way, the same operation as in the second and third embodiments can be performed by the product-sum operation circuit shown in FIG. 25. In this embodiment, the analog voltage corresponding to the operand value Xi is a voltage value which monotonically increases over time. Depending on the purpose of operation, a voltage value which monotonically decreases over time may be used.

The analog voltage value corresponding to the operand value Xi is input to a predetermined operation circuit by switching the switch circuit 5 in correspondence with the label of the operand value Xi, as in the second and third embodiments. In addition, the operation processing is not executed in operation circuit 1 to which no operand value Xi is input, as in the second and third embodiments.

In this embodiment, the analog voltage value corresponding to the operand value Wi is switched by the switch circuit 5 in accordance with the label of the operand value Xi and input to the predetermined operation circuit determined by the label, like the operand value Xi. As a method different from this embodiment, the predetermined operation circuit to which the analog voltage value corresponding to the operand value Wi should be input may be set in advance independently of the label of the operand value Xi, as in the second and third embodiments.

FIFTH EMBODIMENT

Figure 27:
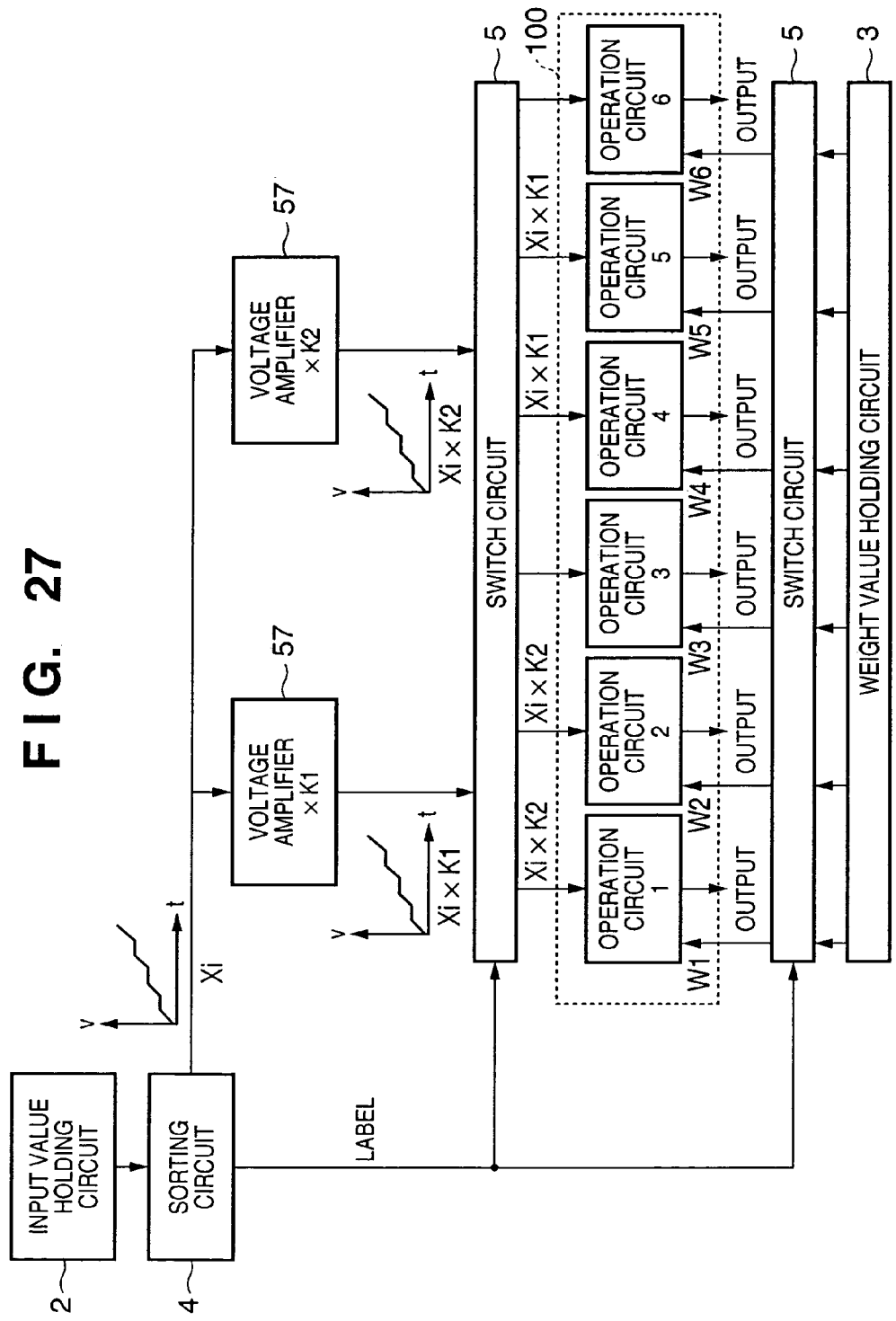
FIG. 27 is a block diagram showing an example of the overall arrangement of a product-sum operation circuit according to the fifth embodiment.

FIG. 27 shows the arrangement of this embodiment. This embodiment is different from the third or fourth embodiment in that the analog voltage value described in the third or fourth embodiment, which monotonically increases over time, is multiplied by a coefficient Ki so that an operation of multiplying an operand value Xi by the predetermined coefficient Ki can be executed.

In this embodiment, only points different from the third or fourth embodiment will be explained. The remaining points are the same as in the third or fourth embodiment, and a description thereof will be omitted.

As shown in FIG. 27, that the analog voltage value which monotonically increases is multiplied by the coefficient Ki means that a voltage value (i.e., the operand value Xi) referred to at a predetermined operation timing is multiplied by the predetermined coefficient Ki. Hence, when the analog voltage value input to operation circuit 1, which monotonically increases, is multiplied by the coefficient Ki, multiplication of three terms Ki×Xi×Wi can be operated.

As shown in FIG. 27, when analog voltage values multiplied by the coefficients Ki with different values are input in parallel, multiplication of three different terms can be operated in parallel in respective operation circuits 1. To change the coefficient Ki corresponding to each monotonically increasing analog voltage value, voltage amplifiers 57 corresponding to the coefficients Ki are arranged at the subsequent stage of a sorting circuit 4 (a WTA circuit or a ramp generation circuit). In the example shown in FIG. 27, the voltage amplifiers 57 are arranged at the subsequent stage of a WTA circuit.

When the voltage amplifiers 57 are arranged at the subsequent stage of a ramp generation circuit, the voltage amplifiers 57 corresponding to the coefficients Ki are arranged for a monotonically increasing analog voltage value output from a ramp generation circuit 44 in FIG. 21, as shown in FIG. 21. In this embodiment, an analog voltage value which monotonically increases is used. The same operation as described above can be executed even when an analog voltage value which monotonically decreases is used.

The analog voltage value corresponding to the operand value Xi×coefficient Ki, which monotonically increases, is input to a predetermined operation circuit by switching a switch circuit 5 in correspondence with the label of the operand value Xi, as in the third and fourth embodiments.

In this embodiment, the analog voltage value corresponding to an operand value Wi is switched by the switch circuit 5 in accordance with the label of the operand value Xi and input to the predetermined operation circuit determined by the label, like the operand value Xi. As a method different from this embodiment, the predetermined operation circuit to which the analog voltage value corresponding to the operand value Wi should be input may be set in advance independently of the label of the operand value Xi, as in the third and fourth embodiments. In this embodiment, the case in which the operand value Xi is input to an input value holding circuit 2 as a PWM signal is the same as in the third and fourth embodiments.

SIXTH EMBODIMENT

The sixth embodiment will be described with reference to FIGS. 28 and 29. This embodiment is different from the third or fourth embodiment in that the analog voltage value described in the third or fourth embodiment, which monotonically increases over time, is multiplied by a coefficient Ki so that an operation of multiplying an operand value Xi by the predetermined coefficient Ki can be executed.

In this embodiment, only points different from the third or fourth embodiment will be explained. The remaining points are the same as in the third or fourth embodiment, and a description thereof will be omitted.

Figure 28:
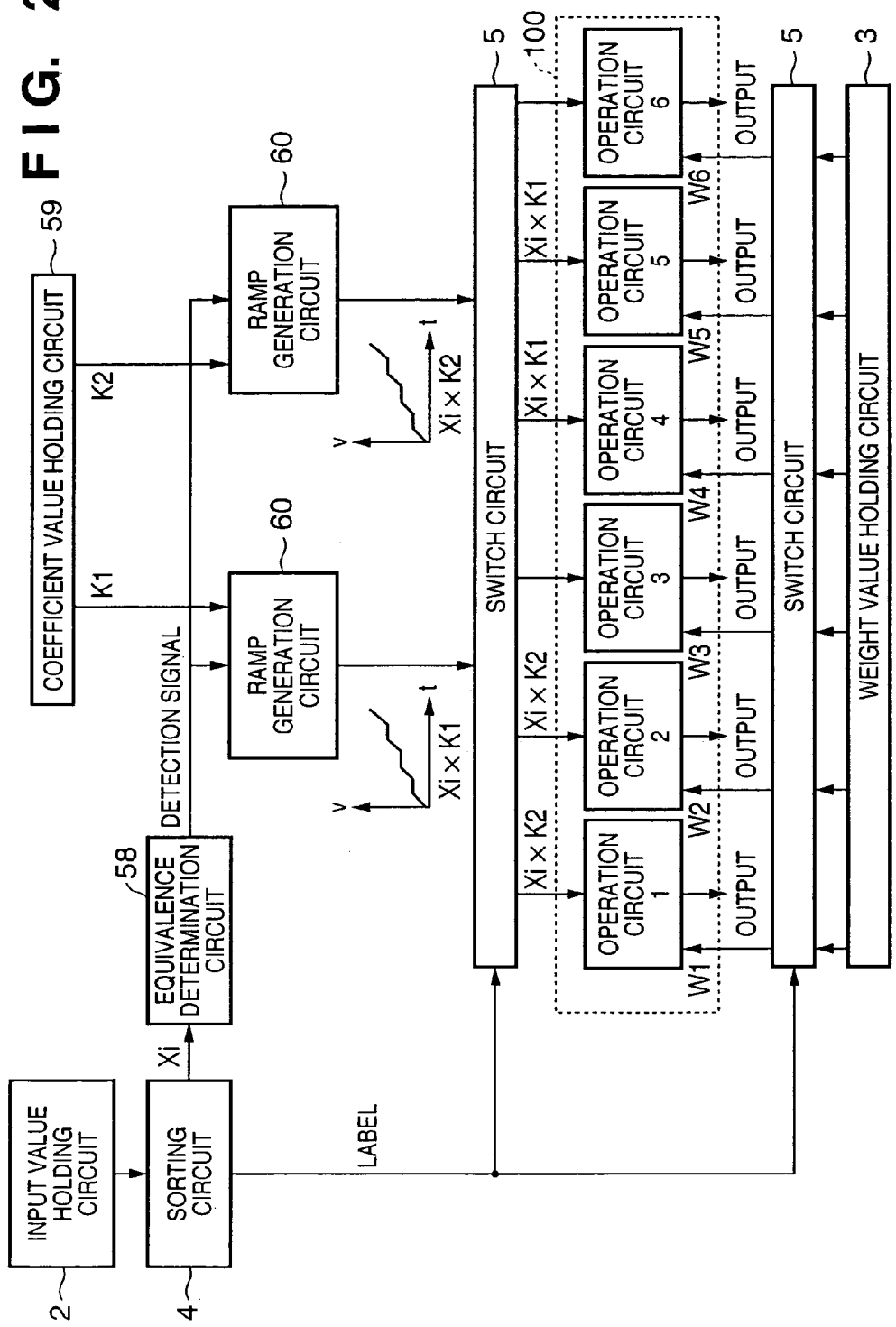
FIG. 28 is a block diagram showing an example of the overall arrangement of a product-sum operation circuit according to the sixth embodiment.
Figure 29:
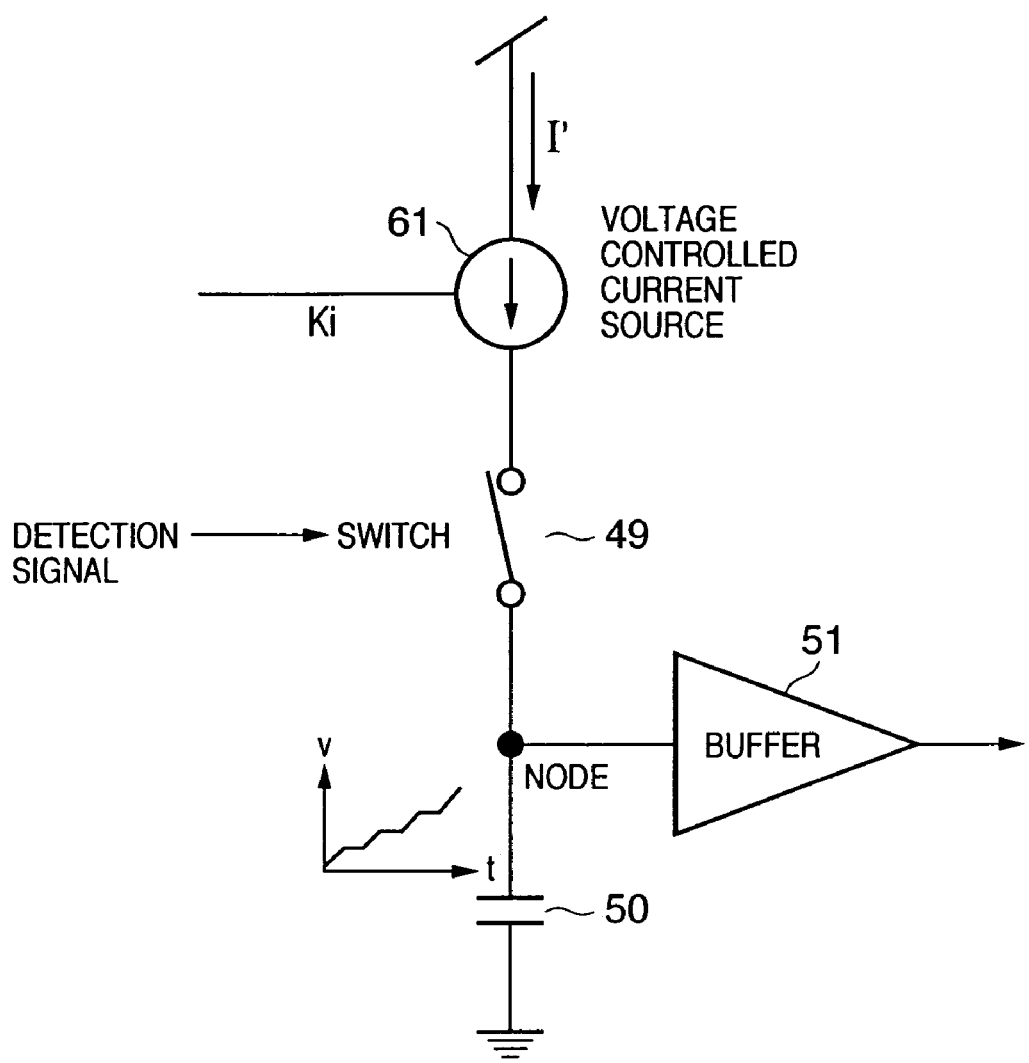
FIG. 29 is a block diagram showing an arrangement example of a ramp generation circuit according to the sixth embodiment.

Referring to FIG. 28, an associative memory is used as a sorting circuit 4, as in the first embodiment, to sort the operand values Xi in descending order of magnitude. An equivalence determination circuit 58 related to the operand values Xi is connected to the subsequent stage of the associative memory. The equivalence determination circuit 58 incorporates a memory function such as a register and stores the value of the operand value Xi precedingly output from the associative memory.

When a next operand value Xi' output from the associative memory is input to the equivalence determination circuit 58, the equivalence determination circuit 58 compares the operand value Xi' input this time with the precedingly input operand value Xi. If the two operand values are different, a detection signal which turns on the switch of a ramp generation circuit 60 (to be described later) is output. If the two operand values equal, no detection signal is output. Hence, the switch of the ramp generation circuit 60 remains OFF.

The operation processing in operation circuit 1 is executed in the same way as in the third or fourth embodiment. The voltage value input to operation circuit 1, which monotonically increases over time, is generated by the ramp generation circuit shown in FIG. 29. In the ramp generation circuit 60, a voltage value corresponding to the coefficient Ki is supplied to a voltage controlled current source 61 as a control voltage. Accordingly, a predetermined current flows, and charges are accumulated in a capacitor 50.

A switch 49 of the ramp generation circuit 60 is turned on by the detection signal from the equivalence determination circuit 58, as described above. More specifically, when the output value from the associative memory equals the preceding output value, the ramp generation circuit 60 turns off the switch 49 to stop the charge accumulation operation in the capacitor 50. Only when the output value from the associative memory is different from the preceding output value, the switch 49 is turned on, and the voltage value of the node changes as indicated by V shown in FIG. 29.

At this time, when the voltage value corresponding to the coefficient Ki is appropriately set, the monotonically increasing voltage value can be multiplied by the coefficient Ki, as described in the fifth embodiment. When the voltage value is input to the analog operation circuit through a buffer 51, multiplication of three terms Ki×Xi×Wi can be operated, as in the fifth embodiment. The remaining operation processing is the same as in the third or fourth embodiment, and a description thereof will be omitted.

The voltage controlled current source 61 may be formed by using the saturation characteristic of a MOS transistor or may have a differential structure. The ramp generation circuit 60 may use any other circuit arrangement when it can realize the same function. In this embodiment, an analog voltage value which monotonically increases is used. However, the same operation as described above can be executed even when an analog voltage value which monotonically decreases is used.

The analog voltage value corresponding to the operand value Xi×coefficient Ki, which monotonically increases, is input to a predetermined operation circuit by switching the switch circuit 5 in correspondence with the label of the operand value Xi, as in the third and fourth embodiments. In this embodiment, the analog voltage value corresponding to an operand value Wi is switched by a switch circuit 5 in accordance with the label of the operand value Xi and input to a predetermined operation circuit determined by the label, like the operand value Xi. As a method different from this embodiment, the predetermined operation circuit to which the analog voltage value corresponding to the operand value Wi should be input may be set in advance independently of the label of the operand value Xi, as in the third and fourth embodiments.

The case in which the operand value Xi is input to an input value holding circuit 2 as a PWM signal is the same as in the third and fourth embodiments.

SEVENTH EMBODIMENT

The seventh embodiment will be described with reference to FIGS. 30 and 31. This embodiment has the same arrangement as the third embodiment except that outputs from a coefficient value holding circuit 59 are input to ramp generation circuits 62. In this embodiment, only points different from the third embodiment will be explained. The remaining points are the same as in the third embodiment, and a description thereof will be omitted.

Figure 30:
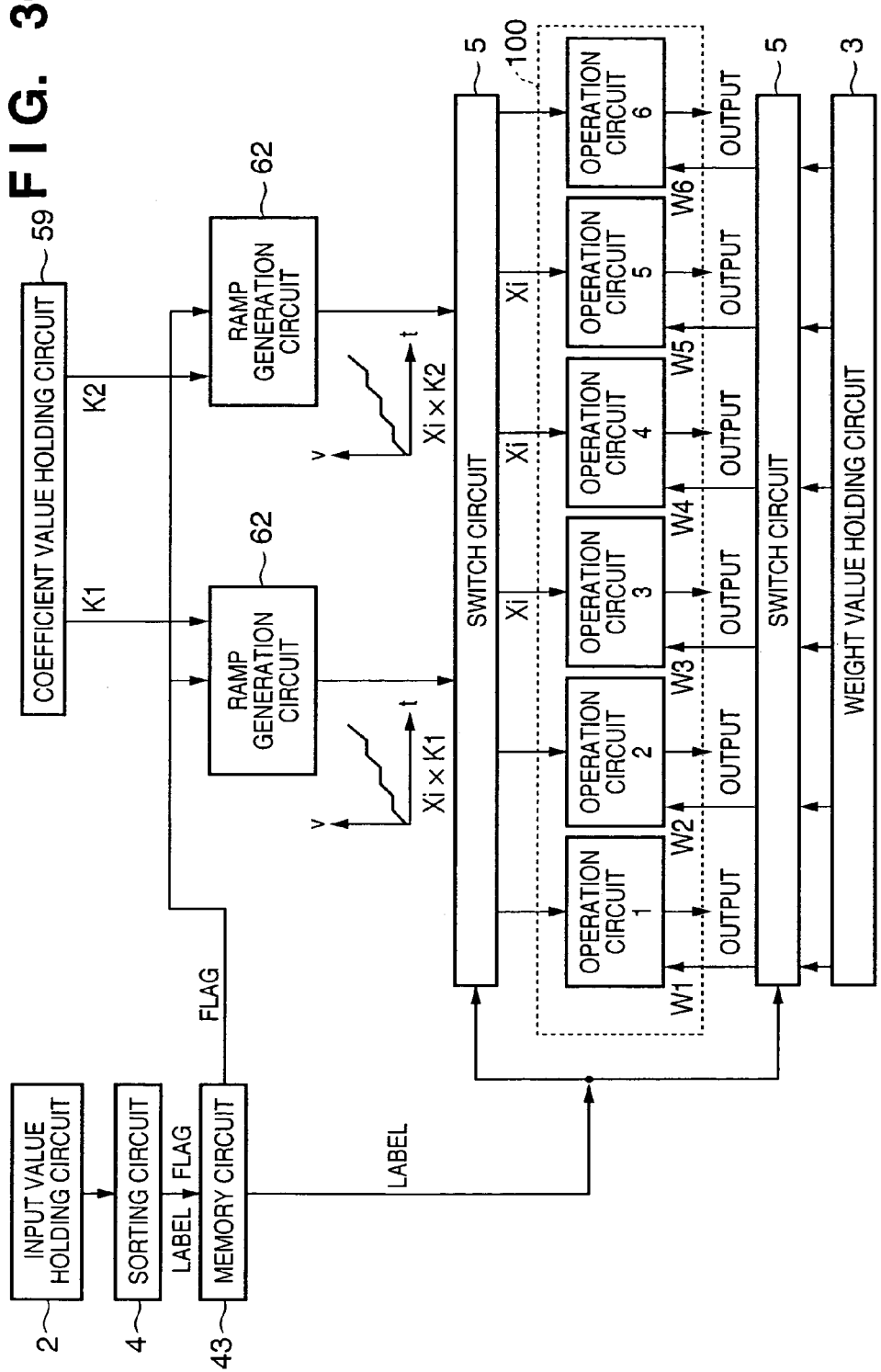
FIG. 30 is a block diagram showing an example of the overall arrangement of a product-sum operation circuit according to the seventh embodiment.
Figure 31:
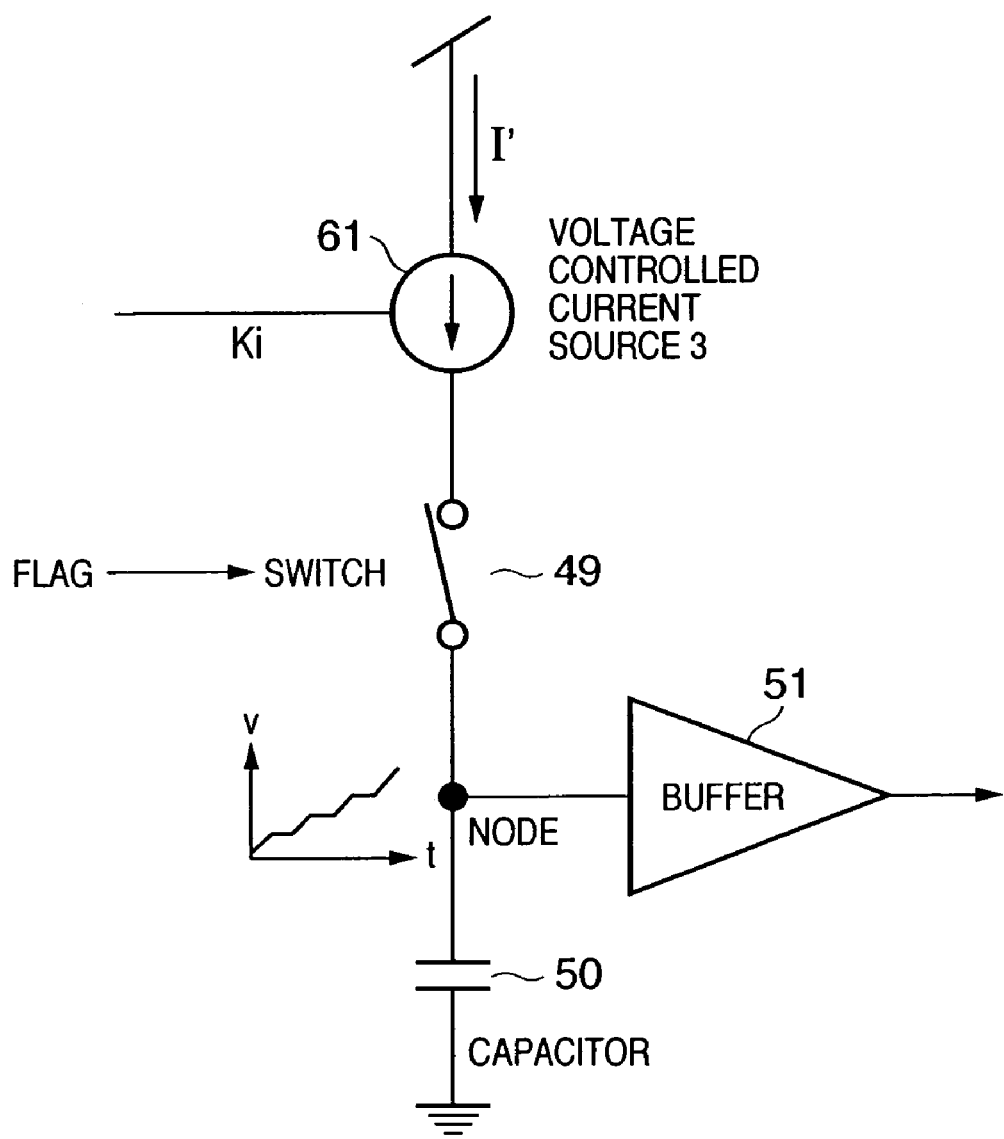
FIG. 31 is a block diagram showing an arrangement example of a ramp generation circuit according to the seventh embodiment.

As shown in FIG. 30, the coefficient value holding circuit 59 inputs voltage values corresponding to coefficients Ki to the ramp generation circuits 62. In each ramp generation circuit, as shown in FIG. 31, a voltage value corresponding to the coefficient Ki is supplied to the gate of a voltage controlled current source 61 so that a predetermined current corresponding to the coefficient Ki flows to the voltage controlled current source 61, unlike FIG. 23. That is, this embodiment is different from the third embodiment in that the current amount of the voltage controlled current source 61 can be controlled by the coefficient Ki held in the coefficient value holding circuit 59.

A change in current value of the voltage controlled current source 61 corresponds to a change in charge amount per unit time accumulated in a capacitor 50. This means that the gradient of the change in voltage value of the node with respect to time changes. This corresponds to multiplying a monotonically increasing voltage value by the coefficient Ki, as described in the fifth or sixth embodiment. When the voltage value is input to the analog operation circuit through a buffer 51, multiplication of three terms Ki×Xi×Wi can be operated, as in the fifth or sixth embodiment. In this embodiment, the case in which an operand value Xi is input to an input value holding circuit 2 as a PWM signal is the same as in the third embodiment.

EIGHTH EMBODIMENT

The eighth embodiment will be described with reference to FIGS. 32 to 35B.

Figure 32:
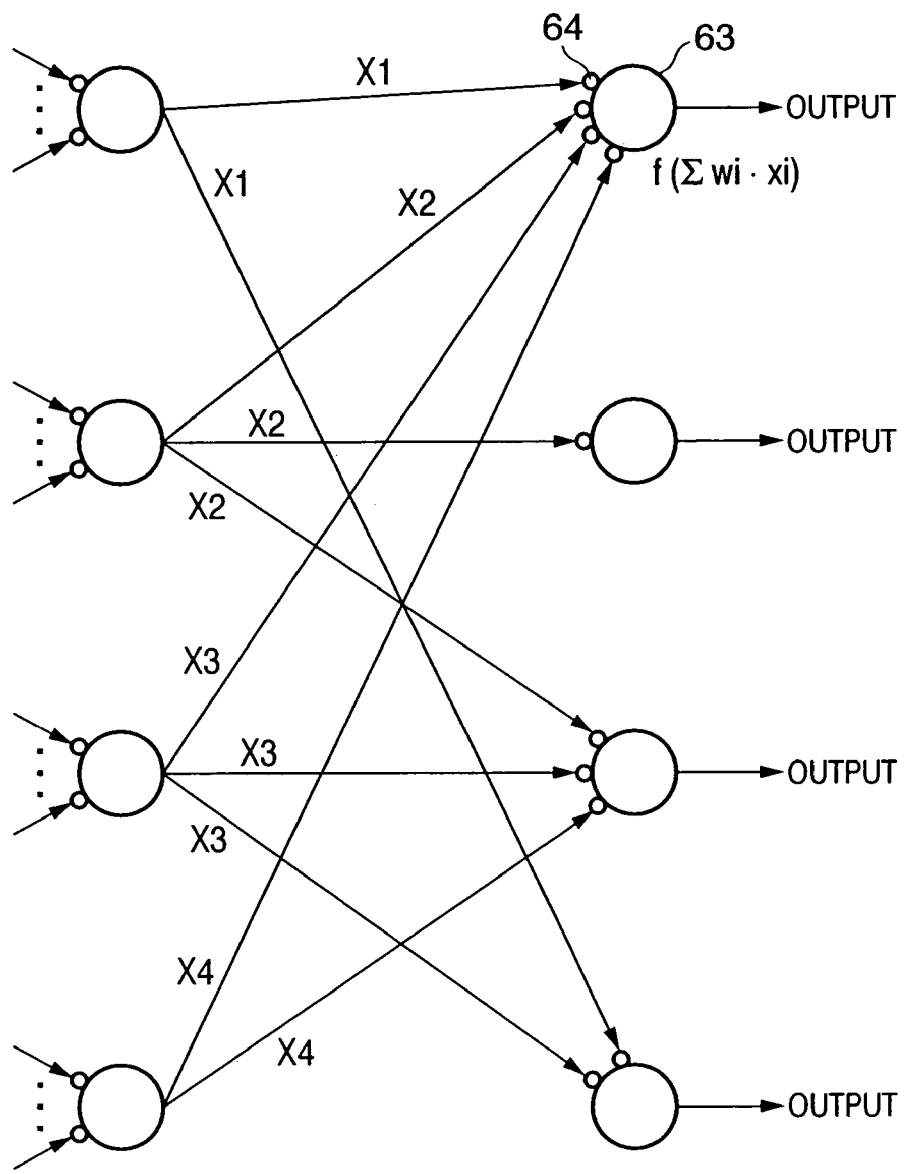
FIG. 32 is a view showing a neural network model.
Figure 33A:
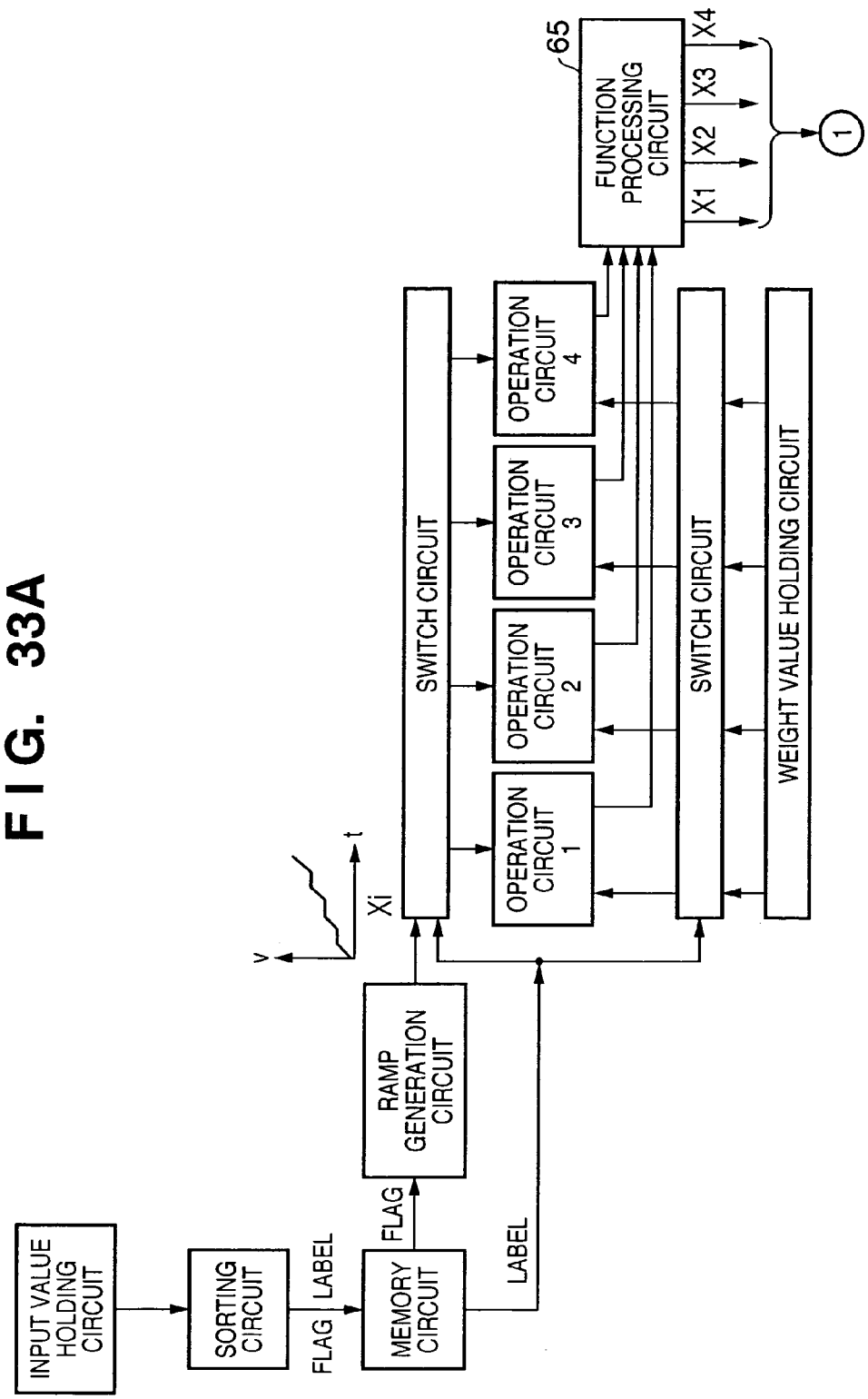
FIGS. 33A and 33B are block diagrams showing an example of the overall arrangement of a product-sum operation circuit according to the eighth embodiment.
Figure 33B:
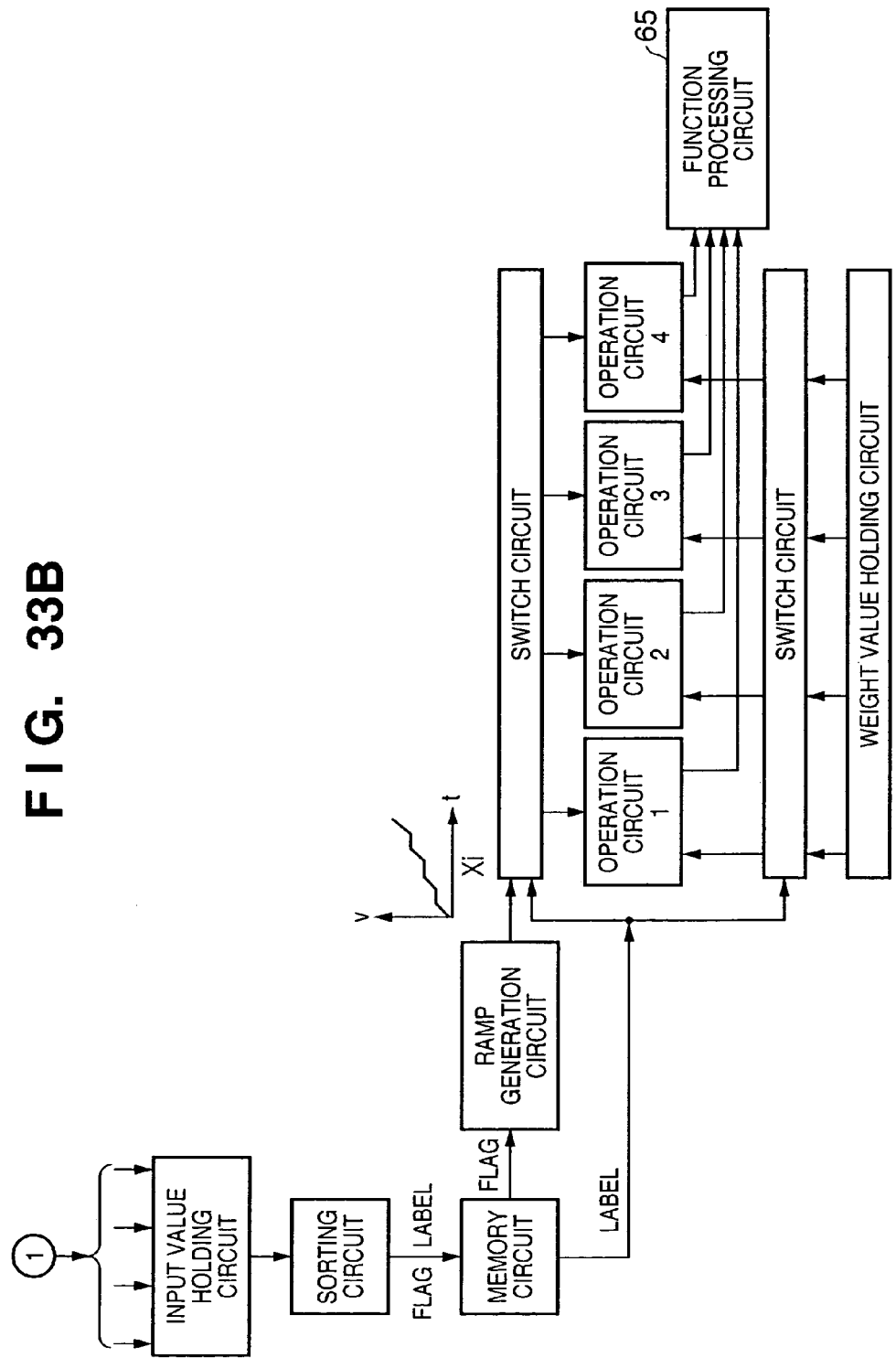

FIG. 32 shows a neural network model according to this embodiment. FIGS. 33A and 33B show an arrangement example of an operation processing circuit when the product-sum operation circuit described in the first, second, third, and fourth embodiments is applied to the neural network of this embodiment (FIGS. 33A and 33B show a case in which the product-sum operation circuit described in the third embodiment is applied). As shown in FIGS. 33A and 33B, the processing circuits of the neural network according to this embodiment include the processing circuits by the product-sum operation circuit described in the first, second, third, and fourth embodiments.

As shown in FIG. 32, as the model of a neuron element in the neural network, generally, a neuron element 63 weights the output values from a plurality of neuron elements at the preceding stage by a synaptic weight 64 and calculates the sum of the output values to determine the internal state value of the neuron element 63. The neuron element circuit according to this embodiment uses, as the model of the neuron element, the operation processing circuit described in the first, second, third, or fourth embodiment.

More specifically, an operand value Xi described in the first, second, third, or fourth embodiment corresponds to the output value from the neuron element at the preceding stage, and an operand value Wi corresponds to the synaptic weight value 64 to determine the internal state value of the neuron element 63.

Figure 34:
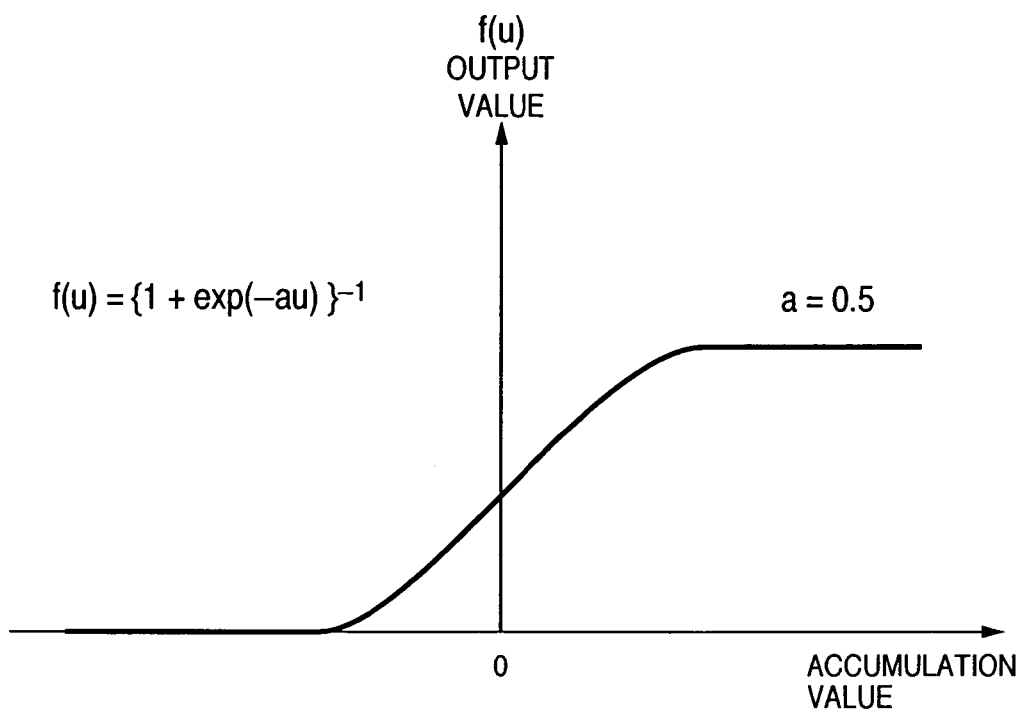
FIG. 34 is a view showing a sigmoid function.

Subsequently, as shown in FIGS. 33A and 33B, the accumulation value calculated by each operation circuit is input to a function processing circuit 65 which executes processing function processing. The function processing circuit 65 may execute either nonlinear function processing or linear function processing in accordance with the purpose. In this embodiment, as an example, a processing circuit which executes sigmoid conversion shown in FIG. 34 is used.

The actual circuit arrangement of the function processing circuit 65 can be implemented by a lookup table for a digital circuit or a comparator for an analog circuit.

As for the function processing, the function processing circuit 65 may be connected to another portion when it executes processing for the accumulation result calculated by operation circuit 1. Various circuit arrangements are proposed for the function processing circuit 65. However, they are not the gist of the present invention, and a description thereof will be omitted. Subsequently, the value (corresponding to the operand value Xi in the next layer) as the result of sigmoid conversion by the function processing circuit 65 is held in an input holding circuit corresponding to the next layer. In this case, the label of the value (corresponding to the operand value Xi in the next layer) is also held simultaneously.

By repeating the above-described operation processing, the operation processing in the neural network shown in FIG. 32 can be realized. In this example, the method described in the first, second, third, and fourth embodiments is used as the product-sum operation method. Hence, a neural network circuit having the effect described in the first, second, third, and fourth embodiments can be formed.

In addition, for input/output between the neuron elements (between the product-sum operation circuits), the operand value Xi can be input to the neuron element circuit (product-sum operation circuit) at the subsequent stage as a PWM signal, as in the first, second, third, and fourth embodiments.

Figure 35A:
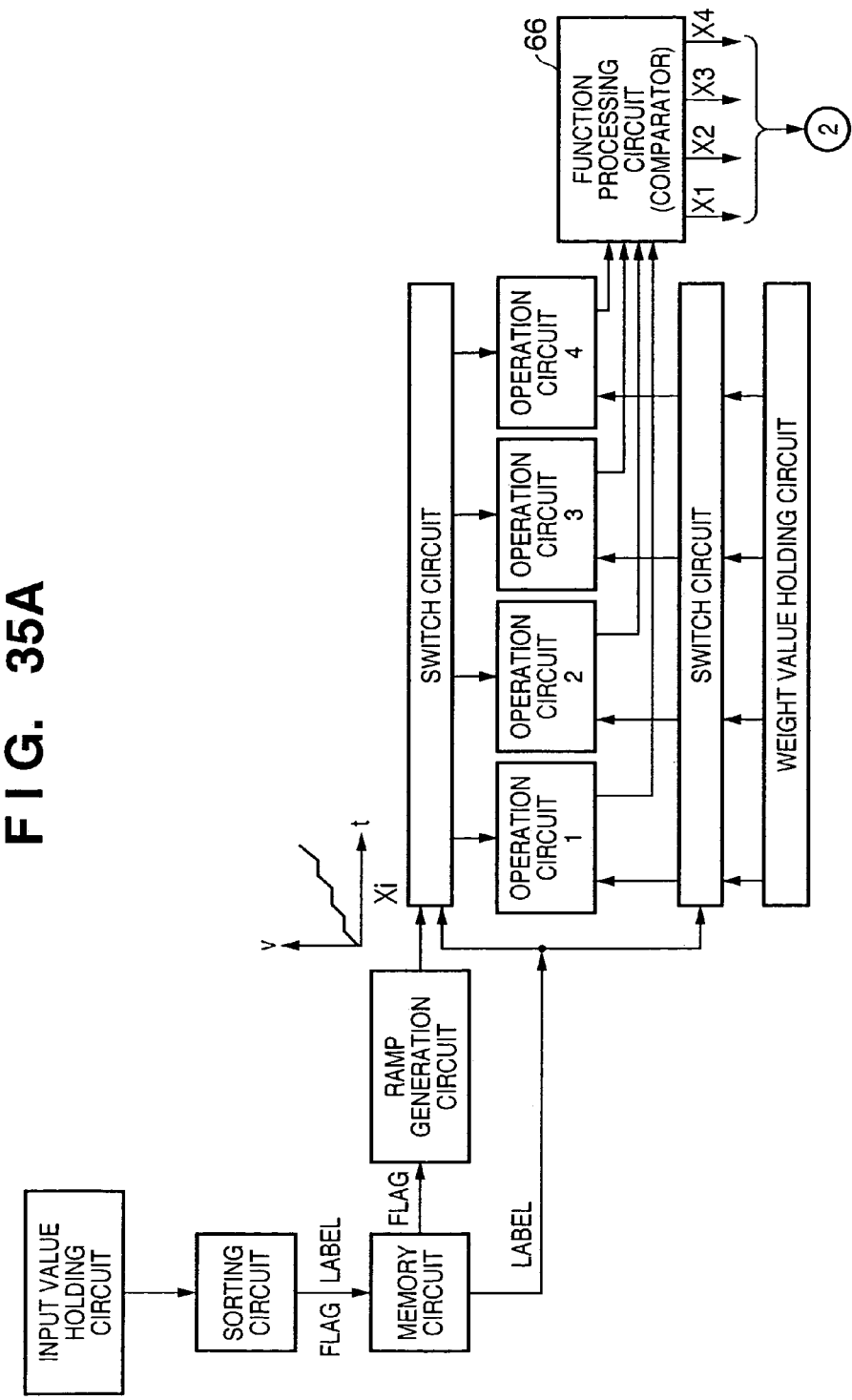
FIGS. 35A and 35B are block diagrams showing another example of the overall arrangement of the product-sum operation circuit according to the eighth embodiment.
Figure 35B:
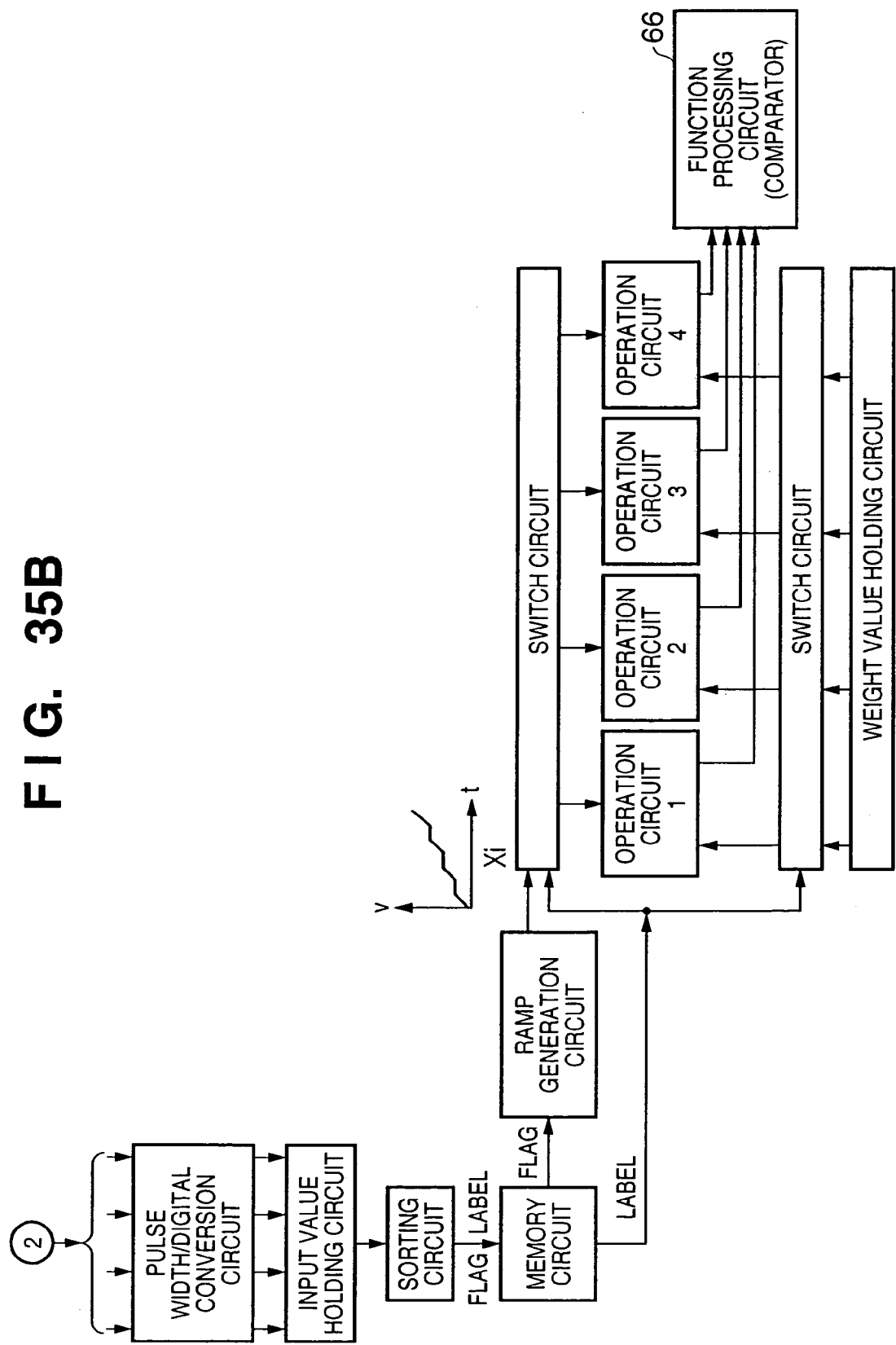

When the operation circuit is an analog operation circuit, as shown in FIGS. 35A and 35B, the charge amount accumulated in the capacitor is read out as a PWM signal by a comparator 66 and input to a pulse width/digital conversion circuit 67 at the subsequent stage. The PWM signal generation method by the comparator 66 is widely known, and a detailed description thereof will be omitted. When a ramp voltage waveform is input as a reference voltage, a PWM signal corresponding to the charge amount can be read out. When a nonlinear voltage waveform is input as a reference voltage, a PWM signal nonlinearly corresponding to the charge amount can be read out. That is, the comparator 66 can function as a function processing circuit. Alternatively, after the charge amount accumulated in the capacitor is read out by the comparator 66 as a PWM signal proportional to the charge amount and converted into a digital value by the pulse width/digital conversion circuit 67 at the subsequent stage, function processing may be executed by using a lookup table. The number of neuron elements and the number of layers in this embodiment do not limit the arrangement of the neural network according to the present invention. These numbers can be set to arbitrary numbers as needed.

NINTH EMBODIMENT

The ninth embodiment will be described with reference to FIGS. 36A and 36B. A neural network model according to this embodiment is the same as that described in the eighth embodiment except that a synaptic weight value is expressed by a product Wi×Ki of an operand value Wi and a coefficient Ki.

Figure 36A:
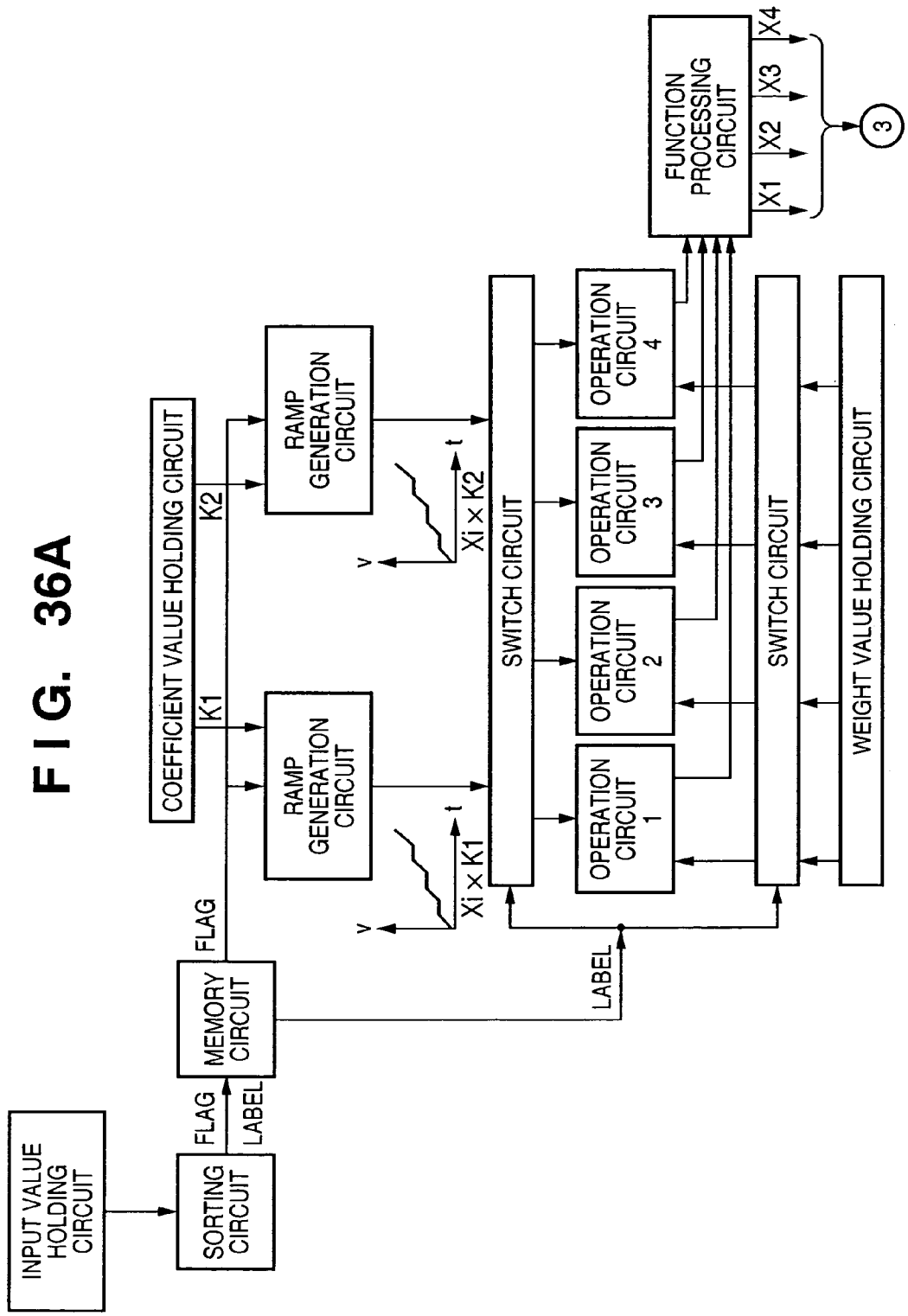
FIGS. 36A and 36B are block diagrams showing an example of the overall arrangement of a product-sum operation circuit according to the ninth embodiment.
Figure 36B:
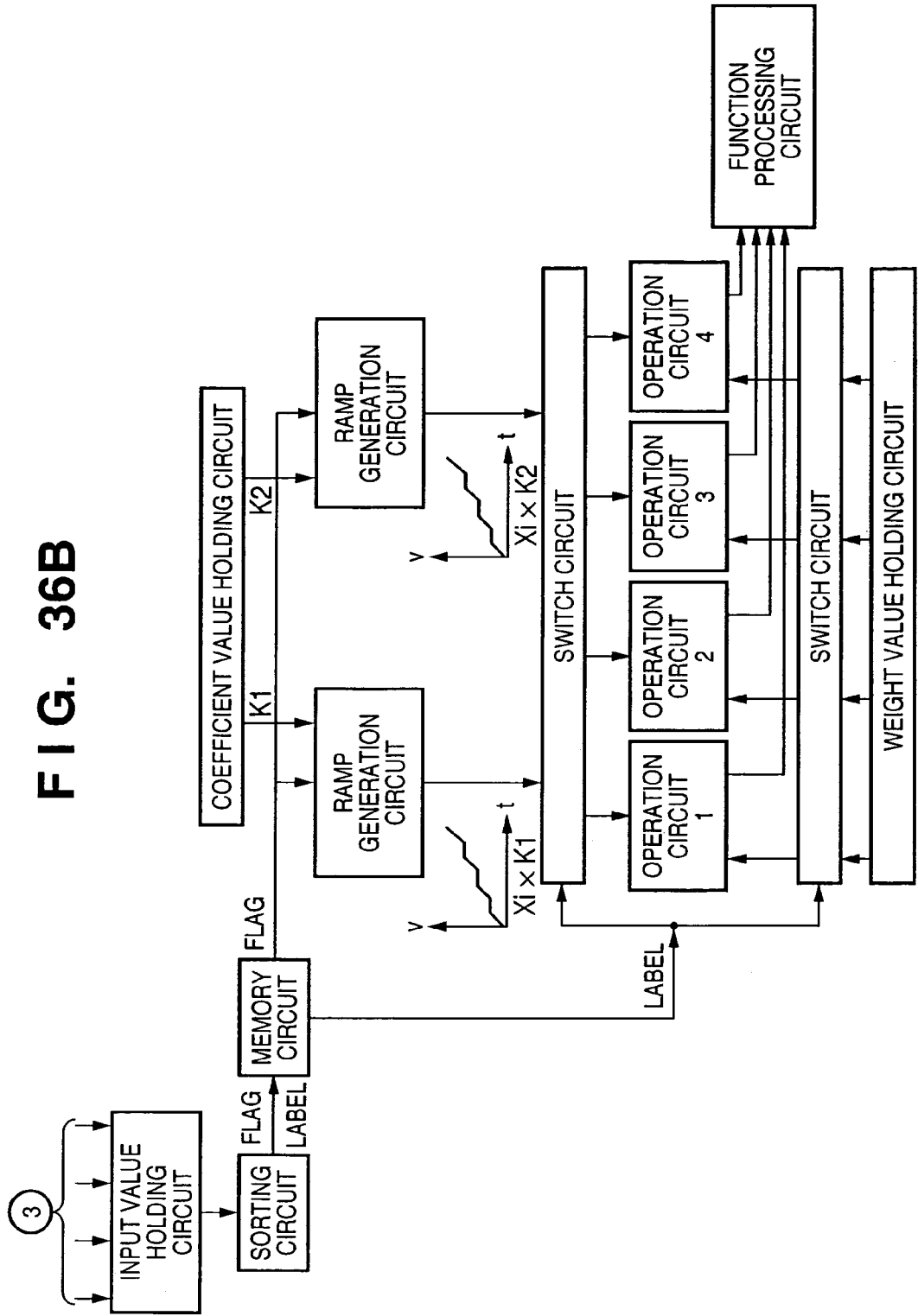

FIGS. 36A and 36B show the arrangement of an operation processing circuit when the product-sum operation circuit described in the fifth, sixth, or seventh embodiment is applied to the neural network according to this embodiment (FIGS. 36A and 36B show a circuit to which the product-sum operation circuit described in the seventh embodiment is applied). As the model of a neuron element in this embodiment, a neuron element weights the output values from a plurality of neuron elements at the preceding stage by a synaptic weight represented by Wi×Ki and calculates the sum of the output values to determine the internal state value of the neuron element.

The neuron element circuit according to this embodiment uses, as the model of the neuron element, the operation processing circuit described in the fifth, sixth, or seventh embodiment. More specifically, an operand value Xi described in the fifth, sixth, or seventh embodiment corresponds to the output value from the neuron element at the preceding stage, and the product of the operand value Wi and coefficient Ki corresponds to the synaptic weight value to determine the internal state value of the neuron element.

The function processing to be executed subsequently and input/holding of the operand value after the function processing are the same as in the eighth embodiment, and a description thereof will be omitted. For input/output between the neuron elements (between the layers), the operand value Xi can be input to the neuron element circuit at the subsequent stage as a PWM signal, as in the eighth embodiment, and a description thereof will be omitted.

In this embodiment, the method described in the fifth, sixth, or seventh embodiment is used as the product-sum operation method. Hence, a neural network circuit having the effect described in the fifth, sixth, or seventh embodiment can be formed. The number of neuron elements and the number of layers in this embodiment do not limit the arrangement of the neural network according to ht present invention. These numbers can be set to arbitrary numbers as needed.

10th EMBODIMENT

The operation processing of a neural network can generally be explained by the model shown in FIG. 32. In an actual operation, even when, of output values input from neurons at the preceding stage to a neuron element, only output values with a predetermined value or more are subjected to the operation processing to determine the internal state, the ultimate operation capability of the neural network rarely changes in many cases. In such a case, when operation processing for values smaller than the predetermined value is omitted, a neural network formed as a circuit is advantageous in power consumption or operation speed.

Figure 37:
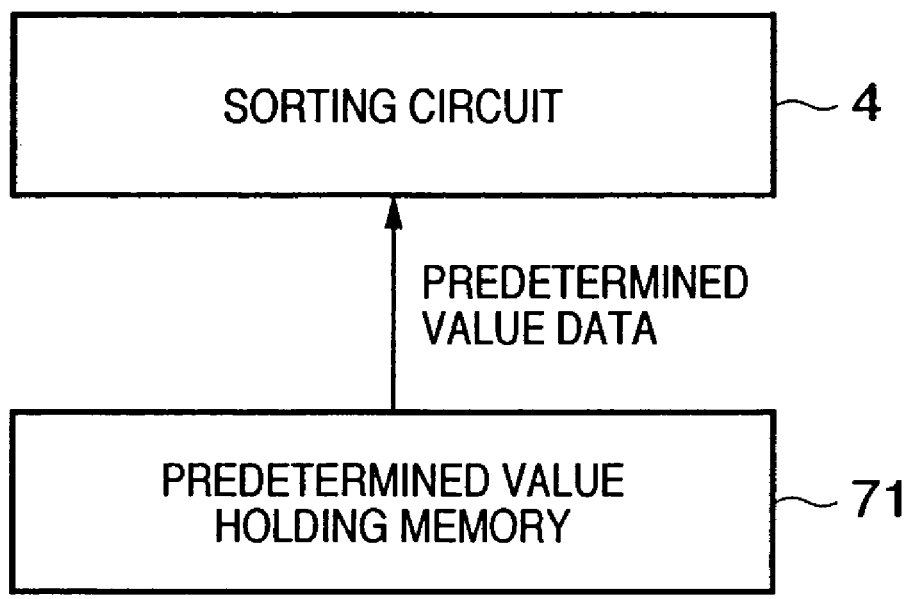
FIG. 37 is a block diagram showing a sorting circuit and predetermined value holding memory in a product-sum operation circuit according to the 10th embodiment.

In this embodiment, an operation circuit will be described in which for the first to seventh embodiments applied to a neural network in the eighth and ninth embodiments, operand values Xi are sorted in descending order of magnitude by a sorting circuit, and operation for the operand values Xi smaller than a predetermined value is omitted. FIG. 37 shows only a part where a predetermined value holding memory 71 is added to the sorting circuit 4 to realize the function of this embodiment in FIGS. 1, 5, 21, 25, 27, 28, 30, 33A, 33B, 35A, 35B, 36A, and 36B which show the operation processing arrangements described in the first to ninth embodiments. Hence, the arrangement is the same as those shown in FIGS. 1, 5, 21, 25, 27, 28, 30, 33A, 33B, 35A, 35B, 36A, and 36B except the portion shown in FIG. 37. More specifically, data related to a predetermined value is input from the predetermined value holding memory 71 to the sorting circuit 4. Sorting processing for the operand values Xi is ended when reaching the predetermined value.

When an associative memory is used as the sorting circuit, omission of the product-sum operation for the operand values Xi smaller than the predetermined value is realized by ending the processing when the search value is sequentially decreased in searching the contents in the associative memory, and the search value has reached the predetermined value. When a WTA circuit is used as the sorting circuit, the omission is realized by ending the processing when the reference voltage value has reached the predetermined value in sorting by the WTA circuit.

In this embodiment, the two examples of the circuit which omits the product-sum operation for the operand values Xi having values smaller than the predetermined value have been described. However, any other circuit and method can be used if they have the same effect as described above.

As described above, when the product-sum operation for the operand values Xi having values smaller than the predetermined value is omitted, the power consumption can be reduced, and the operation speed can be increased in the actual processing circuit.

11th EMBODIMENT

In some cases, the operation processing capability of a neural network increases when output values which are input from neurons at the preceding stage to a neuron element and are smaller than a predetermined value are regarded as a constant value and subjected to the operation instead of omitting the operation processing for them as in the 10th embodiment. In this embodiment, an operation circuit will be described in which operand values Xi are sorted and output in descending order of magnitude by a sorting circuit, and the operand values Xi smaller than a predetermined value are regarded as a constant value.

Figure 38:
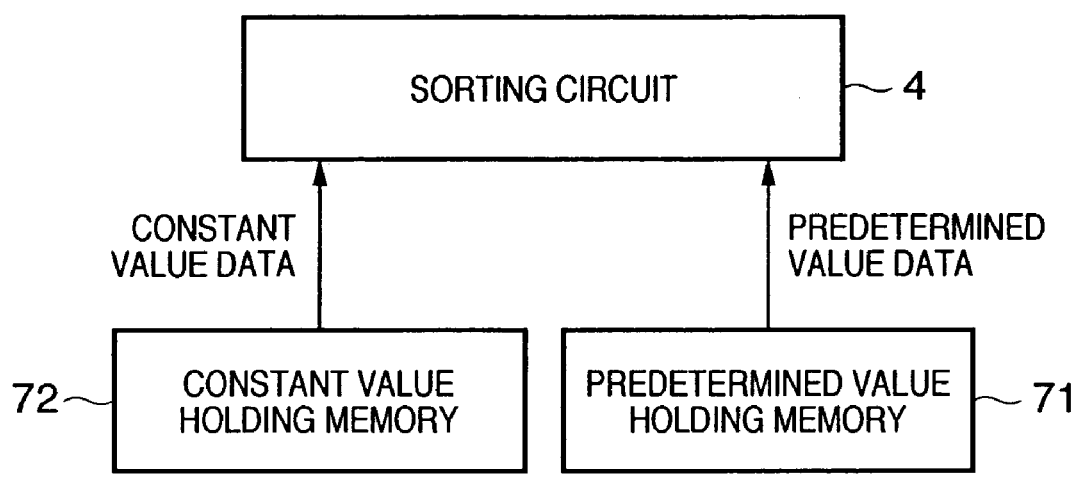
FIG. 38 is a block diagram showing a sorting circuit, constant value holding memory, and predetermined value holding memory in a product-sum operation circuit according to the 11th embodiment.

The arrangement shown in FIG. 38 is different from the 10th embodiment in that the above-described sorting circuit 4 shown in FIG. 38 is further added a constant value holding memory 72. Arrangements except the part shown in FIG. 38 are the same as those described in the 10th embodiment. More specifically, data related to a predetermined value is input from a predetermined value holding memory 71 to the sorting circuit 4. Sorting processing for the operand values Xi is ended when reaching the predetermined value.

In addition, data related to a constant value is input from the constant value holding memory 72 to the sorting circuit 4. The constant value is output as the operand value Xi. When an associative memory is used as the sorting circuit in the 10th embodiment, the circuit which operates the operand value Xi smaller than the predetermined value as a constant value can be implemented by outputting, as a preset constant value, the operand value Xi after reaching the predetermined value when the search value is sequentially decreased in searching the contents in the associative memory.

To do this, the preset constant value is prepared in another memory. Simultaneously as the operand value Xi reaches the predetermined value, processing by the associative memory is stopped, and the preset constant value is output from the memory. Any other circuit and method can be used if they can realize the same function as described above. When a WTA circuit is used as the sorting circuit in the 10th embodiment, the circuit can be implemented by outputting, as the present constant value, a voltage value corresponding to the operand value Xi after the reference voltage value reaches the predetermined value in sorting by the WTA circuit.

To do this, the preset constant value is prepared in another analog memory. Simultaneously as the operand value Xi reaches the predetermined value, processing by the WTA circuit is stopped, and the preset constant value is output from the analog memory. Any other circuit and method can be used if they can realize the same function as described above.

12th EMBODIMENT

The operation processing of a neural network can generally be explained by the model shown in FIG. 32. In an actual operation, even when, of output values input from neurons at the preceding stage to a neuron element, only output values corresponding to a predetermined ratio when counted from a large value are subjected to the operation processing to determine the internal state, the ultimate operation capability of the neural network rarely changes in many cases. In such a case, when operation processing for values except those of the predetermined ratio when counted from a large value is omitted, a neural network formed as a circuit is advantageous in power consumption or operation speed.

In this embodiment, an operation circuit will be described in which for the first to seventh embodiments applied to a neural network in the eighth and ninth embodiments, operand values Xi are sorted in descending order of magnitude by a sorting circuit, and operation for the operand values Xi except those corresponding to a predetermined ratio when counted from a large value is omitted.

Figure 39:
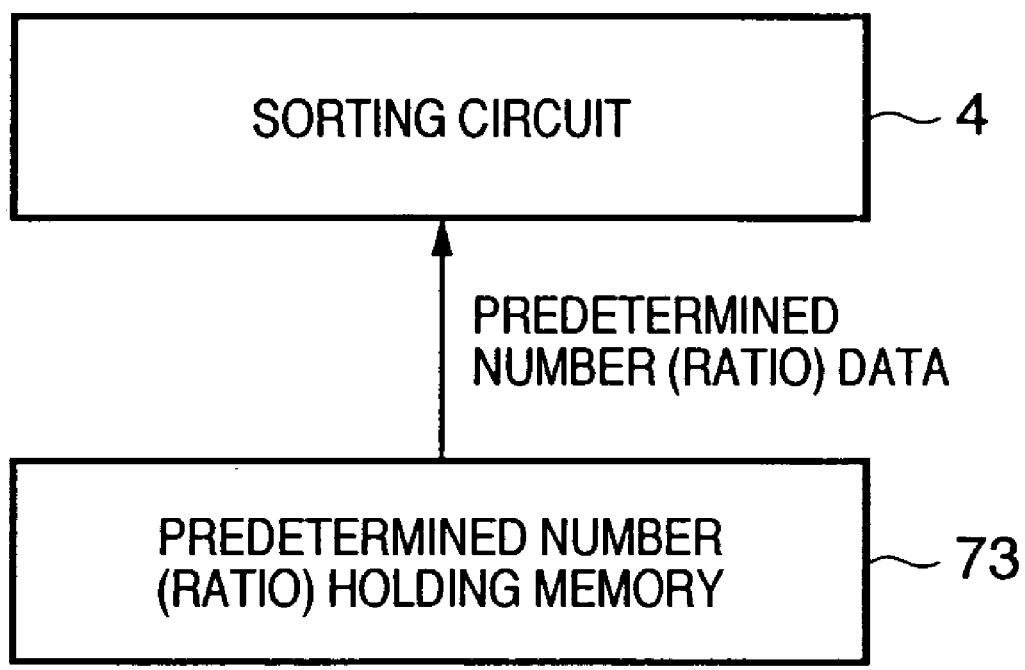
FIG. 39 is a block diagram showing a sorting circuit and predetermined value (ratio) holding memory in a product-sum operation circuit according to the 12th embodiment.

FIG. 39 shows only a part where a predetermined number (ratio) holding memory 73 is added to a sorting circuit 4 to realize the function of this embodiment in FIGS. 1, 5, 21, 25, 27, 28, 30, 33A, 33B, 35A, 35B, 36A, and 36B which show the operation processing arrangements described in the first to ninth embodiments. Hence, the arrangement is the same as those shown in FIGS. 1, 5, 21, 25, 27, 28, 30, 33A, 33B, 35A, 35B, 36A, and 36B except the portion shown in FIG. 39.

More specifically, data related to a predetermined number (ratio) is input from the predetermined number (ratio) holding memory 73 to the sorting circuit 4. Sorting processing for the operand values $X_i$ is ended when reaching the predetermined number (ratio).

When an associative memory is used as the sorting circuit, omission of the product-sum operation for the operand values $X_i$ except those corresponding to the predetermined ratio when counted from a large value is realized by ending the processing when the number of output operand values $X_i$ has reached the predetermined number (ratio) input from the predetermined number (ratio) holding memory 73 in searching the contents in the associative memory and sequentially decreasing the search value. When a WTA circuit is used as the sorting circuit, the omission is realized by ending the processing when the reference voltage value has reached a voltage value corresponding to the predetermined number (ratio) of the operand values $X_i$.

In this embodiment, the two examples of the circuit which omits the product-sum operation for the operand values $X_i$ except those corresponding to the predetermined ratio when counted from a large value have been described. However, any other circuit and method can be used if they have the same effect as described above.

As described above, when the product-sum operation for the operand values $X_i$ except those corresponding to the predetermined number (ratio) when counted from a large value is omitted, the power consumption can be reduced, and the operation speed can be increased in the actual processing circuit.

13th EMBODIMENT

In some cases, the operation processing capability of a neural network increases when of output values which are input from neurons at the preceding stage to a neuron element, output values except those corresponding to a predetermined ratio when counted from a large value are regarded as a constant value and subjected to the operation instead of omitting the operation processing for them as in the 12th embodiment. In this embodiment, an operation circuit will be described in which operand values $X_i$ are sorted in descending order of magnitude by a sorting circuit, and the operand values $X_i$ except those corresponding to a predetermined ratio when counted from a large value are regarded as a constant value in the 12th embodiment.

The arrangement shown in FIG. 40 is different from the 12th embodiment in that the above-described sorting circuit 4 shown in FIG. 39 is further added a constant value holding memory 74. Arrangements except the part shown in FIG. 40 are the same as those described in the 12th embodiment. More specifically, data related to a predetermined number (ratio) is input from a predetermined number (ratio) holding memory 73 to the sorting circuit 4. Sorting processing for the operand values $X_i$ is ended when reaching the predetermined number (ratio).

In addition, data related to a constant value is input from the constant value holding memory 74 to the sorting circuit 4. The constant value is output as the operand value $X_i$. When an associative memory is used as the sorting circuit, the method of operating the operand values $X_i$ except those corresponding to the predetermined ratio when counted from a large value as a constant value can be implemented by outputting, as the preset constant value, the operand value $X_i$ after the number of output operand values $X_i$ reaches the predetermined number (ratio) when the search value is sequentially decreased in searching the contents in the associative memory. To do this, the preset constant value is prepared in another memory. Simultaneously as the number of output operand values $X_i$ reaches the predetermined number (ratio), processing by the associative memory is stopped, and the preset constant value is output from the memory. Any other circuit and method can be used if they can realize the same function as described above.

When a WTA circuit is used as the sorting circuit, the circuit can be implemented by outputting, as the preset constant value, a voltage value corresponding to the operand value $X_i$ after the reference voltage value reaches a voltage value corresponding to the predetermined number (ratio) of operand values $X_i$ in sorting by the WTA circuit. To do this, the preset constant value is prepared in another analog memory. Simultaneously as the reference voltage value reaches the voltage value corresponding to the predetermined number (ratio) of operand values $X_i$, processing by the WTA circuit is stopped, and the preset constant value is output from the analog memory. Any other circuit and method can be used if they can realize the same function as described above.

14th EMBODIMENT

Figure 41A:
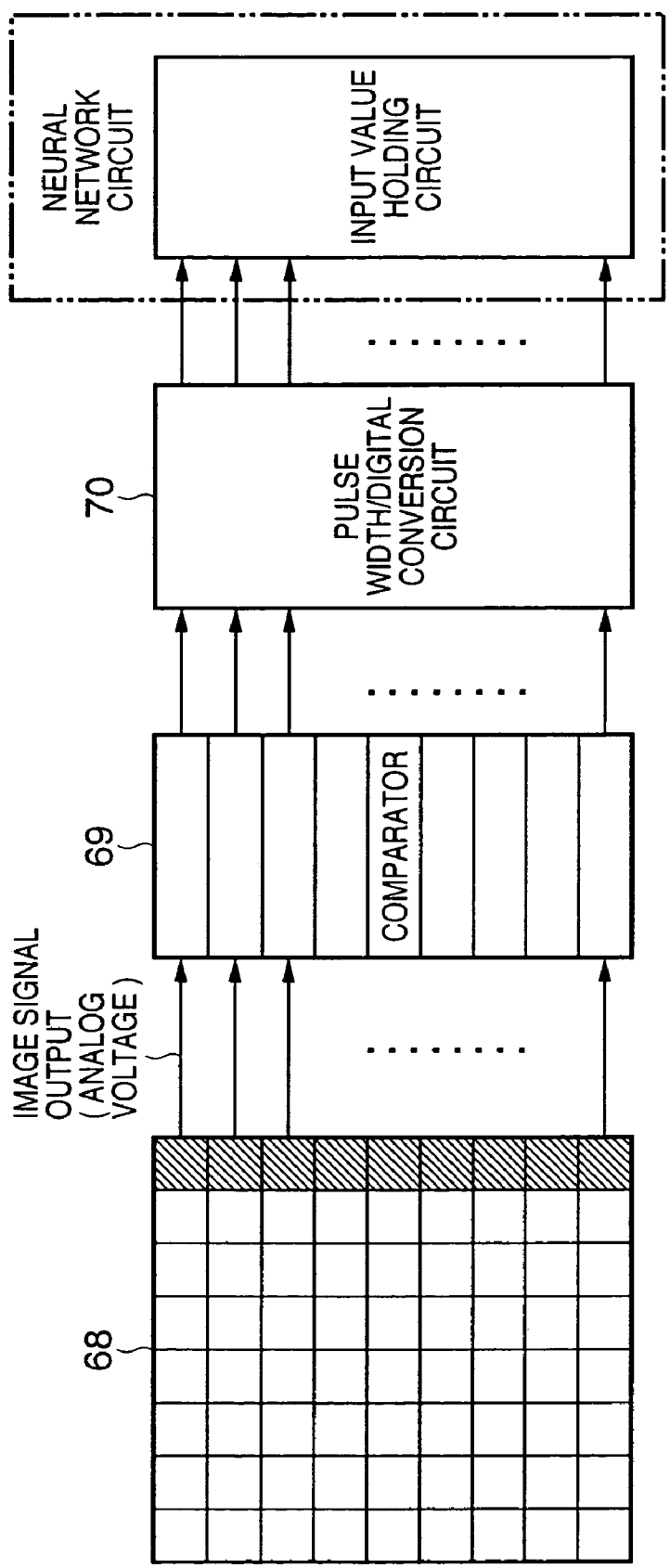
FIGS. 41A and 41B are block diagrams showing an arrangement example of a product-sum operation circuit which executes image processing according to the 14th embodiment.
Figure 41B:
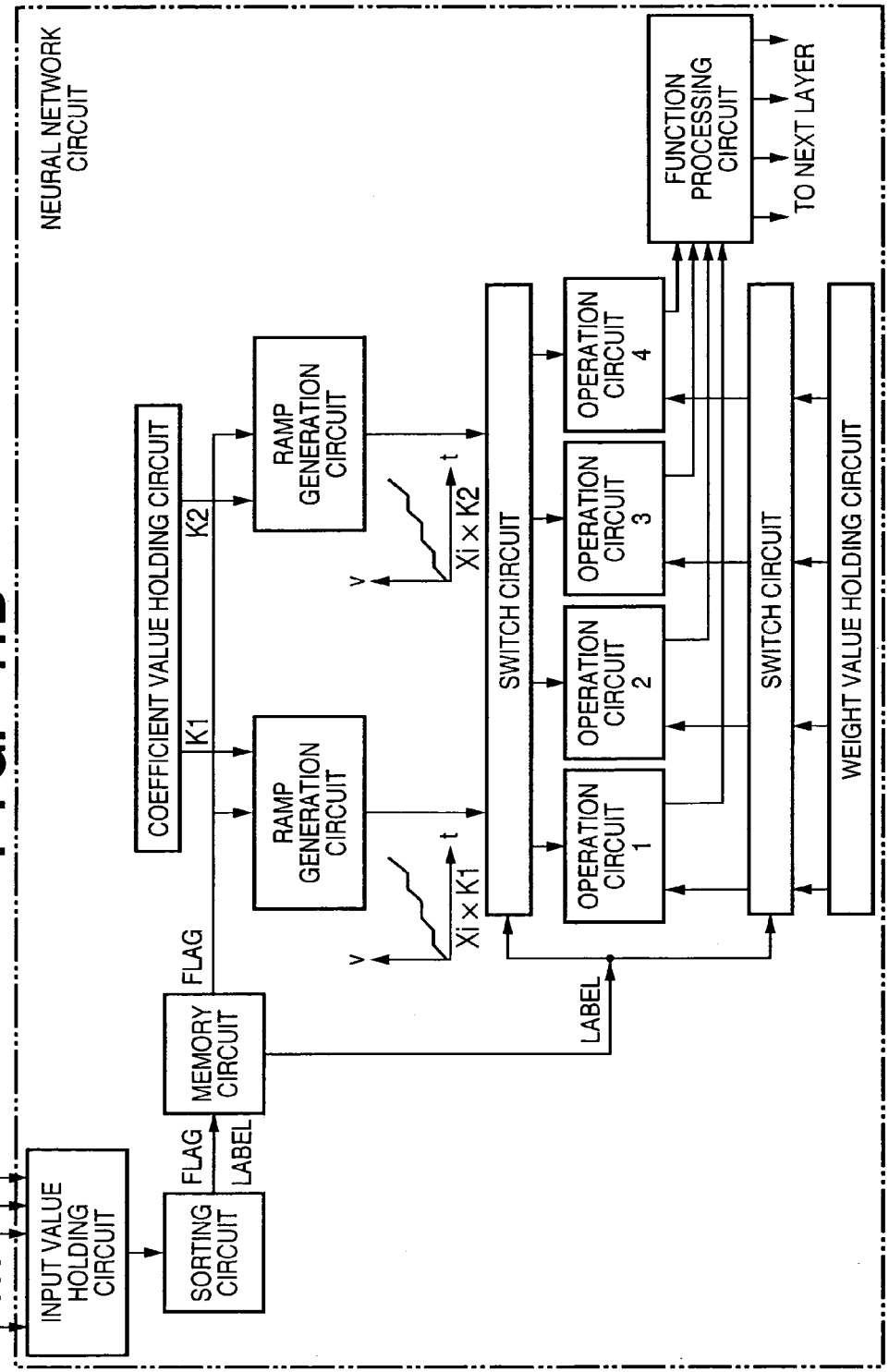

FIGS. 41A and 41B show an arrangement example of a product-sum operation circuit which executes image processing of the 14th embodiment. As shown in FIGS. 41A and 41B, as a characteristic feature, this product-sum operation circuit which executes image processing of the 14th embodiment includes the neural network circuit described in the eighth to 13th embodiments. FIGS. 41A and 41B show only the first stage of the hierarchical structure and does not illustrate the subsequent layers.

The signal input to the product-sum operation circuit is an image signal. More specifically, an object of the product-sum operation circuit according to this embodiment is to execute desired image processing (e.g., pattern detection and pattern recognition) by causing the neural network circuit to execute a predetermined operation for an input image signal.

The contents of image processing to be actually realized can be set by appropriately adjusting an operand value $W_i$ and coefficient value $K_i$ of the neural network circuit such that desired processing contents (e.g., pattern detection and pattern recognition) are realized. A detailed adjusting method is not the gist of the present invention, and a description thereof will be omitted.

In this embodiment, an image signal output from an image sensing device (e.g., a CCD or CMOS image sensor) corresponds to an operand value $X_i$ in the first to seventh embodiments. Hence, the operation processing executed for the image signal is the same as that executed for the operand value $X_i$ in the first to 13th embodiments. The image signal is input as an analog signal, digital signal, or PWM signal. Operation processing corresponding to each signal type corresponds to the signal type of the operand value $X_i$ described in the first to 13th embodiments. The operation processing is the same as in the embodiments, and a description thereof will be omitted.

Referring to FIGS. 41A and 41B, an image signal as an analog signal is converted into a PWM signal by a comparator 69, then converted into a digital value by a pulse width/digital conversion circuit 70, and input to the neural network circuit.

In this embodiment, the image sensing device is assumed to be a CCD or CMOS image sensor. Any other image sensing device can also be used without any problem. The number of image sensing devices, the number of neuron elements, and the number of layers in this embodiment do not limit the arrangement of the image signal processing circuit according to the present invention. These numbers can be set to arbitrary numbers as needed.

Figure 42:
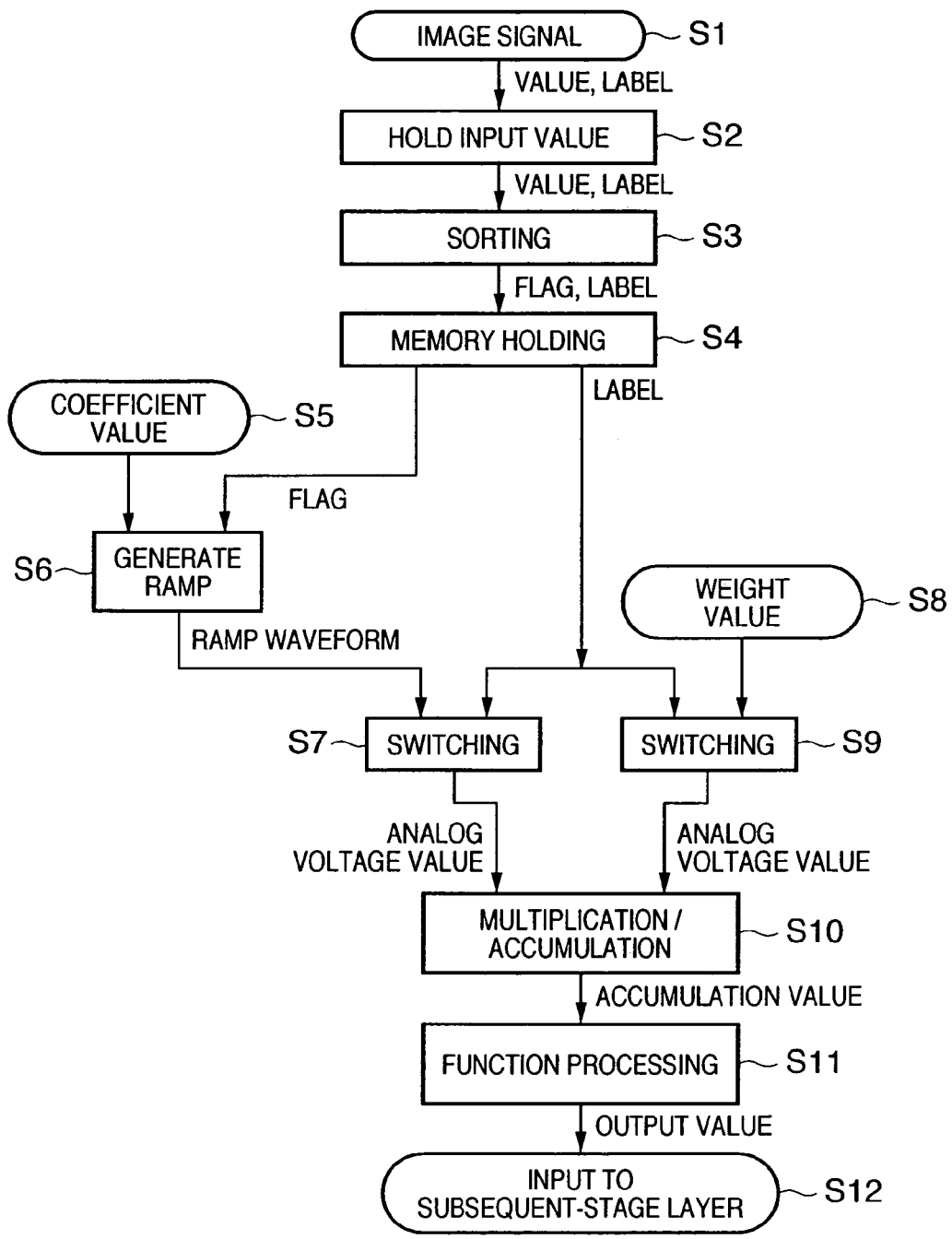
FIG. 42 is a flowchart showing operation processing in the 14th embodiment.
Figure 43:
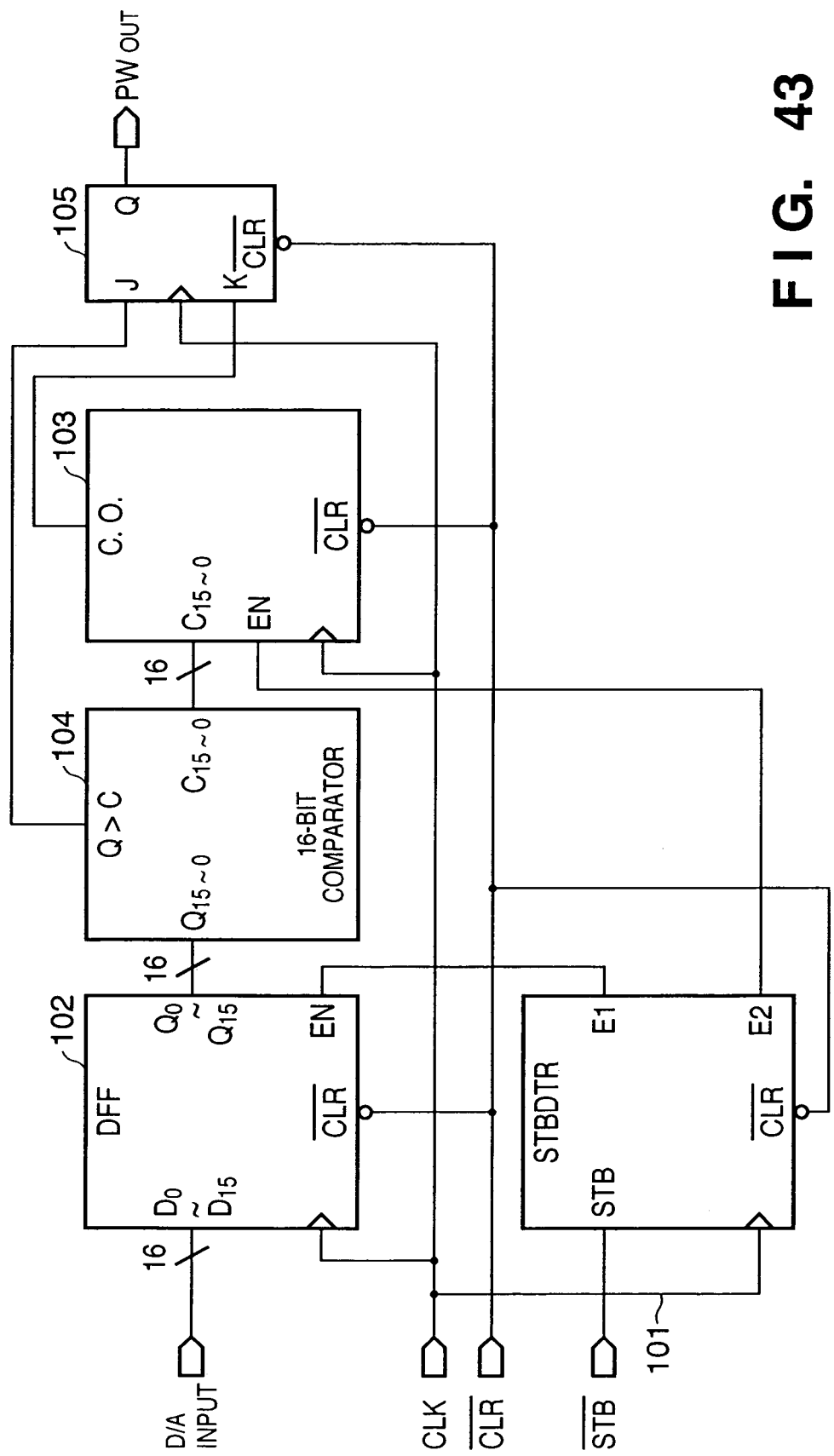
FIG. 43 is a block diagram showing an example of a conventional digital/pulse width conversion circuit.
Figure 44:
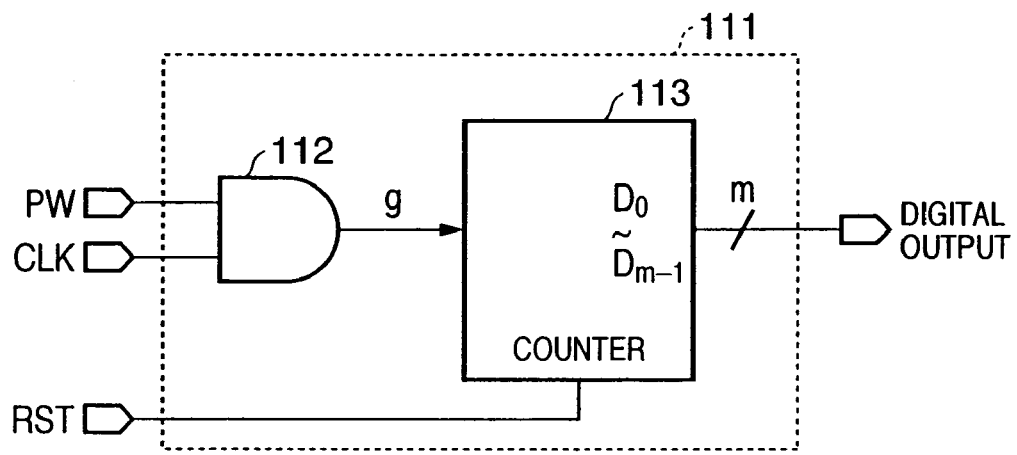
FIG. 44 is a block diagram showing an example of a conventional pulse width/digital conversion circuit.

FIG. 42 shows the above-described operation processing flow.

First, a step S1 of inputting an image signal output from the image sensing device is executed. Next, an input value holding step S2 of holding the input signal is executed. Subsequently, a sorting step S3 of output the held input values in descending order of magnitude is executed. A memory holding step S4 of holding the flag and label in a memory is executed. In a ramp generation step S6, a voltage waveform (ramp waveform) which monotonically increases over time is generated on the basis of the coefficient value input in a coefficient value input step S5 and the flag input in the memory holding step S4 and input to a switching step S7.

In the switching step S7, the ramp waveform is input to an appropriate operation circuit in accordance with the label input in the memory holding step S4. In a switching step S9, a weight value input in a weight value input step S8 is input to an appropriate operation circuit in accordance with the label input in the memory holding step S4.

In the operation circuit to which the ramp waveform and weight value are input, a multiplication/accumulation step S10 is executed, and an accumulation value is output to a function processing step S11. In the function processing step S11, predetermined function processing is executed, and a step S12 of inputting the output value to the subsequent-stage layer is executed. On the subsequent-stage layer side, the above-described operation processing step is repeated a necessary number of times (number of layers).

As described above, when operation processing by a neural network circuit is applied to an image signal, desired operation processing (e.g., pattern detection and pattern recognition) can be realized.

15th EMBODIMENT

According to the above-described embodiments, a product-sum operation circuit which uses a digital/pulse width conversion circuit which converts a plurality of digital input values into pulse widths in parallel while saving the area and reducing power consumption or a pulse width/digital conversion circuit which operates at low power consumption and can reduce noise generated from the circuit is provided.

In the following embodiment, implementation of an analog/digital mixed operation circuit using a pulse width/digital conversion circuit having the same effect as described above will be described.

Figure 48:
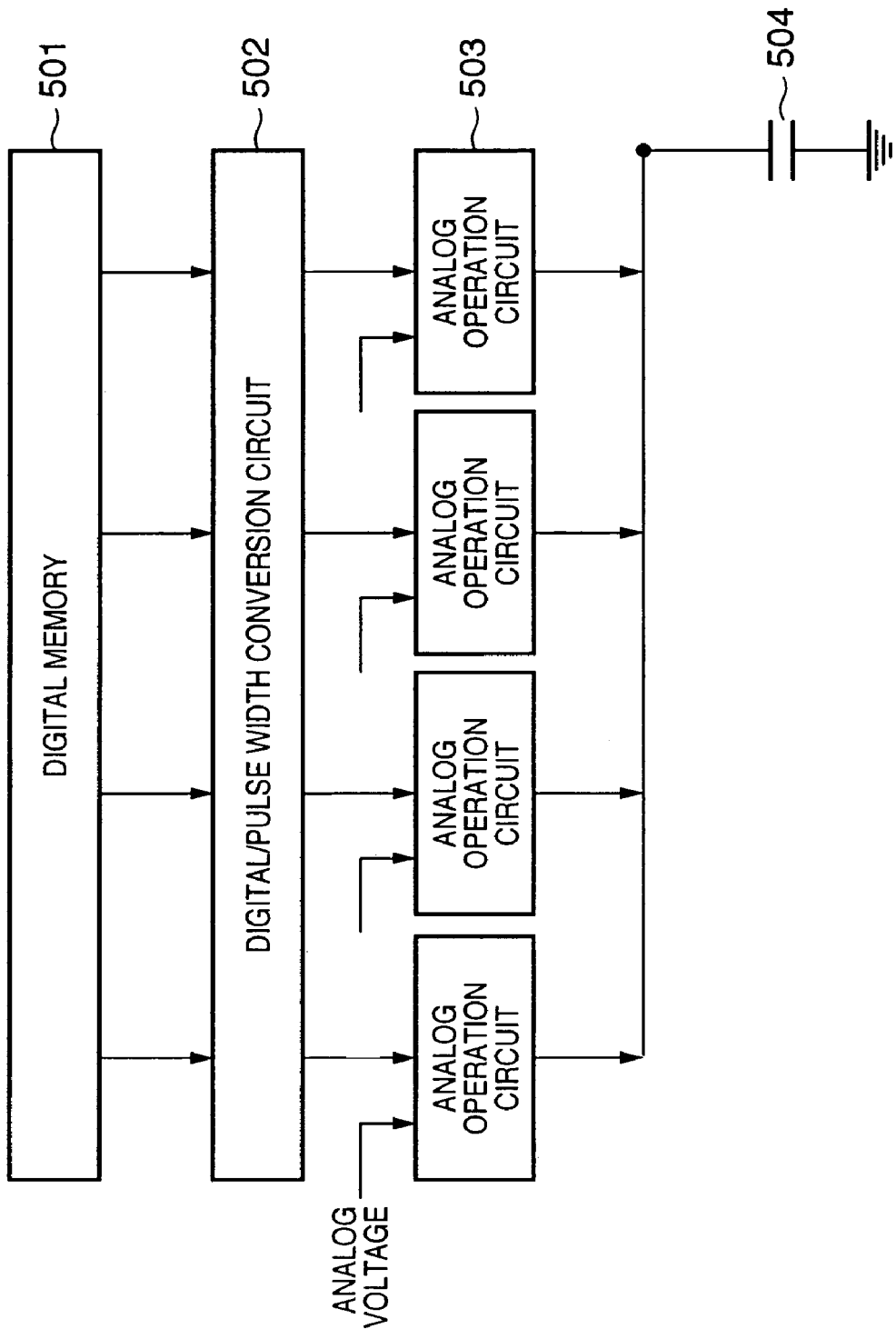
FIG. 48 is a block diagram showing an example of the overall arrangement of an operation circuit according to the 15th embodiment.

FIG. 48 shows the overall arrangement of an analog/digital mixed operation circuit according to this embodiment.

As shown in FIG. 48, this analog/digital mixed operation circuit includes a digital memory 501, a digital/pulse width conversion circuit 502, analog operation circuits 503, and a capacitor 504.

This analog/digital mixed operation circuit realizes a function of calculating the accumulation value of a plurality of multiplication results.

Figure 49:
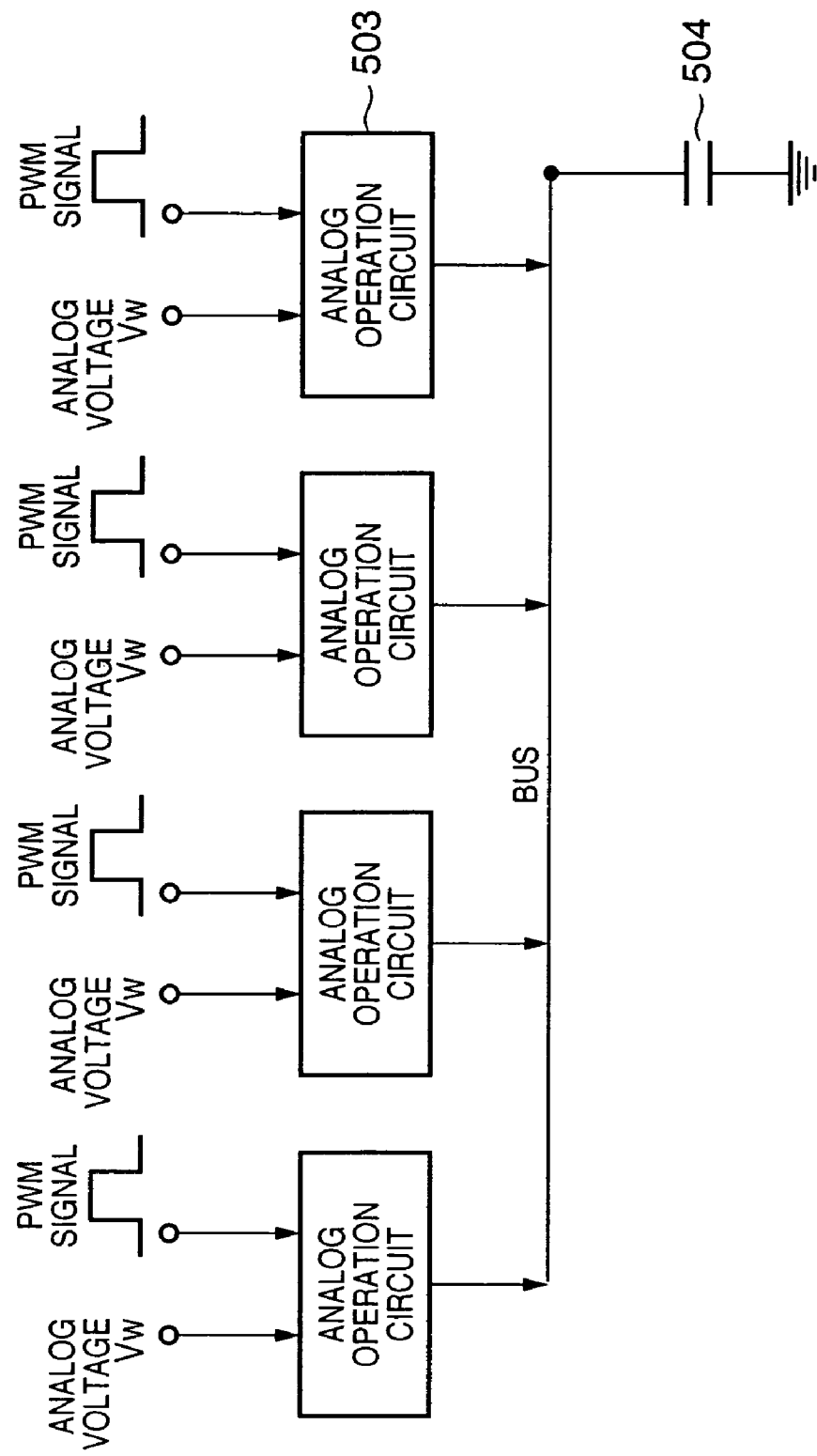
FIG. 49 is a block diagram showing analog operation circuits and capacitors included in the operation circuit according to the 15th embodiment.

FIG. 49 explains in detail the arrangement of the analog operation circuits 503 and capacitor 504 shown in FIG. 48. As shown in FIG. 49, the analog operation circuits 503 and capacitor 504 have an arrangement in which the plurality of analog operation circuits 503 are connected in parallel to the bus connected to the capacitor 504.

Figure 50:
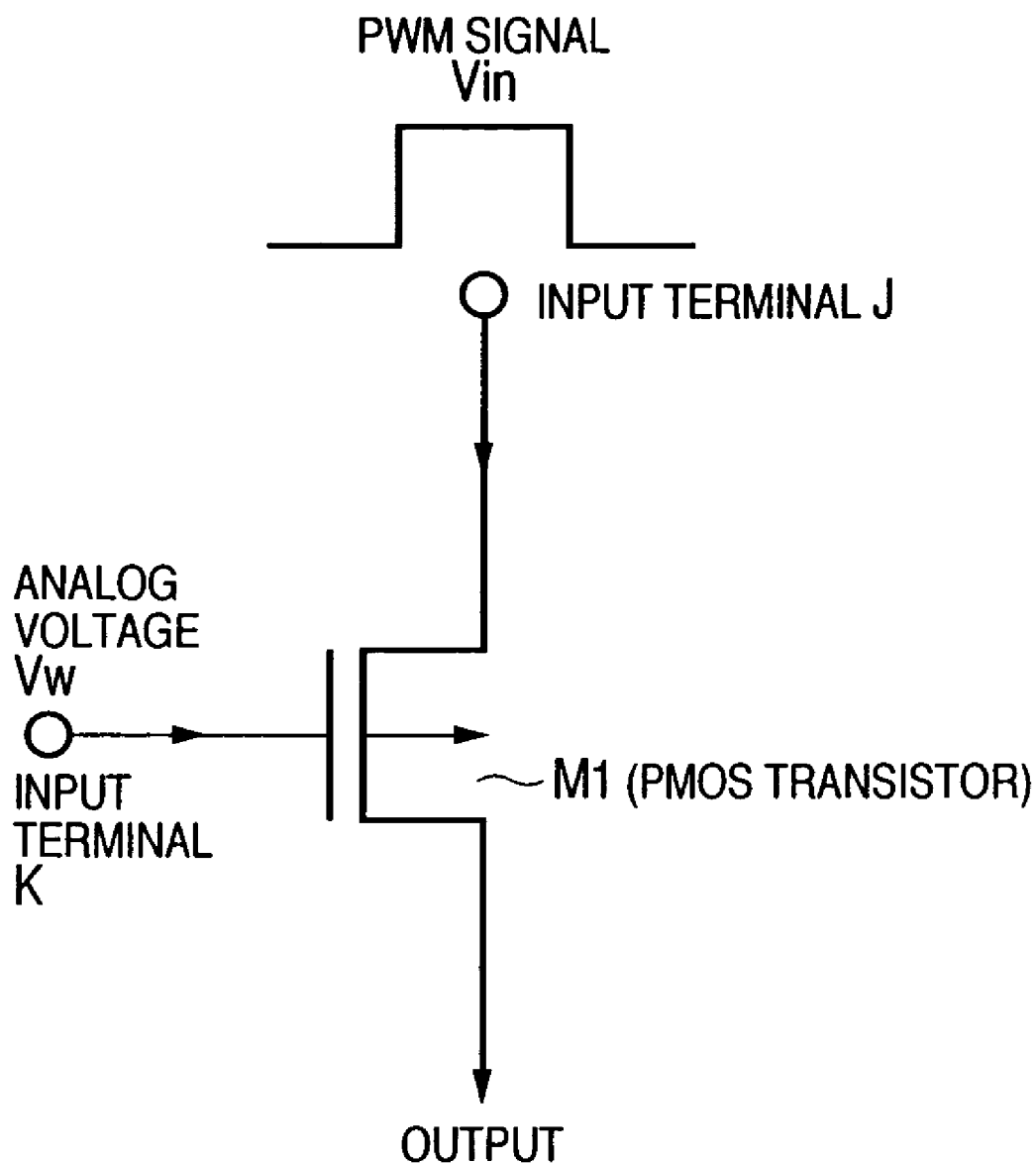
FIG. 50 is a view showing an analog operation circuit included in the operation circuit according to the 15th embodiment.

FIG. 50 shows the detailed circuit arrangement of the analog operation circuit 503. As shown in FIG. 50, the analog operation circuit 503 comprises a PMOS transistor M1 which functions as a constant current source.

The arrangement of the digital/pulse width conversion circuit 502 is the same as that of the digital/pulse width conversion circuit 23 of the second embodiment shown in FIGS. 16 and 17, and a description thereof will be omitted. Processing for causing the digital/pulse width conversion circuit 502 to convert digital data held in the digital memory 501 into a pulse signal is executed in accordance with the timing chart shown in FIG. 18, as in the second embodiment, and a description thereof will be omitted.

Operation processing by the analog operation circuit 503 will be described below with reference to FIG. 50. Next, how to cause the capacitor 504 to hold the operation result by the analog operation circuit 503 as a partial sum will be described with reference to FIG. 49. In addition, how to calculate a desired accumulation value from the partial sum will be described with reference to FIG. 48.

As shown in FIG. 48, first, the digital value of a multiplicand value A held in the digital memory 501 is input to the digital/pulse width conversion circuit 502. The digital/pulse width conversion circuit 502 converts the received digital value into a pulse signal having a time width proportional to the digital input value and outputs the pulse signal in accordance with the timing chart shown in FIG. 18, as described in the second embodiment.

In this embodiment, the analog operation circuit 503 shown in FIG. 50 realizes multiplication of the multiplicand value A and a multiplier value B: (A×B) (A and B satisfy $A \geqq 0$ and $B \geqq 0$). To realize the multiplication by the analog operation circuit 503, the multiplicand value A and multiplier value B are respectively input as a PWM signal output from the digital/pulse width conversion circuit 502 and an analog voltage Vw (FIG. 49).

The analog operation circuit 503 may be another analog operation circuit except a circuit which realizes the multiplication if it executes a kind of operation (e.g., nonlinear conversion).

Referring to FIG. 50, a PWM signal Vin output from the digital/pulse width conversion circuit 502 is input to an input terminal J. In addition, the analog voltage Vw obtained by executing predetermined conversion for the multiplier value B is input to an input terminal K.

The characteristic of the PWM signal will be described briefly. In the PWM (Pulse Width Modulation) signal, the width of the pulse waveform has information. The PWM signal has both a digital characteristic resistant to noise (a characteristic representing that binary information of high and low levels are held in the voltage direction) and an analog characteristic capable of expressing continuous information by one pulse (a characteristic representing that continuous information is held in the time direction).

The voltage Vw corresponding to the multiplier value B input to the input terminal J is applied to the gate terminal of the PMOS transistor M1. The PWM signal Vin is input from the input terminal J to the source terminal of the PMOS transistor M1. The Low level of the PWM signal is set to 0 V. The High level is set to a power supply voltage Vdd (3.3 V in this embodiment).

The analog voltage Vw is set to an appropriate voltage range such that when the PWM signal is at High level, i.e., when the power supply voltage Vdd is applied to the source terminal of the PMOS transistor M1, the PMOS transistor M1 operates in the saturation region. Accordingly, while the PWM signal is at High level, the PMOS transistor M1 can be operated as a constant current source.

The amount of the current which flows to the PMOS transistor M1 at this time is determined by the gate-to-source voltage, i.e., (Vdd−Vw). At this time, the pulse width of the PWM signal Vin is converted in proportion to the multiplicand value A.

The analog voltage Vw is converted such that the current amount determined by (Vdd−Vw) is proportional to the multiplier value B.

Hence, since the PMOS transistor M1 flows the current determined by (Vdd−Vw) only while the PWM signal is at High level, the total charge amount supplied by the PMOS transistor M1 while the PWM signal is at High level is proportional to A×B. Any other analog operation circuit may be used when it can realize the multiplication by using a PWM signal.

How to cause the capacitor 504 to hold the operation result by the analog operation circuit 503 will be described next with reference to FIG. 49.

15. Referring to FIG. 49, the charge amount supplied by the PMOS transistor M1 is accumulated in the capacitor 504 connected to the analog operation circuit 503 through a bus.

The plurality of analog operation circuits 503 which independently execute operations are connected to the bus. Operation results executed in parallel by the analog operation circuits 503, i.e., the above-described charge amounts are accumulated in the capacitor 504 through the bus and added.

Hence, the total charge amount accumulated in the capacitor 504 every time parallel operation processing of one cycle is ended indicates the sum of the operation results of the plurality of analog operation circuit 503 connected to the capacitor 504 through the common bus.

The operation processing flow will be described next with reference to the flowchart shown in FIG. 51. The operation circuit which executes each processing step will also be mentioned in the description.

Figure 51:
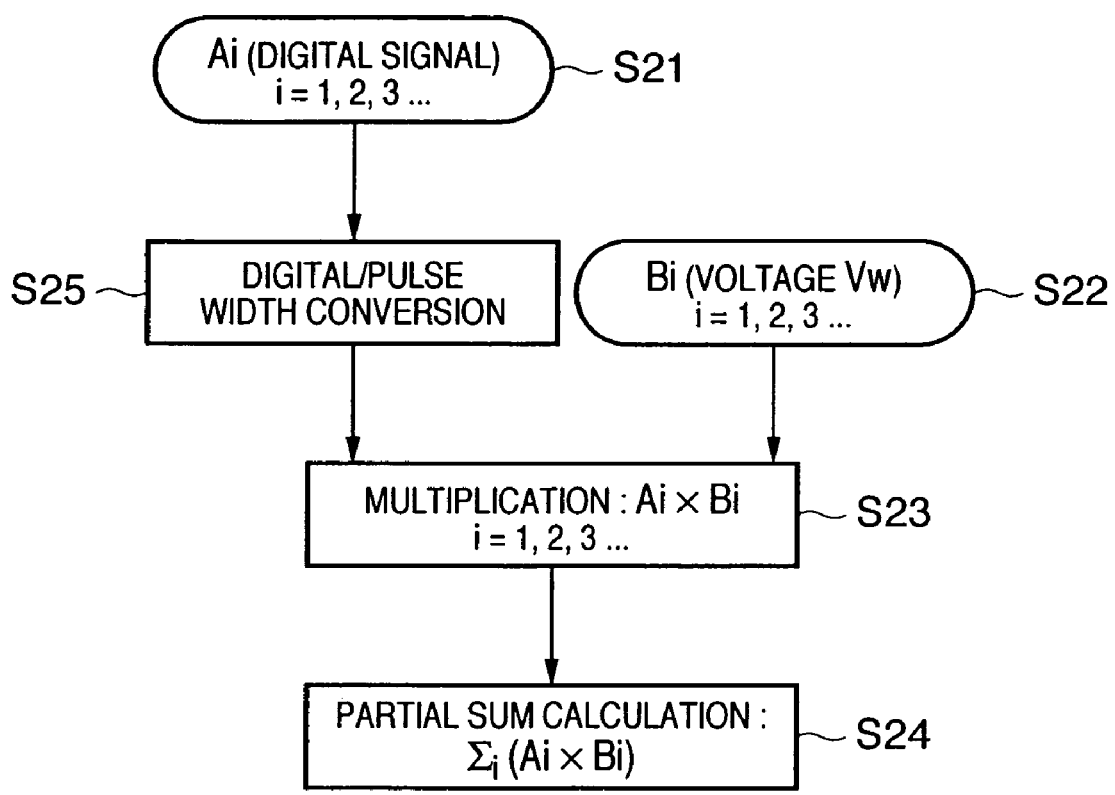
FIG. 51 is a flowchart showing operation processing of the operation circuit according to the 15th embodiment.

Referring to FIG. 51, first, a digital signal input step S21 is executed. Next, a step S25 of causing the digital/pulse width conversion circuit 502 to convert the digital signal into a PWM signal is executed. A Bi (voltage Vw) input step S22 is executed. A step S23 of causing each analog operation circuit 503 to multiply the PWM signal as the output from the step S25 by the analog voltage Vw is executed. A step S24 of causing the capacitor 504 to accumulate, as the charge amount, the products calculated in parallel by the analog operation circuits 503 and hold a partial sum Σ(Ai× Bi) is executed.

When the above-described operation flow is repeated a necessary number of times (three times in this embodiment) for calculating the accumulation value, the desired accumulation value is calculated.

The above-described operation flow may be repeated a plurality of number of times as needed, and the operation results may be additionally accumulated in the capacitor as charges (although a partial sum is calculated in step S24 in FIG. 51, if operation results are additionally accumulated in the capacitor as charges, a charge amount corresponding to the finally calculated accumulation value is accumulated in the capacitor).

Alternatively, an operation result which is temporarily accumulated in the capacitor as charges may be stored in another storage circuit, and the operation flow may newly be executed.

As described above, when the digital/pulse width conversion circuit which converts a plurality of digital input values into pulse widths in parallel at low power consumption is used, an analog/digital mixed operation circuit having low power consumption and small layout area can be implemented.

16th EMBODIMENT

In the analog/digital mixed operation circuit of the above-described 15th embodiment, the digital/pulse width conversion circuit may have another arrangement. For example, a digital/pulse width conversion circuit 151 shown in FIG. 45 described as a modification to the second embodiment may be applied. As described above with reference to FIGS. 45 to 47, the digital/pulse width conversion circuit 151 drives one counter 153. Each pulse generation circuit 152-i operates to switch the pulse with reference to the output value from the common counter 153. For this reason, the through current or charge/discharge current to the load generated at the time of switching of the switching device in the counter 153 is small, and power consumption is also low. Hence, when the digital/pulse width conversion circuit 151 is employed, the power consumption can be reduced. In addition, since the common counter 153 is used, the circuit layout area can be reduced.

17th EMBODIMENT

Figure 52:
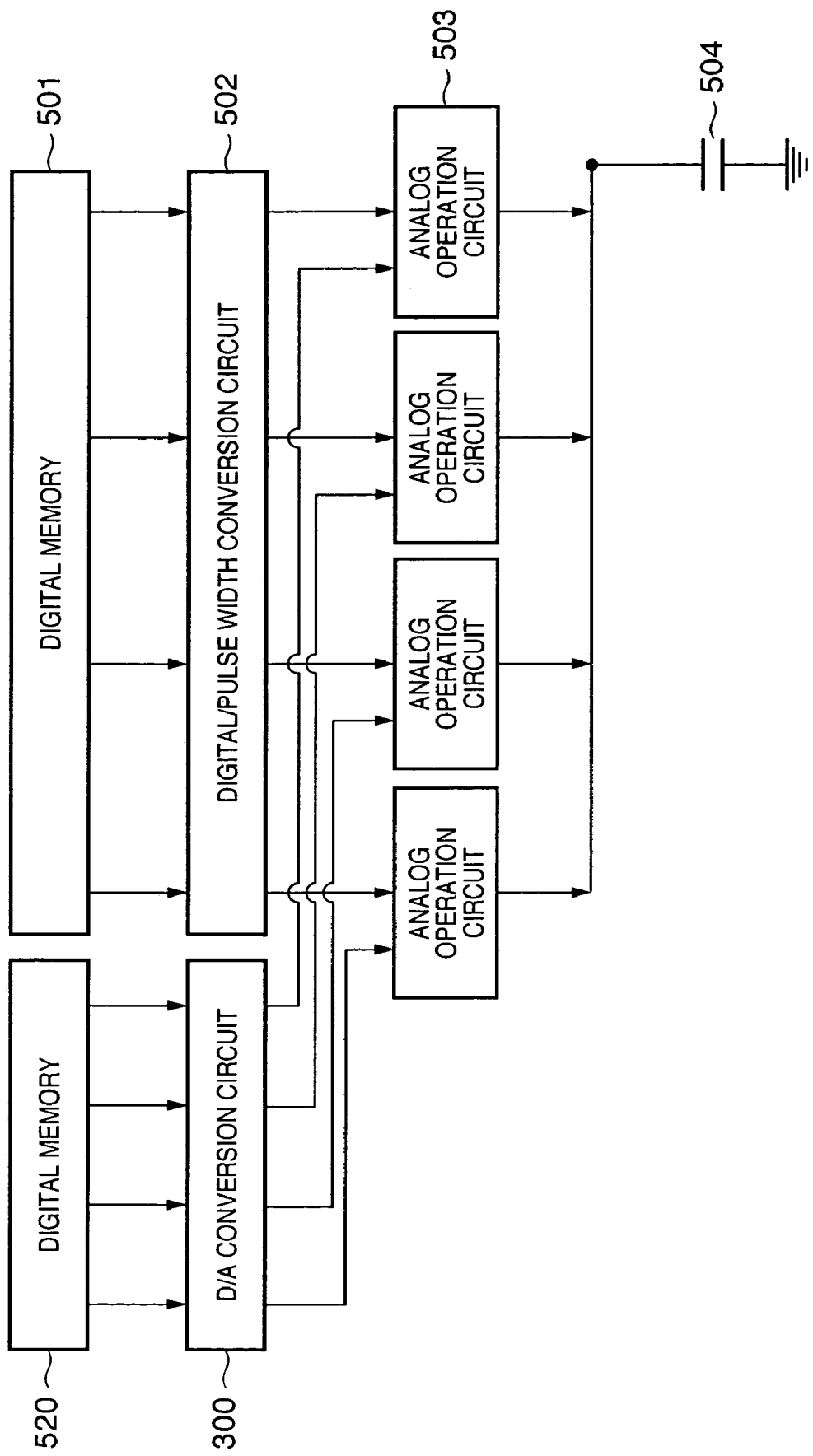
FIG. 52 is a block diagram showing an example of the overall arrangement of an operation circuit according to the 17th embodiment.

FIG. 52 shows an arrangement example of an analog/digital mixed operation circuit according to the 17th embodiment. The same reference numerals as in FIG. 48 denote the same constituent blocks in FIG. 52.

As is apparent from comparison with FIG. 48, referring to FIG. 52, a digital memory 520 and a D/A conversion circuit 300 are added to the preceding stage of analog operation circuits 503 in the analog/digital mixed operation circuit described in the 15th embodiment.

In this embodiment, only processing by the D/A conversion circuit 300 different from the 15th embodiment will be described. The remaining processing operations are the same as in the 15th embodiment and a description thereof will be omitted.

Figure 53:
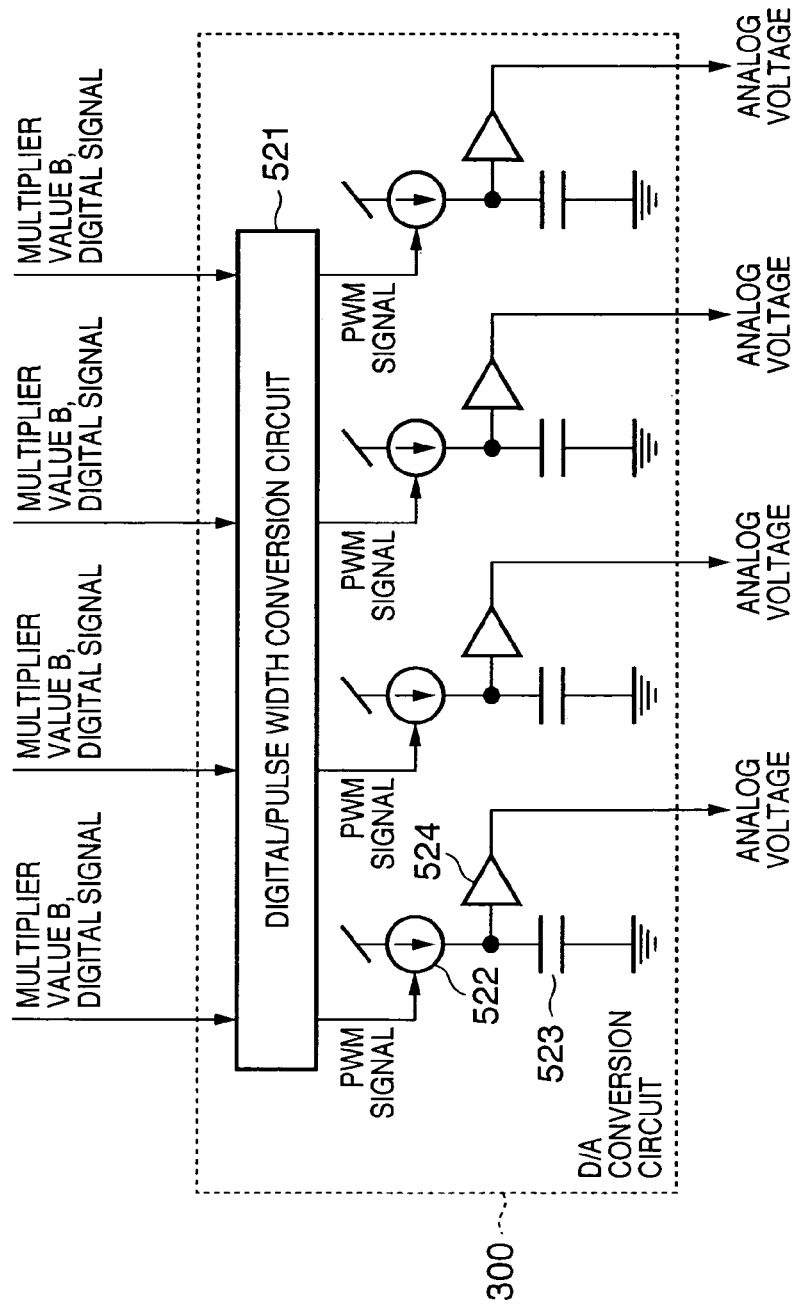
FIG. 53 is a block diagram showing an arrangement example of a D/A conversion circuit according to the 17th embodiment.

As shown in FIG. 53, the D/A conversion circuit 300 includes a digital/pulse width conversion circuit 521, current sources 522, capacitors 523, and buffers 524. Of the processing by the D/A conversion circuit 300, processing executed by the digital/pulse width conversion circuit 521 in parallel is the same as in the 15th embodiment, and a description thereof will be omitted.

As shown in FIG. 53, first, in the D/A conversion circuit 300, digital values corresponding to multiplier values B are input from the digital memory to the digital/pulse width conversion circuit 521. Upon receiving the digital values, the digital/pulse width conversion circuit 521 executes the same processing as in the 15th embodiment and outputs PWM signals. The PWM signals ON/OFF-control the operations of the current sources 522.

That is, in this embodiment, while the PWM signal is High, the current source 522 is ON, and a predetermined current is supplied to the capacitor 523. While the PWM signal is Low, the current source 522 is OFF, and current supply to the capacitor 523 stops. As a result, the capacitor 523 accumulates a charge amount proportional to the time width of the PWM signal. In the capacitor 523, the accumulated charge amount can be referred to as a voltage value through the buffer 524. This is input to the analog operation circuit as an analog voltage value corresponding to the multiplier value B, as shown in FIG. 52.

The operation processing flow will be described next with reference to the flowchart shown in FIG. 54.

Figure 54:
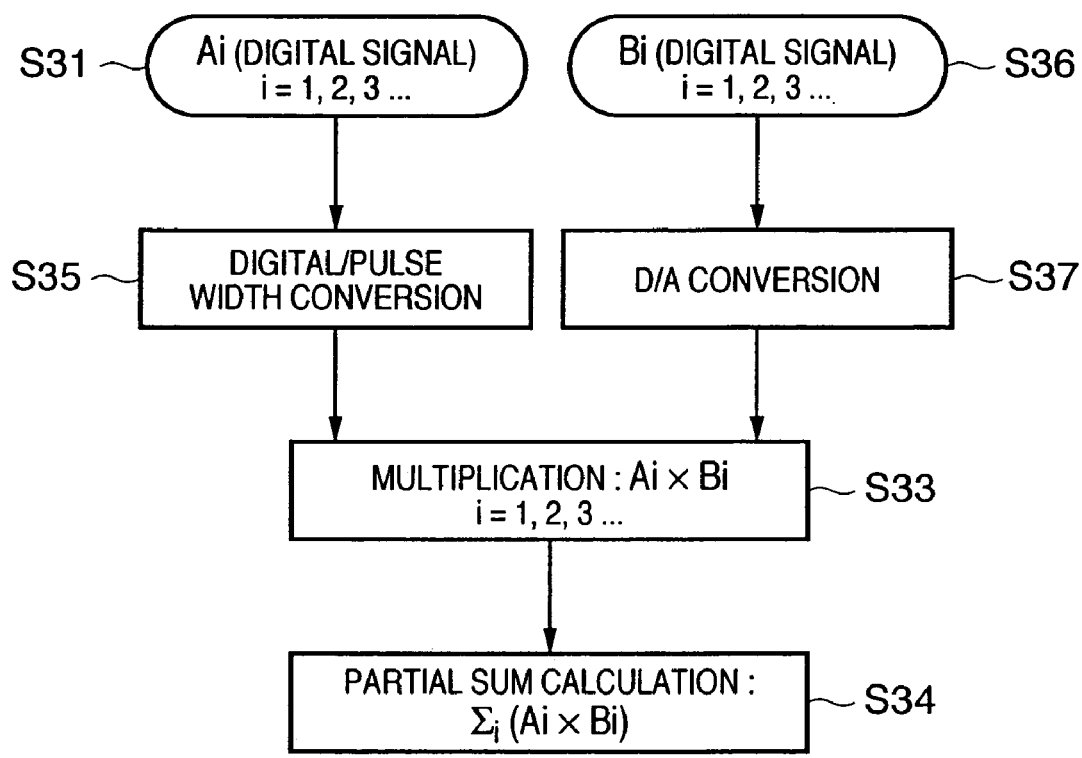
FIG. 54 is a flowchart showing operation processing according to the 17th embodiment.

Referring to FIG. 54, first, a digital signal Ai input step S31 is executed. Next, a step S35 of causing a digital/pulse width conversion circuit 502 to convert the digital signal into a PWM signal is executed. A digital signal Bi (voltage Vw) input step S36 is executed. A D/A conversion step S37 of causing the D/A conversion circuit 300 to convert the digital signal into an analog signal is executed.

A step S33 of causing each analog operation circuit 503 to multiply the PWM signals as the outputs from the steps S35 and S37 by the analog voltage Vw is executed. A step S34 of causing a capacitor 504 to accumulate, as the charge amount, the products calculated in parallel by the analog operation circuits 503 and hold a partial sum $\Sigma(Ai \times Bi)$ is executed.

When the above-described operation flow is repeated a necessary number of times (three times in this embodiment) for calculating the accumulation value, the desired accumulation value is calculated.

The above-described operation flow may be repeated a plurality of number of times as needed, and the operation results may be additionally accumulated in the capacitor 504 as charges (although a partial sum is calculated in step S34 in FIG. 54, if operation results are additionally accumulated in the capacitor 504 as charges, a charge amount corresponding to the finally calculated accumulation value is accumulated in the capacitor 504). Alternatively, an operation result which is temporarily accumulated in the capacitor 504 as charges may be stored in another storage circuit, and the operation flow may newly be executed.

As described above, when the digital/pulse width conversion circuit 502 which converts a plurality of digital input values into pulse widths in parallel at low power consumption in the D/A conversion circuit 300 is used, an analog/digital mixed operation circuit having low power consumption and small layout area can be implemented.

18th EMBODIMENT

Figure 55:
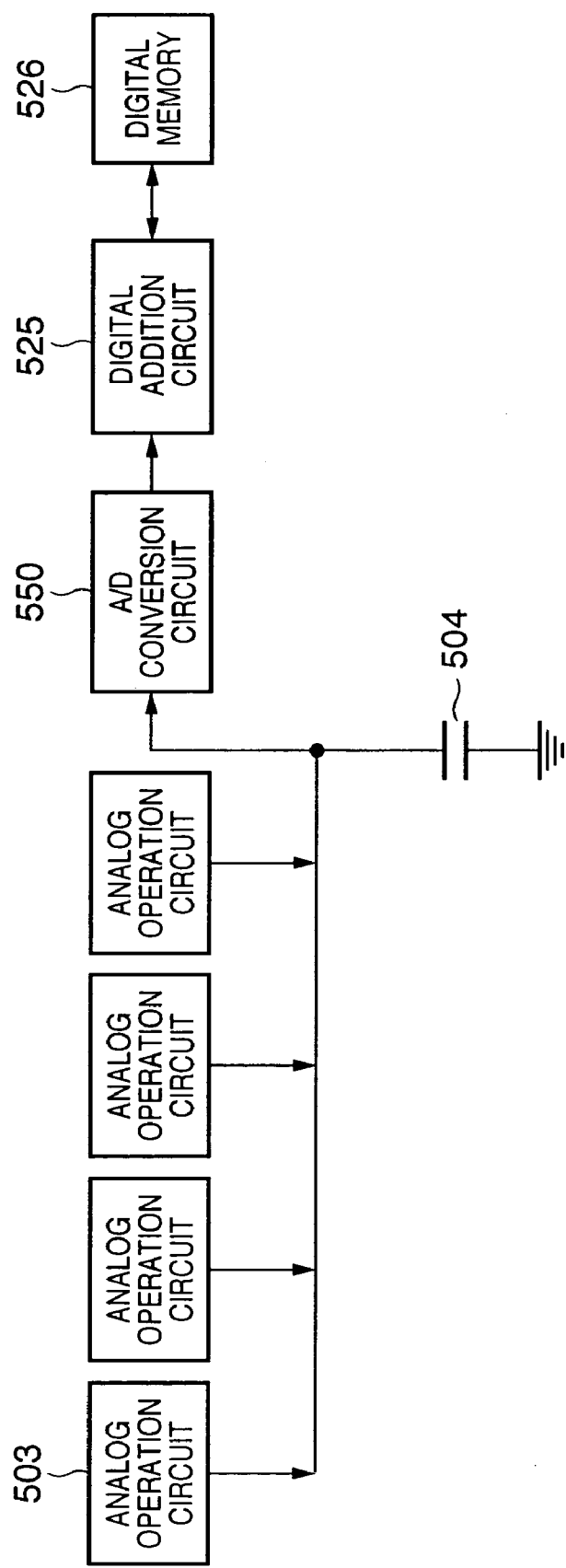
FIG. 55 is a block diagram showing an example of the overall arrangement of an operation circuit according to the 18th embodiment.

The 18th embodiment will be described below in detail with reference to the accompanying drawings. FIG. 55 shows the overall arrangement of an analog/digital mixed operation circuit according to this embodiment.

As shown in FIG. 55, the analog/digital mixed operation circuit includes a plurality of analog operation circuits 503, a capacitor 504 connected to the plurality of analog operation circuits 503, an A/D conversion circuit 550, a digital addition circuit 525, and a digital memory 526. This analog/digital mixed operation circuit realizes a function of calculating the accumulation value of a plurality of multiplication results.

The detailed arrangements of the analog operation circuits 503 and capacitor 504 shown in FIG. 55 are the same as in FIG. 49. As shown in FIG. 49, the analog operation circuits 503 and capacitor 504 of this embodiment have an arrangement in which the plurality of analog operation circuits 503 are connected in parallel to the bus connected to the capacitor 504.

The detailed circuit arrangement of the analog operation circuit 503 of this embodiment is the same as in FIG. 50. As shown in FIG. 50, the analog operation circuit 503 of this embodiment comprises a PMOS transistor M1 which functions as a constant current source.

Operation processing by the analog operation circuit 503 will be described first with reference to FIG. 50. Next, how to cause the capacitor 504 to hold the operation result by the analog operation circuit 503 as a partial sum will be described with reference to FIG. 49. In addition, how to calculate a desired accumulation value from the partial sum will be described with reference to FIG. 55.

In this embodiment, the analog operation circuit 503 shown in FIG. 50 realizes multiplication of a multiplicand value A and a multiplier value B: (A×B). A and B satisfy $A \geqq 0$ and $B \geqq 0$.

To realize the multiplication by the analog operation circuit 503, the multiplicand value A and multiplier value B are input as a PWM signal Vin and an analog voltage Vw, respectively, which have undergone predetermined conversion, as will be described later.

The PWM signal and analog voltage input to each analog operation circuit 503 may also be input from an external power supply device, as needed. However, they can be input by converting digital values, as in the PWM signal and analog voltage input process described in the 15th embodiment.

In this embodiment, the PWM signal and analog voltage are input, as in the input process described in the 15th embodiment. The input process is the same as in the 15th embodiment, and a detailed description thereof will be omitted. The analog operation circuit 503 may be another analog operation circuit except a circuit which realizes the multiplication if it executes a kind of operation (e.g., non-linear conversion).

Referring to FIG. 50, the PWM signal Vin which is obtained by executing predetermined conversion for the multiplicand value A is input to an input terminal J. In addition, the analog voltage Vw obtained by executing predetermined conversion for the multiplier value B is input to an input terminal K.

The voltage Vw corresponding to the multiplier value B input to the input terminal J is applied to the gate terminal of the PMOS transistor M1. The PWM signal Vin is input from the input terminal J to the source terminal of the PMOS transistor M1. The Low level of the PWM signal is set to 0 V. The High level is set to a power supply voltage Vdd (3.3 V in this embodiment).

The analog voltage Vw is set to an appropriate voltage range such that when the PWM signal is at High level, i.e., when the power supply voltage Vdd is applied to the source terminal of the PMOS transistor M1, the PMOS transistor M1 operates in the saturation region. Accordingly, while the PWM signal is at High level, the PMOS transistor M1 can be operated as a constant current source.

The amount of the current which flows to the PMOS transistor M1 at this time is determined by the gate-to-source voltage, i.e., (Vdd−Vw). At this time, the pulse width of the PWM signal Vin is converted in proportion to the multiplicand value A. The analog voltage Vw is converted such that the current amount determined by (Vdd−Vw) is proportional to the multiplier value B.

Hence, since the PMOS transistor M1 flows the current determined by (Vdd−Vw) only while the PWM signal is at High level, the total charge amount supplied by the PMOS transistor M1 while the PWM signal is at High level is proportional to A×B.

How to cause the capacitor 504 to hold the operation result by the analog operation circuit 503 as a partial sum will be described next with reference to FIG. 49. Referring to FIG. 49, the charge amount supplied by the PMOS transistor M1 is accumulated in the capacitor 504 connected to the analog operation circuit 503 through a bus.

The plurality of analog operation circuits 503 which independently execute operations are connected to the bus. Operation results executed in parallel by the analog operation circuits 503, i.e., the above-described charge amounts are accumulated in the capacitor 504 through the bus and added.

Hence, the total charge amount accumulated in the capacitor 504 every time parallel operation processing of one cycle is ended indicates the sum of the operation results of the plurality of analog operation circuit 503 connected to the capacitor 504 through the common bus. The sum corresponds to the partial sum of the accumulation value to be finally calculated.

Any other analog operation circuit may be used when it can realize the multiplication by using a PWM signal.

The process for calculating a desired accumulation value from the partial sum will be described next with reference to FIG. 48.

In this embodiment, the desired accumulation value is given by $$\sum_{i=1}^{12} Ai \times Bi \quad (7)$$

To obtain the ultimate accumulation value, an arrangement in which the four analog operation circuits 503 shown in FIG. 49 are connected to the capacitor 504 is used. Even when the total number of operations (12 in this embodiment) is not a multiple of the number of analog operation circuits (4), the number of operations can be adjusted by inputting the analog voltage Vw corresponding to the multiplier value B=0.

As described with reference to FIG. 49, the four analog operation circuits 503 execute in parallel the operation given by $$\sum_{i=1}^{4} Ai \times Bi \quad (8)$$

The operation results are held in the capacitor 504 as a charge amount.

The operation result can be regarded as a partial sum for the desired operation (operational expression (7)).

Subsequently, the operation result held in the capacitor 504 as a charge amount in an analog manner is converted into a digital value by the A/D conversion circuit 550. The digital addition circuit 525 adds the digital value to a digital value stored in the digital memory 526. The operation result is held in the digital memory 526.

The above-described operation is the first operation for the desired operation (operational expression (7)). Hence, no partial sum held in the digital memory 526 in advance is present. The digital memory 526 holds all 0s. Hence, the digital value held in the digital memory 526 equals the operation result of operational expression (8).

The second partial sum is operated by the analog operation circuits 503. More specifically, as described with reference to FIG. 2, the four analog operation circuits 503 execute in parallel the operation given by $$\sum_{i=5}^{8} Ai \times Bi \quad (9)$$

The operation results are held in the capacitor 504 as a charge amount.

The operation result can be regarded as a partial sum for the desired operation (operational expression (7)).

Subsequently, the operation result held in the capacitor 504 as a charge amount in an analog manner is converted into a digital value by the A/D conversion circuit 550.

The digital addition circuit 525 adds the digital value to the digital value stored in the digital memory 526. The operation result is held in the digital memory 526.

The digital value held in the digital memory 526 in advance corresponds to the operation result of operational expression (8). Hence, the result obtained by adding the operation result of operational expression (9) and stored is given by $$\sum_{i=1}^{4} Ai \times Bi + \sum_{i=5}^{8} Ai \times Bi = \sum_{i=1}^{8} Ai \times Bi \quad (10)$$

The third partial sum is operated by the analog operation circuits 503. More specifically, as described with reference to FIG. 49, the four analog operation circuits 503 execute in parallel the operation given by $$\sum_{i=9}^{12} Ai \times Bi \quad (11)$$

The operation results are held in the capacitor 504 as a charge amount.

The operation result can be regarded as a partial sum for the desired operation (operational expression (7)).

Subsequently, the operation result held in the capacitor 504 as a charge amount in an analog manner is converted into a digital value by the A/D conversion circuit 550.

The digital addition circuit 525 adds the digital value to the digital value stored in the digital-memory 526. The operation result is held in the digital memory 526.

The digital value held in the digital memory 526 in advance corresponds to the operation result of operational expression (10). Hence, the result obtained by adding the operation result of operational expression (11) and stored is given by $$\sum_{i=1}^{8} Ai \times Bi + \sum_{i=9}^{12} Ai \times Bi = \sum_{i=1}^{12} Ai \times Bi \quad (12)$$

As described above, the plurality of multiplications are executed by the analog operation circuits 503 in an analog manner, and the results are added in the capacitor 504 in an analog manner to calculate the partial sum for the desired accumulation value.

In addition, the partial sum calculated in the above-described way is converted into digital data by the A/D converter 550 and digitally added by the digital addition circuit 525 to the value held in the digital memory 526 to realize the desired operation.

Processing executed by the above-described A/D conversion circuit 550 will be described next in detail.

Figure 56:
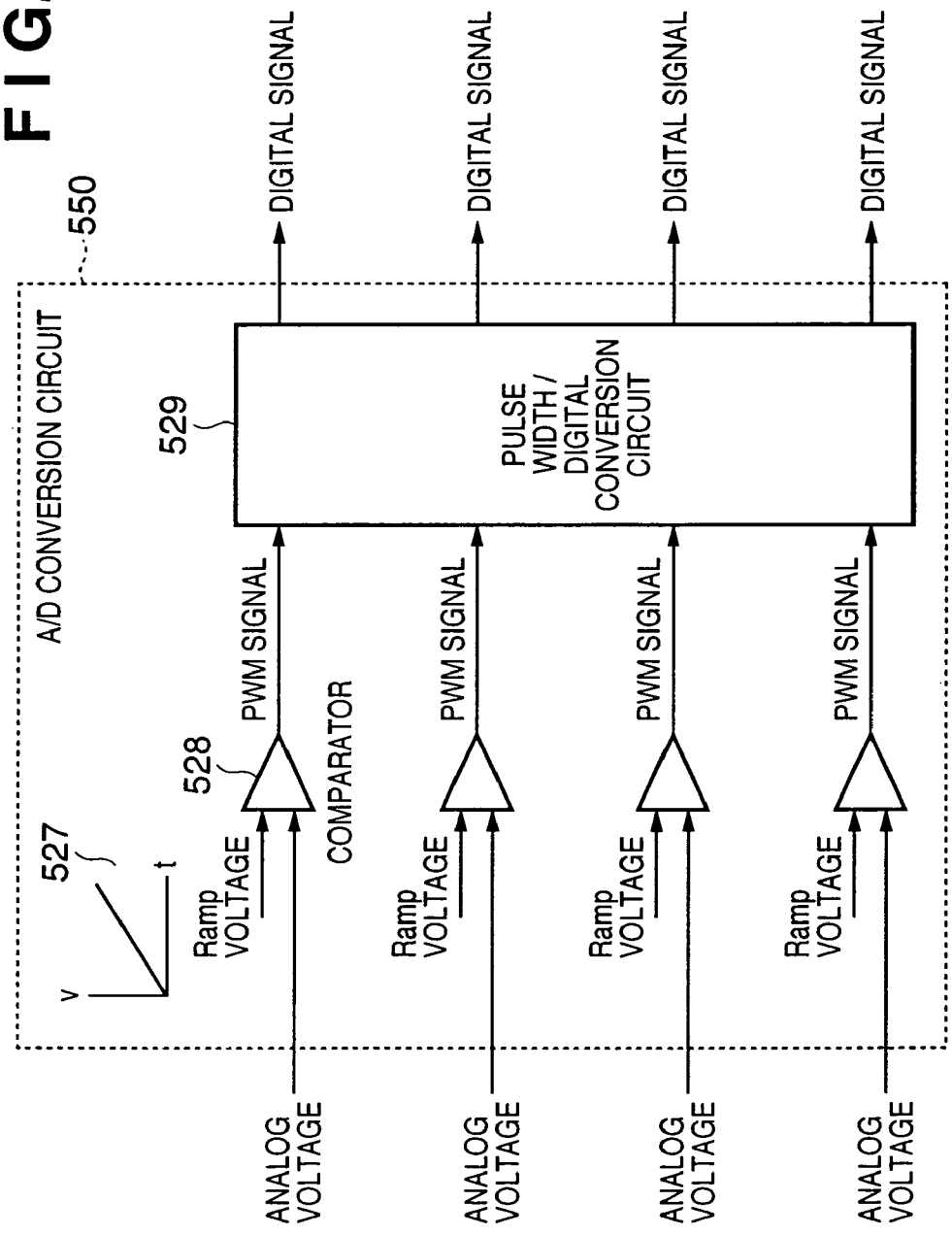
FIG. 56 is a block diagram showing the arrangement of an A/D conversion circuit according to the 18th embodiment.

FIG. 56 is a block diagram showing the arrangement of the A/D conversion circuit 550. As shown in FIG. 56, the A/D conversion circuit 550 includes a plurality of comparators 528 and a pulse width/digital conversion circuit 529. The operation result accumulated in the capacitor 504 as charges is referred to as a voltage value in the capacitor 504. The voltage value is input to the comparator 528 and compared with a separately input arbitrary voltage waveform by the comparator 528.

The arbitrary voltage waveform may be either a ramp voltage waveform 527 in which the voltage value linearly rises or another nonlinear voltage waveform. In the ramp voltage waveform 527 used in this embodiment, the operation result accumulated in the capacitor is linearly converted to set the PWM signal width. In another nonlinear voltage waveform, the operation result accumulated in the capacitor is nonlinearly converted to set the PWM signal width.

More specifically, the output value from the comparator 528 rises to High level at the start of the ramp voltage waveform 527 and falls to Low level when the ramp voltage value 527 equals the voltage value of the capacitor 504 so that the output value is converted into a PWM signal.

The technique for causing the comparator 528 to convert an analog voltage into a PWM signal is widely known. This is not the gist of the present invention, and a detailed description thereof will be omitted. The PWM signal output from the comparator 528 is input to the pulse width/digital conversion circuit 529.

The arrangement and operation of the pulse width/digital conversion circuit 529 are the same as those of the pulse width/digital conversion circuit 9 shown in FIGS. 6 to 9 of the first embodiment. As a variation, the arrangement and operation described with reference to FIGS. 10 and 11 may be applied. A detailed description of them will be omitted here.

The operation processing flow will be described next with reference to the flowchart shown in FIG. 57. The operation circuit which executes each processing step will also be mentioned in the description.

Figure 57:
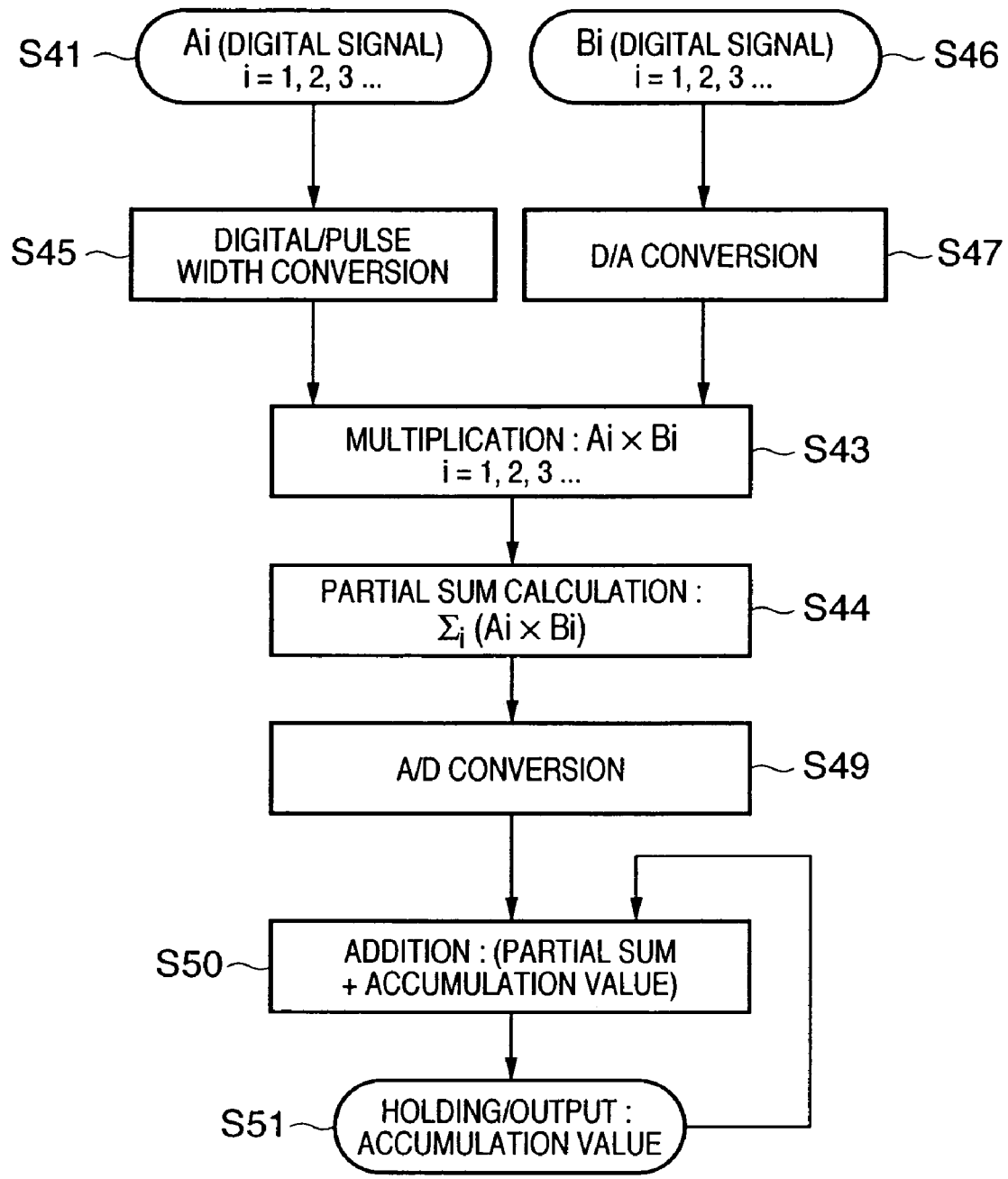
FIG. 57 is a flowchart showing operation processing according to the 18th embodiment.

Referring to FIG. 57, first, a digital signal Ai input step S41 is executed. Next, a step S45 of causing a digital/pulse width conversion circuit 502 to convert the digital signal into a PWM signal is executed.

A digital signal Bi (voltage Vw) input step S46 is executed. A D/A conversion step S47 of causing the D/A conversion circuit to convert the digital signal into an analog signal is executed. A step S43 of causing each analog operation circuit 503 to multiply the PWM signals as the outputs from the steps S45 and S47 by the analog voltage. Vw is executed.

A step S44 of causing the capacitor 504 to accumulate, as the charge amount, the products calculated in parallel by the analog operation circuits and hold a partial sum Σ(Ai×Bi) is executed.

A step S49 of causing the A/D conversion circuit to A/D-convert the charge amount (voltage value) corresponding to the partial sum Σ(Ai×Bi) into a digital value is executed.

A step S50 of causing the digital addition circuit 525 to add the digital value corresponding to the partial sum to the accumulation value (corresponding to the accumulation value in progress of operation) which is output in a step S51 and already held in the digital memory 526 and calculate a new accumulation value is executed.

Finally, the step S51 of rewriting and holding the thus calculated accumulation value in the digital memory 526 is executed. In this case, the accumulation value is overwritten on a corresponding part (a portion where the accumulation value in progress of operation is held) in the digital memory.

When the above-described operation flow is repeated a necessary number of times (three times in this embodiment) for calculating the accumulation value, the desired accumulation value is calculated.

In the above description, the processing is ended when the desired accumulation value is held in the digital memory. The accumulation value may further be subjected to desired operation processing. For example, a nonlinear conversion circuit may be connected to the subsequent stage of the digital memory such that a value obtained by nonlinearly converting the accumulation value can be output.

In this case, the nonlinear conversion circuit can be implemented by a lookup table circuit or the like. The analog/digital mixed operation circuit described in this embodiment can execute arbitrary operation processing for the calculated accumulation value. The nonlinear conversion circuit may be connected to the subsequent stage of the digital addition circuit.

In this case, the nonlinear conversion circuit can be implemented by a lookup table circuit or the like.

More specifically, the accumulation value calculated by the digital addition circuit is input to the lookup table circuit. The accumulation value is nonlinearly converted by the lookup table circuit and then held in the digital memory.

In this case, nonlinear conversion may be executed for only the desired operation value (the finally calculated accumulation value, i.e., the value given by operational expression (7) or (12)) calculated by the digital addition circuit. The nonlinear conversion may not be executed for the accumulation value (operational expression (8) or (10)) calculated in progress of operation processing.

Any other arrangement can be used when it can nonlinearly convert the accumulation value.

As described above, when the pulse width/digital conversion circuit which converts a plurality of PWM signals into digital values in parallel at low power consumption is used in the A/D conversion circuit, an analog/digital mixed operation circuit having low power consumption and small layout area can be implemented.

19th Embodiment

Figure 58:
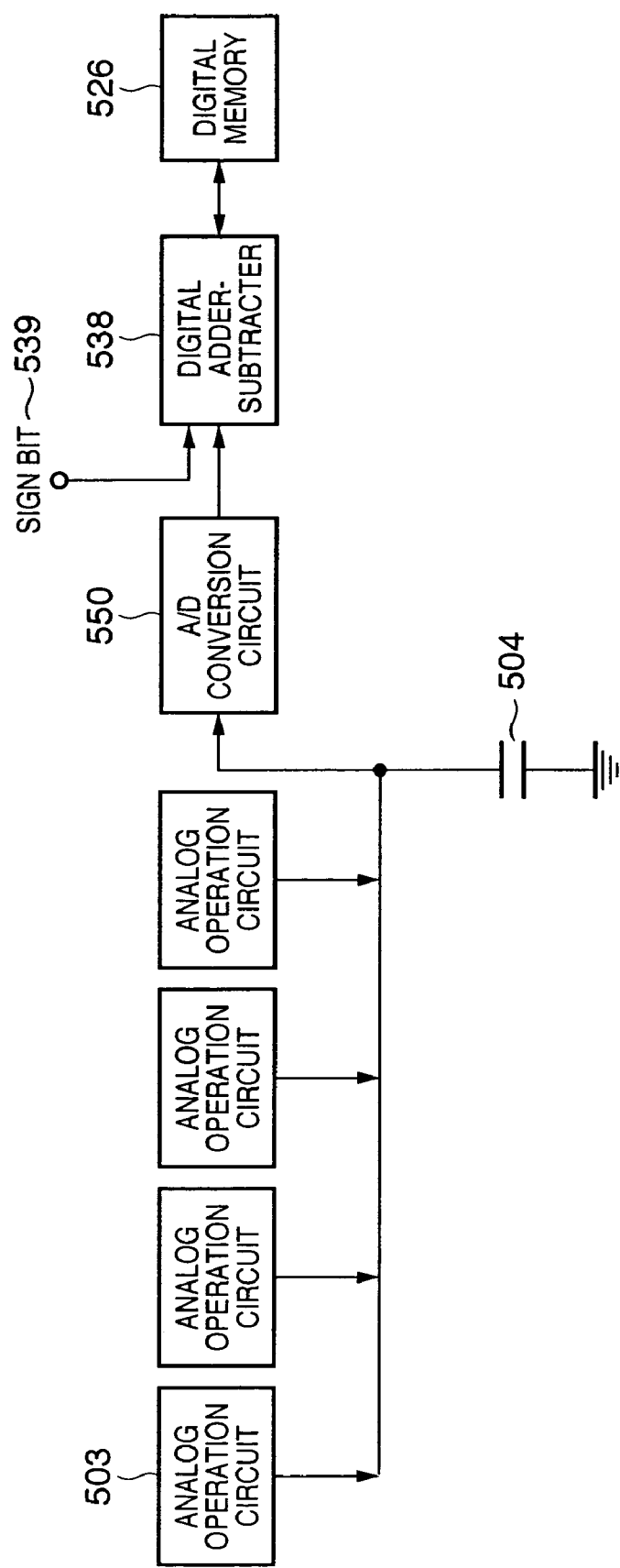
FIG. 58 is a block diagram showing an example of the overall arrangement of an operation circuit according to the 19th embodiment.

FIG. 58 is a block diagram showing an arrangement example of the an analog/digital mixed operation circuit according to the 19th embodiment.

Different points from FIG. 55 described above in the 18th embodiment are as follows. The digital addition circuit 525 shown in FIG. 55 is replaced with a digital adder-subtracter 538. Analog operation circuits 503 in FIG. 58 separately execute multiplication for multiplier values B having positive and negative signs in accordance with their signs. A sign bit 539 representing the sign of the multiplier value B is input to the digital adder-subtracter 538. In the operation for digital data stored in a digital memory 526, the partial sum of operation results for the negative multiplier value B is subtracted from the digital data in the digital memory 526 by the digital adder-subtracter 538.

That is, as multiplication in each analog operation circuit 503 of this embodiment, multiplication for positive sign and that for negative sign are separately executed for the positive and negative signs of the multiplier value B.

Only parts different from the 18th embodiment will be described below. The remaining parts are the same as in the 18th embodiment, and a description thereof will be omitted.

An operation given by $$\sum_{i=1} Ai \times Bi \quad (13)$$

(Ai≧0) is executed by the analog/digital mixed operation circuit shown in FIG. 58. In this case, the four analog operation circuits 503 separately execute positive and negative operations in accordance with the signs of the multiplier value B, as represented by

A1·B1+A2·B2+A5·B5+A7·B7 (14)

A9·B9+A10·B10+A14·B14+A16·B16 (15)

A3·B3+A4·B4+A6·B6+A8·B8 (16)

A11·B11+A12·B12+A13·B13+A15·B15 (17)

where B1, B2, B5, B7, B9, B10, B14, B16≧0, and B3, B4, B6, B8, B11, B12, B13, B15<0.

As in the 18th embodiment, even when the total number of operations (12 in the above-described case) is not a multiple of the number of analog operation circuits (4), the number of operations can be adjusted by inputting an analog voltage Vw corresponding to the multiplier value B=0.

As in the 18th embodiment, the partial sums given by operational expressions (14) to (17) are calculated by the analog operation circuits 503. At this time, each partial sum is calculated as an absolute value without considering the positive/negative sign of the multiplier value B.

The calculated partial sums given by operational expressions (14) to (17) are converted into digital data by an A/D conversion circuit 550. The converted digital data are input to the digital adder-subtracter 538. The sign bit 539 representing the sign of the multiplier value B is also input to the digital adder-subtracter 538.

When the sign bit of the digital data of the input partial sum is 1 (the multiplier value B is positive), the digital adder-subtracter 538 adds the input digital data of the partial sum to the digital data held in the digital memory 526, as in the 18th embodiment.

On the other hand, when the sign bit of the digital data of the input partial sum is 0 (the multiplier value B is negative), the input digital data of the partial sum is subtracted from the digital data held in the digital memory 526.

As described above, the digital data of the partial sum is added to or subtracted from the digital data held in the digital memory in accordance with the sign bit, thereby calculating the desired accumulation value. As in the 18th embodiment, the accumulation value may further be subjected to desired operation processing. For example, a nonlinear conversion circuit may be connected to the subsequent stage of the digital memory such that a value obtained by nonlinearly converting the accumulation value can be output. In this case, the nonlinear conversion circuit can be implemented by a lookup table circuit or the like.

As described above, the analog/digital mixed operation circuit described in this embodiment can execute arbitrary operation processing for the calculated accumulation value. The nonlinear conversion circuit may be connected to the subsequent stage of the digital addition circuit. In this case, the nonlinear conversion circuit can be implemented by a lookup table circuit or the like.

More specifically, the accumulation value calculated by the digital addition circuit is input to the lookup table circuit. The accumulation value is nonlinearly converted by the lookup table circuit and then held in the digital memory.

In this case, nonlinear conversion may be executed for only the desired operation value (the finally calculated accumulation value, i.e., the value given by operational expression (13)) calculated by the digital addition circuit. The nonlinear conversion may not be executed for the accumulation value calculated in progress of operation processing. Any other arrangement can be used when it can nonlinearly convert the accumulation value.

The operation processing flow will be described next with reference to the flowchart shown in FIG. 59. The operation circuit which executes each processing step will also be mentioned in the description.

Figure 59:
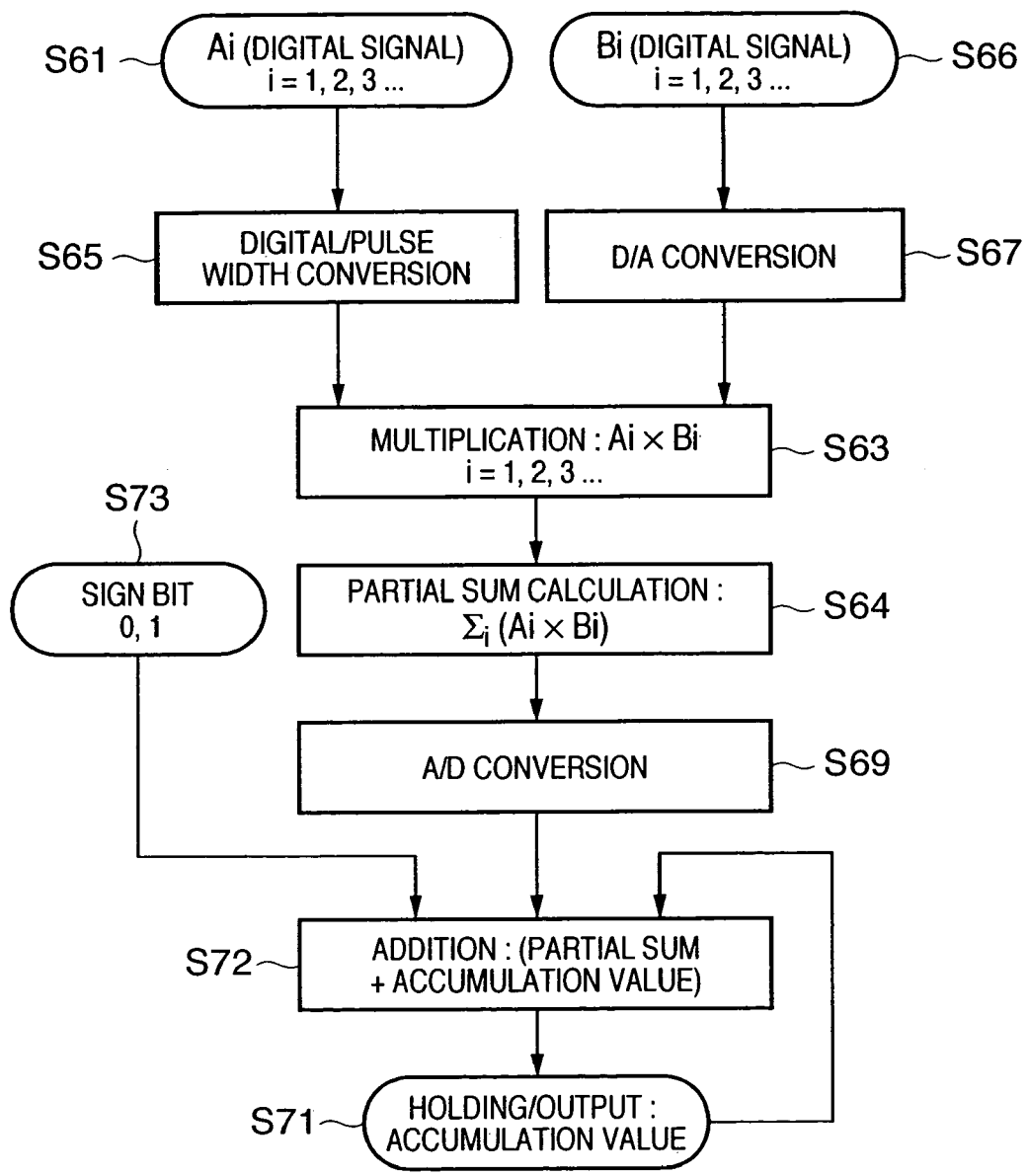
FIG. 59 is a flowchart showing operation processing according to the 19th embodiment.

Referring to FIG. 59, first, a digital signal Ai input step S61 is executed. Next, a step S65 of causing a digital/pulse width conversion circuit 502 to convert the digital signal into a PWM signal is executed. A digital signal Bi (voltage Vw) input step S66 is executed. A D/A conversion step S67 of causing the D/A conversion circuit to convert the digital signal into an analog signal is executed. A step S63 of causing each analog operation circuit to multiply the PWM signals as the outputs from the steps S65 and S67 by the analog voltage Vw is executed.

A step S64 of causing the capacitor to accumulate, as the charge amount, the products calculated in parallel by the analog operation circuits and hold a partial sum Σ(Ai×Bi) is executed. A step S69 of causing the A/D conversion circuit to A/D-convert the charge amount (voltage value) corresponding to the partial sum Σ(Ai×Bi) into a digital value is executed. A step S73 of inputting a sign bit representing the positive/negative sign of Bi to the digital adder-subtracter is executed. A step S72 of causing the digital adder-subtracter to execute operation processing of the digital value corresponding to the partial sum in accordance with the value of the input sign bit is executed.

More specifically, when the sign bit is 1 (Bi is positive), the digital adder-subtracter adds the digital value corresponding to the partial sum to the accumulation value (corresponding to the accumulation value in progress of operation) which is output in a step S71 and already held in the digital memory and calculates a new accumulation value.

When the sign bit is 0 (Bi is negative), the digital adder-subtracter subtracts the digital value corresponding to the partial sum from the accumulation value (corresponding to the accumulation value in progress of operation) which is output in the step S71 and already held in the digital memory and calculates a new accumulation value.

Finally, the step S71 of rewriting and holding the thus calculated accumulation value in the digital memory is executed. In this case, the accumulation value is overwritten on a corresponding part (a portion where the accumulation value in progress of operation is held) in the digital memory.

When the above-described operation flow is repeated a necessary number of times (four times in this embodiment) for calculating the accumulation value, the desired accumulation value is calculated.

As described above, the analog operation circuits 503 separately calculate the partial sums in correspondence with the positive/negative sign of the multiplier value B. Addition to or subtraction from the digital data held in the digital memory 526 is executed in correspondence with the positive/negative sign. With this processing, the accumulation value of multiplication results including the positive/negative sign can be calculated as indicated by $$(A_1 \cdot B_1 + A_2 \cdot B_2 + A_5 \cdot B_5 + A_7 \cdot B_7) + \quad (18)$$
$$(A_9 \cdot B_9 + A_{10} \cdot B_{10} + A_{14} \cdot B_{14} + A_{16} \cdot B_{16}) -$$
$$(A_3 \cdot B_3 + A_4 \cdot B_4 + A_6 \cdot B_6 + A_8 \cdot B_8) -$$
$$(A_{11} \cdot B_{11} + A_{12} \cdot B_{12} + A_{13} \cdot B_{13} + A_{15} \cdot B_{15}) = \sum_{i=1}^{16} Ai \times Bi$$

In the above operation, assume that the operation processing steps corresponding to the positive and negative signs of the multiplier value B are alternately executed, as indicated by $$(A_1 \cdot B_1 + A_2 \cdot B_2 + A_5 \cdot B_5 + A_7 \cdot B_7) + \quad (19)$$
$$(A_3 \cdot B_3 + A_4 \cdot B_4 + A_6 \cdot B_6 + A_8 \cdot B_8) -$$
$$(A_9 \cdot B_9 + A_{10} \cdot B_{10} + A_{14} \cdot B_{14} + A_{16} \cdot B_{16}) -$$
$$(A_{11} \cdot B_{11} + A_{12} \cdot B_{12} + A_{13} \cdot B_{13} + A_{15} \cdot B_{15}) = \sum_{i=1}^{16} Ai \times Bi$$

In this case, the positive and negative partial sums cancel each other. For this reason, the range of linear addition accuracy (the range of accumulation values) in the digital memory 526 becomes narrow, and the bit length of the digital memory 526 can be decreased.

For example, assume that the partial sums given by operational expressions (14) to (17) are (85, 53, 60, 71). If the values of the same sign are continuously added or subtracted, values stored in the digital memory 526 in progress of operation are as follows.

Storage value by first operation=85
Storage value by second operation=85+53=138
Storage value by third operation=138−60=78
Storage value by fourth operation=78−71=7

The maximum value in progress of operation of adding/subtracting the partial sum is 138. Hence, the bit length of the digital memory 526 must be 8 bits.

To the contrary, when the operations corresponding to the positive and negative signs are alternately executed, values stored in the digital memory 526 in progress of operation are as follows.

Storage value by first operation=85
Storage value by second operation=85−60=25
Storage value by third operation=25+53=78
Storage value by fourth operation=78−71=7

In this case, the maximum value in progress of operation of adding/subtracting the partial sum is 85. Hence, the bit length of the digital memory 526 must be 7 bits. That is, the bit length can be smaller than that in the above example.

20th EMBODIMENT

FIGS. 60A and 60B show an arrangement example of a neural network circuit according to the 20th embodiment. As shown in FIGS. 60A and 60B, as a characteristic feature, the neural network circuit according to this embodiment includes the analog/digital mixed operation circuit and digital/pulse width conversion circuit described in the 19th Embodiment.

To execute nonlinear conversion described in the 19th embodiment, a lookup table circuit is connected to the subsequent stage of the digital adder-subtracter.

Figure 61:
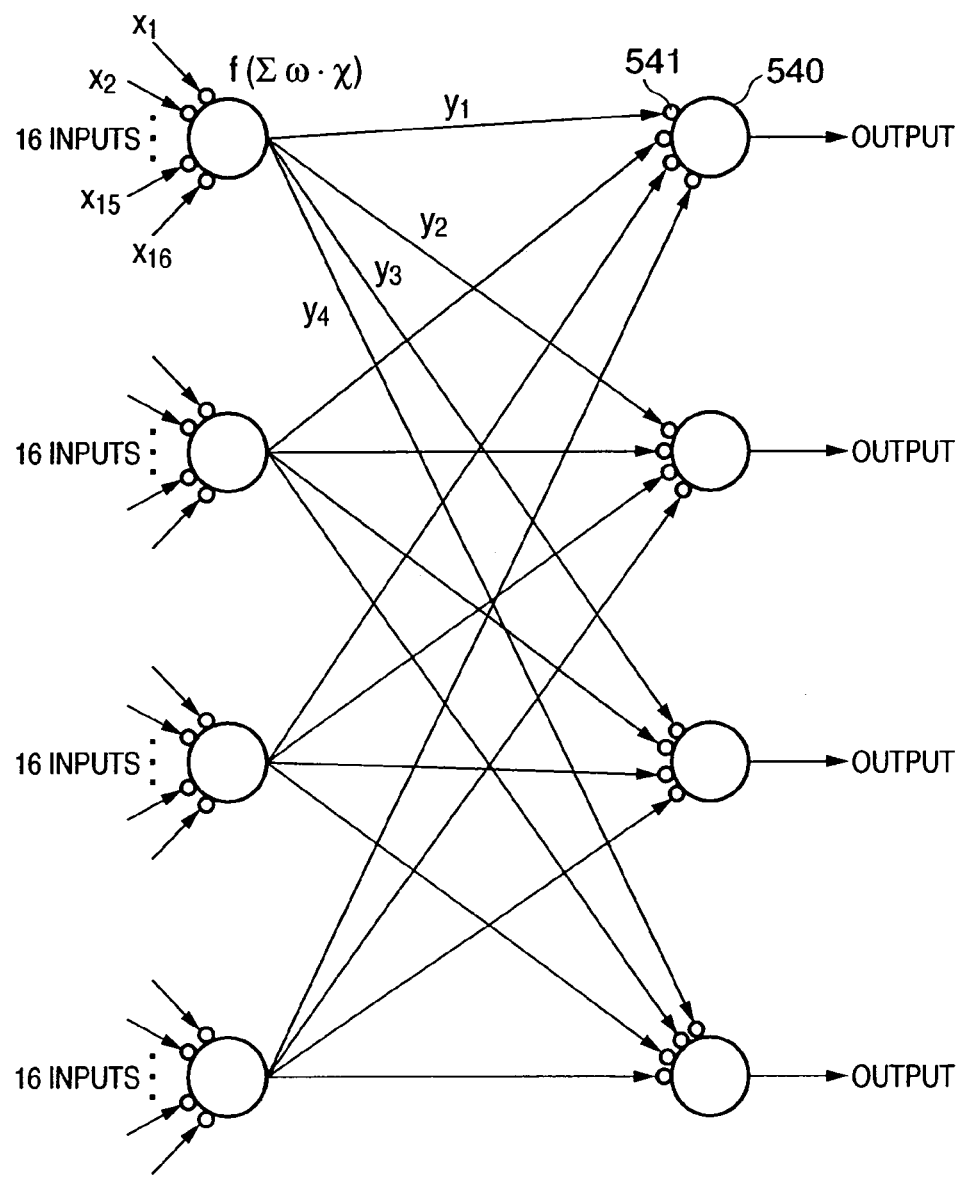
FIG. 61 is a view showing the arrangement of a neural network model.

FIG. 61 is a view showing the arrangement of a neural network model implemented in this embodiment. The neural network model of this embodiment will be described first with reference to FIG. 61. Then, the neural network circuit according to this embodiment will be described with reference to FIGS. 60A and 60B.

As shown in FIG. 61, in the neural network of this embodiment, a plurality of neurons 540 form a hierarchical structure. Neurons of different layers are connected through synapses 541.

In addition to this embodiment, a neural network can have neurons arranged in an array. As connection between the neurons, two neurons can be connected to each other. The neural network according to the present invention is not limited by its arrangement or connection method. Any other structure and connection method except the hierarchical structure of this embodiment can be used.

Operation processing in each neuron 540 will be described next. Each neuron 540 weights the output values from the plurality of neurons connected to the preceding stage by a synaptic weight and receives the values as inputs. In the neuron, the sum of the input values is calculated. The sum is subjected to predetermined conversion and output as an output value. The operation processing in each neuron can be represented by $$y = f(\Sigma \omega \cdot x) \quad (20)$$

where y: output value, f: conversion function, ω: synaptic weight, x: output value from neuron of preceding stage.

As the conversion function, various models have been proposed. This embodiment uses a general sigmoid function given by $$f(u) = \{1 + \exp(-au)\}^{-1} \quad (21)$$

where a: parameter which determines gradient of sigmoid function. FIG. 34 shows the characteristic of the sigmoid function.

The neural network according to the present invention is not limited by the conversion method in the neuron. Any other conversion function except the sigmoid function of this embodiment may be applied.

The neural network circuit according to this embodiment will be described next with reference to FIGS. 60A and 60B. As is apparent from FIGS. 60A and 60B, the neural network circuit of this embodiment includes a hierarchical structure of analog/digital mixed operation circuits described in the 19th embodiment.

As described above, in the operation circuit of this embodiment, a lookup table circuit is connected to the subsequent stage of the adder-subtracter. More specifically, the desired accumulation result calculated by the digital adder-subtracter undergoes sigmoid conversion by the lookup table circuit and is then held in a digital memory circuit. The sigmoid conversion by the lookup table circuit is executed for only the desired operation result that is finally calculated. The sigmoid conversion is not executed for data in progress of accumulation.

Hence, FIGS. 60A and 60B illustrate two systems: one system inputs the output from the digital adder-subtracter to the lookup table circuit, and the other system inputs the output from the digital adder-subtracter directly to the digital memory.

Additionally, in the analog/digital mixed operation circuit to be described in this embodiment, to execute hierarchical operation processing, an operation result calculated by an analog/digital mixed operation circuit of a layer is input to an analog/digital mixed operation circuit of the next layer. At this time, the operation result held in the digital memory is read out as a PWM signal by the digital/pulse width conversion circuit. The PWM signal generation process is the same as that described in the 15th Embodiment.

The operation processing by the analog/digital mixed operation circuit of each layer is the same as in the 19th embodiment. An analog voltage Vw corresponding to a multiplier value B is input to the analog operation circuit, although it is not illustrated in FIGS. 60A and 60B. The step of inputting the analog voltage Vw is the same as in the 19th Embodiment.

In the operation processing by the analog/digital mixed operation circuit of this embodiment, the partial sum held in the capacitor indicates the sum of input values related to part of connection to the neuron of the preceding stage in each neuron. The accumulation value finally held in the digital memory indicates the accumulation value of input values of all the connected neurons of the preceding stage in each neuron. The nonlinear conversion (sigmoid conversion) using the sigmoid function shown in FIG. 34 is implemented by the nonlinear conversion circuit (lookup table circuit), as described above.

Figure 62A:
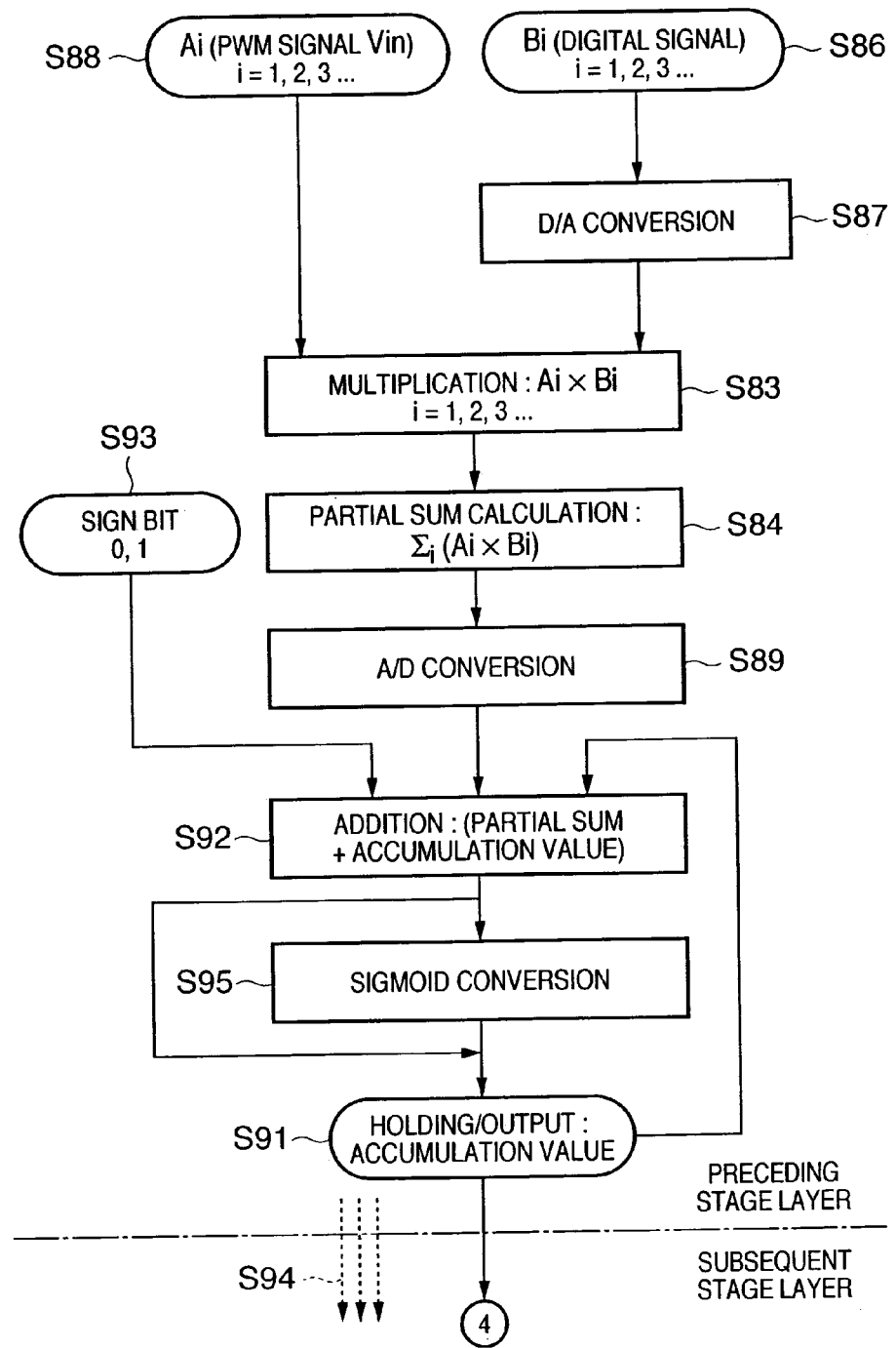
FIGS. 62A and 62B are flowcharts showing operation processing according to the 20th embodiment.
Figure 62B:
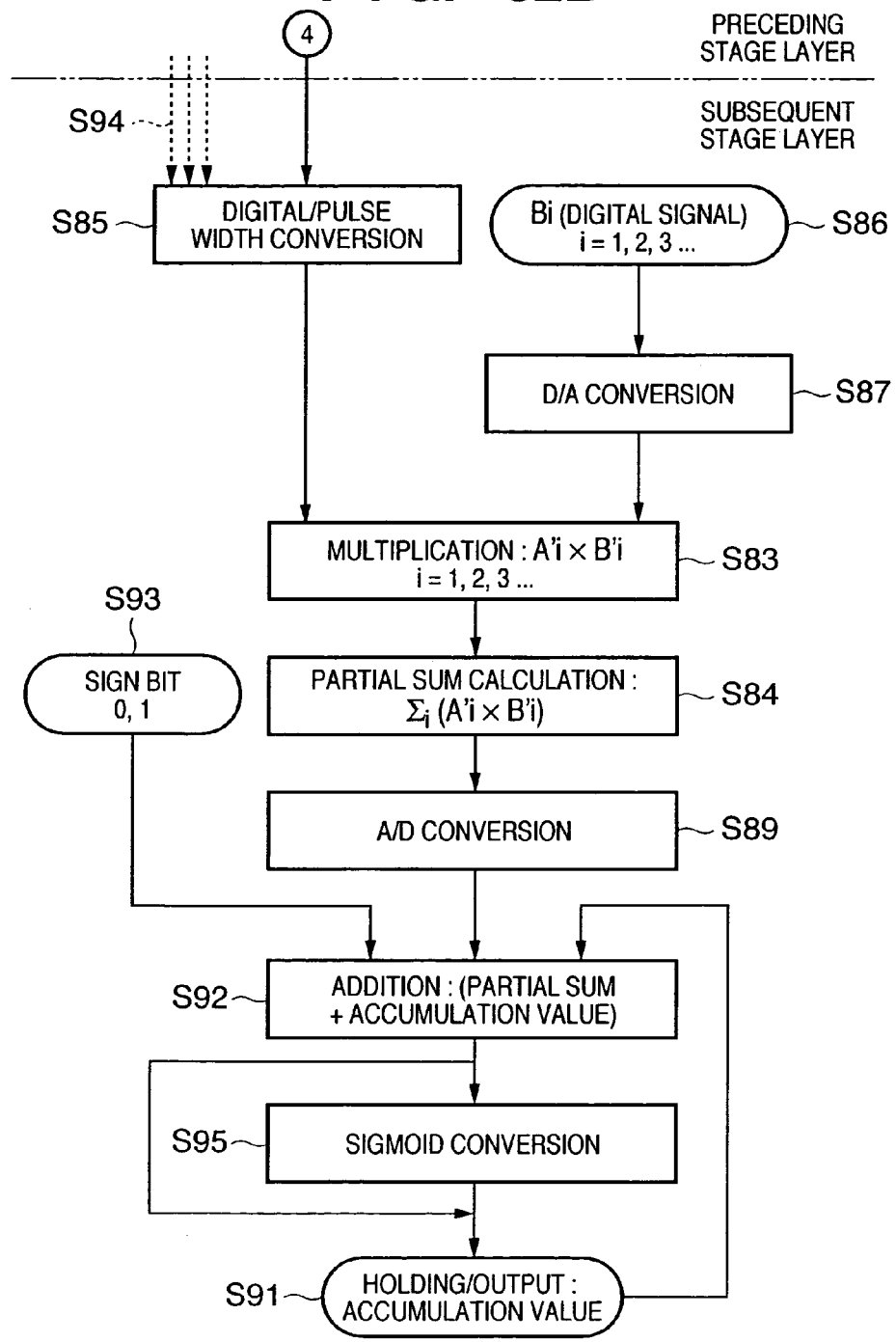

FIGS. 62A and 62B show the above-described operation processing flow. The alternate long and short dashed line in FIGS. 62A and 62B indicates the boundary between the preceding stage layer and the subsequent stage layer in operation processing.

First, the calculated desired accumulation value of the preceding stage layer is converted by sigmoid conversion (S95) and temporarily held in the digital memory as a digital value (S91). Then, a step S85 of causing the digital/pulse width conversion circuit to convert the digital value into a PWM signal is executed. In this embodiment, after the desired accumulation value is calculated, a sigmoid conversion step (S95) is executed by the lookup table circuit only once. The processing steps except the sigmoid conversion step S95 in the preceding stage layer are the same as in the operation processing of the 19th embodiment.

The PWM signal is input to the subsequent stage layer as an input signal Ai. Like the operation processing in the preceding stage layer, the operation processing executed in the subsequent stage layer is the same as that described in the sixth embodiment except the processing step by the sigmoid conversion step S95. A description of the operation processing flow that is the same as in the 19th embodiment will be omitted. Referring to FIGS. 62A and 62B, the plurality of remaining Ai input steps are indicated by dotted arrows S94.

As described above, the accumulation value in each neuron, which is held in the digital memory, is read out as a PWM signal by the digital/pulse width conversion circuit and output to the neuron of the next layer. Accordingly, the neural network model shown in FIG. 61 can be implemented. The number of neuron elements and the number of layers in this embodiment do not limit the arrangement of the neural network according to the present invention. These numbers can be set to arbitrary numbers as needed.

21st EMBODIMENT

Figure 63A:
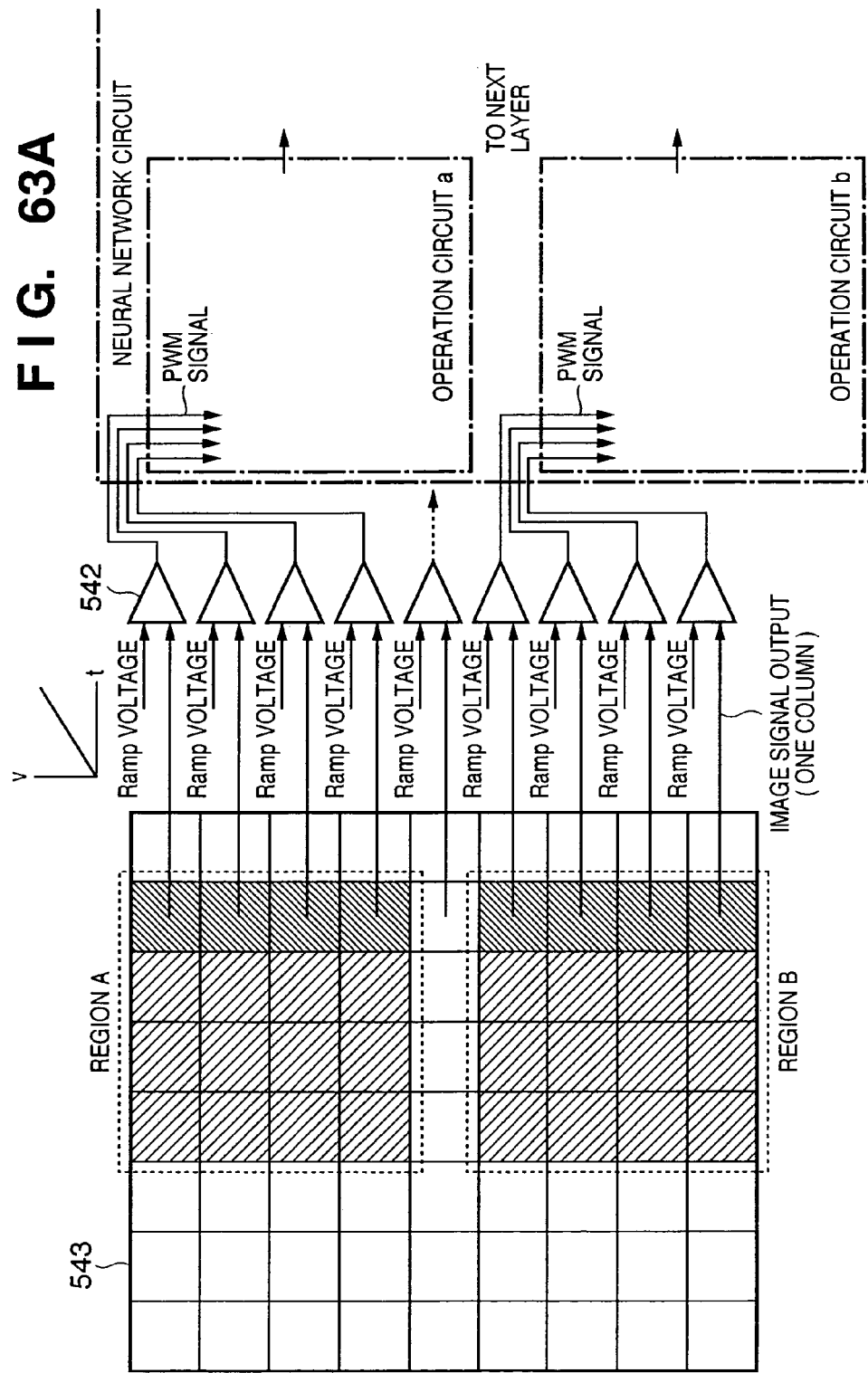
FIGS. 63A and 63B are block diagrams showing an arrangement example of an image signal processing circuit having a neural network circuit according to the 21st embodiment.
Figure 63B:
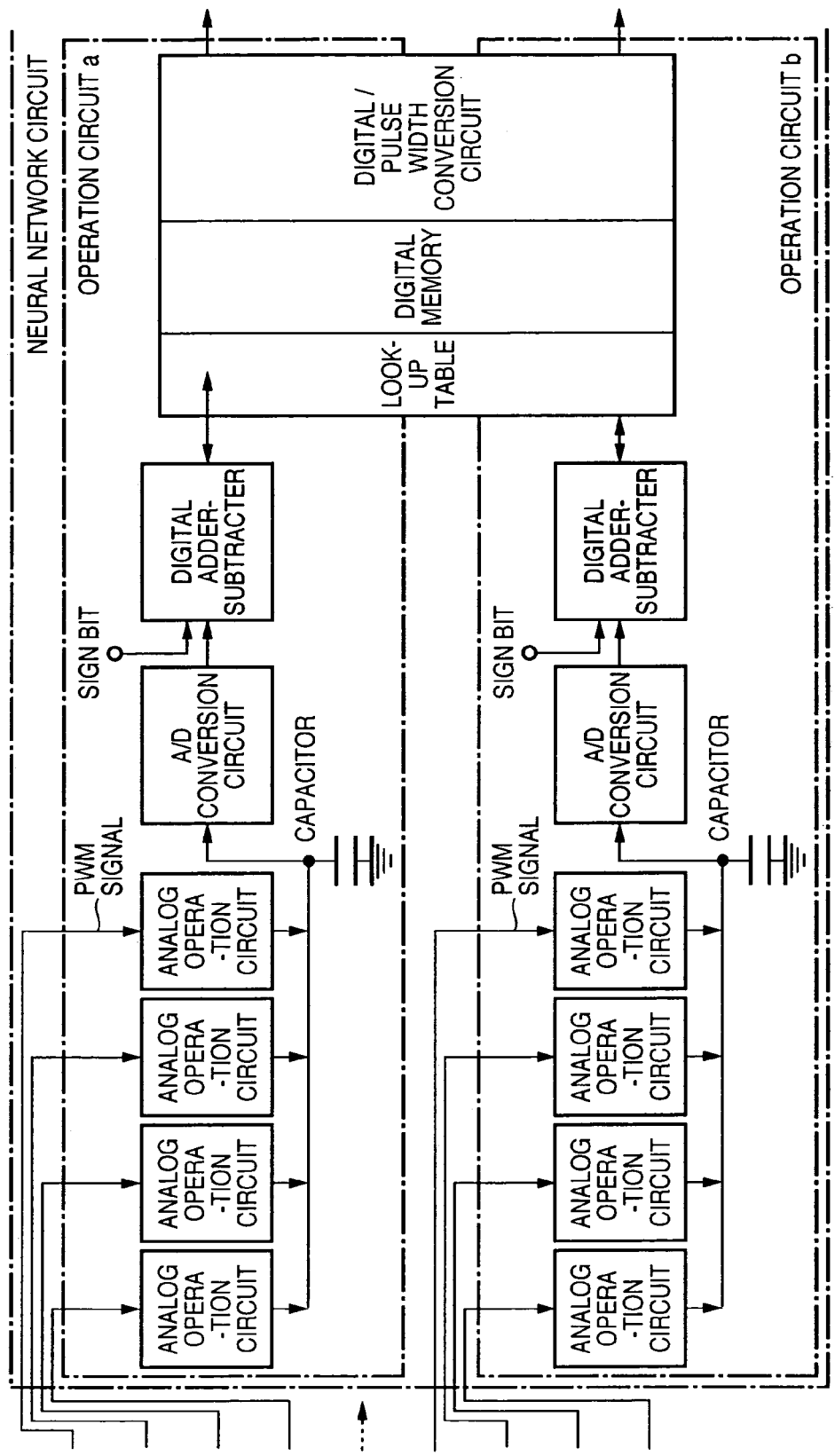

FIGS. 63A and 63B show an arrangement example of an image signal processing circuit according to the 21st embodiment. As shown in FIGS. 63A and 63B, as a characteristic feature, the image signal processing circuit of this embodiment includes the neural network circuit shown in FIGS. 60A and 60B described in the 20th embodiment. FIGS. 63A and 63B show only the first stage of the hierarchical structure described in the fifth embodiment and does not illustrate the subsequent layers.

The number of analog/digital mixed operation circuits in the neural network circuit is different from that in the neural network circuit shown in FIGS. 60A and 60B described in the 20th embodiment. However, the operation itself in each analog/digital mixed operation circuit is the same as in the 20th embodiment.

Referring to FIGS. 63A and 63B, the lookup table circuit, digital memory, and digital/pulse width conversion circuit are illustrated as an integrated structure simply because the space is limited. The actual arrangement and operation processing are the same as in the 20th embodiment (FIGS. 60A and 60B).

The signal input to the analog operation circuit in the neural network circuit as a PWM signal is an image signal as a two-dimensional signal. More specifically, an object of the image signal processing circuit according to this embodiment is to execute desired image processing (e.g., pattern detection and pattern recognition) by causing the neural network circuit to execute a predetermined operation for an input image signal.

The contents of image processing to be actually realized can be set by appropriately adjusting the circuit parameter and the like of the neural network circuit such that desired processing contents (e.g., pattern detection and pattern recognition) are realized. A detailed adjusting method is not the gist of the present invention, and a description thereof will be omitted.

In this embodiment, the image signal is input as a PWM signal obtained by converting a signal intensity corresponding to each pixel, which is output from an image sensing device 543 (e.g., a CCD or CMOS image sensor), into the time width of a pulse.

If the output signal from the image sensing device is an analog signal, and the signal is to be converted into a PWM signal, as shown in FIGS. 63A and 63B, a ramp voltage waveform input to a comparator 542 is compared by the comparator 542 with a voltage value read from the image sensing device. When the output which rises to High level at the start of the ramp voltage waveform falls to Low level when the ramp voltage value equals the voltage value of the capacitor, the signal is converted into a PWM signal.

If the output signal from the image sensing device 543 is a digital signal, and the signal is to be converted into a PWM signal, the signal is converted into a PWM signal by the digital/pulse width conversion circuit, as described in the 15th embodiment. The image sensing device is assumed to be a CCD or CMOS image sensor. Any other image sensing device can also be used without any problem as long as it receives an image as a two-dimensional signal.

A method of inputting an image signal to the neural network circuit will be described next.

The neural network circuit causes analog/digital mixed operation circuits a and b to execute a weighted operation for a plurality of predetermined input signals, calculate the accumulation value of them to set the internal state value of a corresponding neuron, and further execute nonlinear conversion, as described in the 20th embodiment.

At this time, in the image processing circuit of this embodiment, the plurality of input signals processed by each of the analog/digital mixed operation circuits a and b surrounded by the alternate long and short dashed lines correspond to some regions of the image sensing device 543 having a two-dimensional array.

More specifically, as shown in FIGS. 63A and 63B, in the analog/digital mixed operation circuits a and b, the regions in which image signals which are to be subjected to nonlinear conversion and weighted operation and also accumulation value calculation are indicated by regions A and B surrounded by the broken lines. The image signals from the image sensing device 543 are output for each column.

To the contrary, the analog operation circuit in the neural network circuit can execute the operation for the image signal outputs of one column in parallel, as described in the 15th to 20th embodiments.

Hence, the operation result by the neural network circuit for the output signals of one column from the image sensing device 543 corresponds to the partial sum corresponding to the internal state value of each neuron, as described in the 15th to 20th embodiments.

When the operation processing is repeated a number of times (four times in this embodiment) equal to the number of columns of the regions A and B, the accumulation value corresponding to the internal state value of each neuron can be calculated.

Figure 64A:
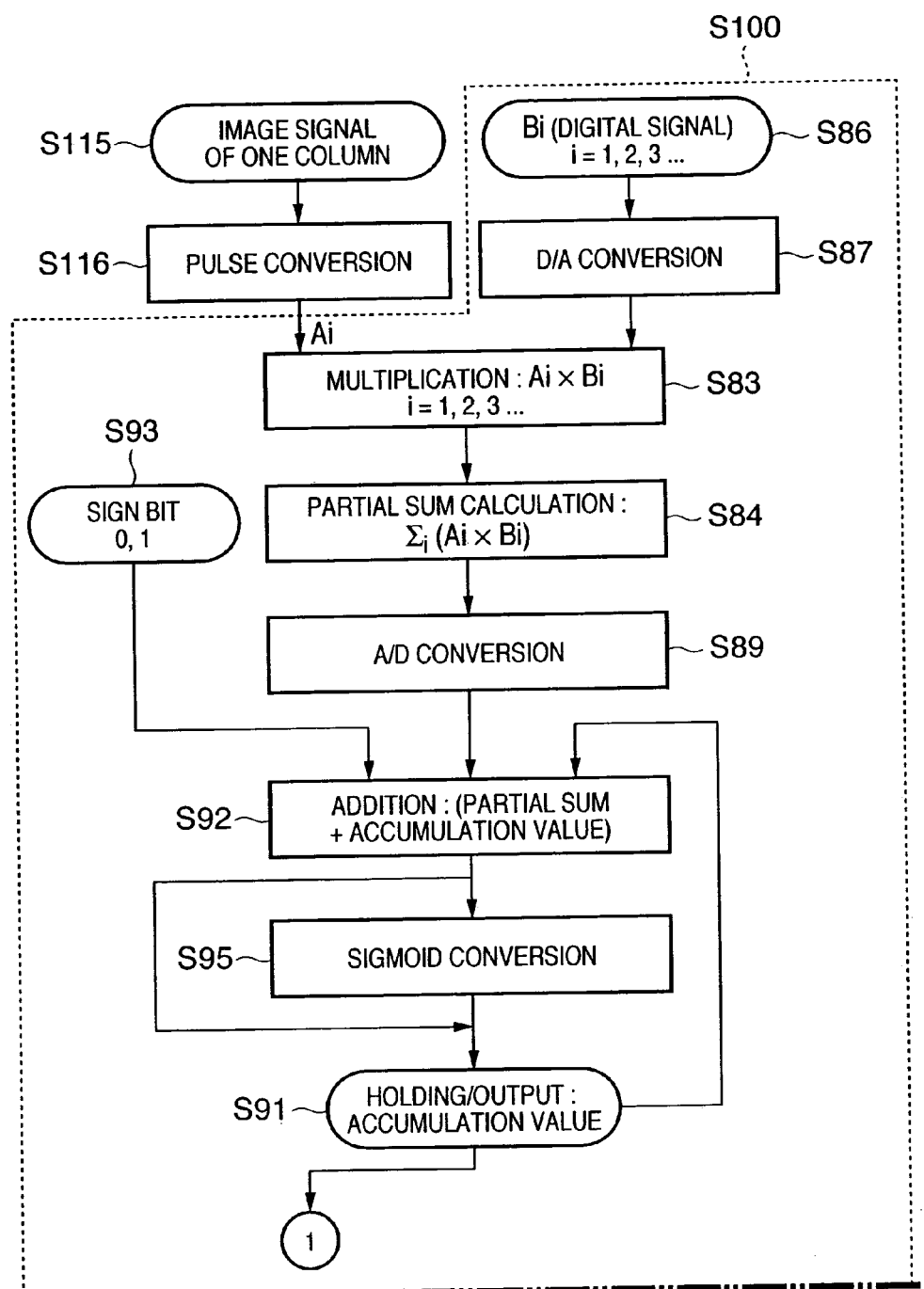
FIGS. 64A and 64B are flowcharts showing operation processing according to the 21st embodiment.
Figure 64B:
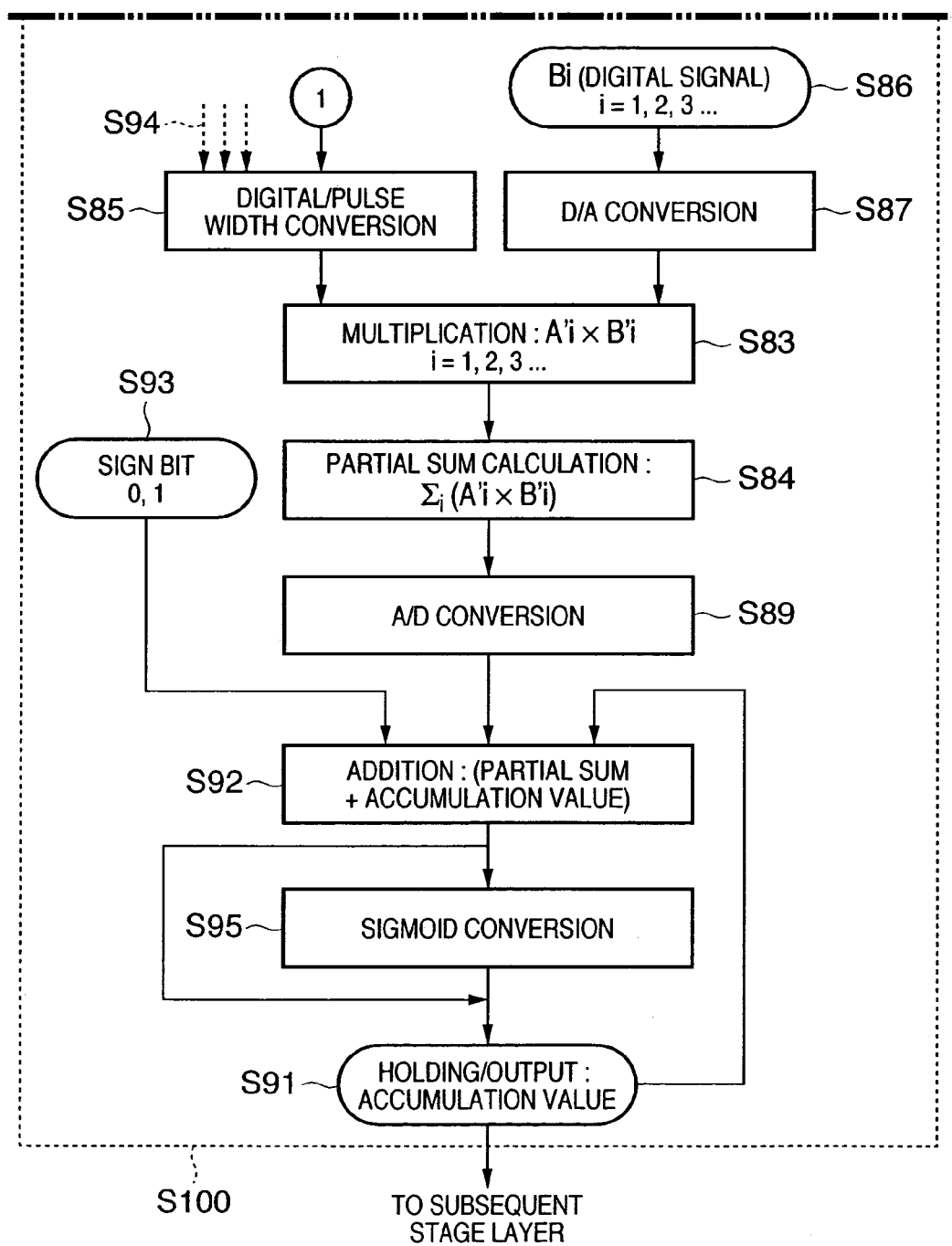

FIGS. 64A and 64B show the above-described operation processing flow.

First, a step S115 of inputting an image signal coarsening to one column output from the image sensing device is executed. A step S116 of causing a circuit such as a comparator to convert the input image signal into a PWM signal is executed. Subsequently, the PWM signal is input to a multiplication step S103 (on the upper side of FIGS. 64A and 64B) as a PWM signal corresponding to Ai.

The subsequent operation processing flow is the same as in the 20th embodiment except that the operation processing is executed for a predetermined number of layers by the neural network circuit (a portion S100 surrounded by a dotted frame in FIGS. 64A and 64B indicates the same operation processing flow as in the 20th embodiment). A description of the operation processing flow which is the same as in the 20th embodiment will be omitted. In the operation processing for a predetermined number of layers, the operation processing flow is repeated a predetermined number of times, and a description thereof will be omitted.

As described above, when the operation processing by the neural network circuit is repeated a number of times equal to the number of columns of the operation target region, desired operation processing (e.g., pattern detection and pattern recognition) can be achieved.

In the above description, image signal output from the image sensing device is executed for each column. Even when the signal output from the image sensing device is executed for each row, the same processing as described above can be executed by executing the operation in the neural network circuit in parallel for the output signal of each row.

As described above, when the operation by the neural network circuit of this embodiment is applied to an image signal output for each column or each row, the internal state value of the neuron is operated as a partial sum for each column or each row, the final internal state value is calculated as the accumulation value of the partial sums, and the result is nonlinearly converted, desired operation processing can be achieved.

As many apparently widely different embodiments of the present invention can be made without departing from the spirit and scope thereof, it is to be understood that the invention is not limited to the specific embodiments thereof except as defined in the appended claims.

The invention claimed is:

1. A product-sum operation circuit comprising:
   a pulse with/digital conversion circuit which converts a pulse signal having a pulse width representing an operand value into a digital signal;
   a sorting circuit which outputs, in descending or ascending order of magnitude, a plurality of operand values converted into digital signals by said pulse width/digital conversion circuit;
   a multiplication circuit which multiplies each operand value output from said sorting circuit by a corresponding operand value; and
   an accumulated sum circuit which calculates an accumulated sum of multiplication results by said multiplication circuit,
   wherein said pulse width/digital conversion circuit comprises
   a counter which counts a clock and outputs a count value as a digital signal, and
   a plurality of trailing edge latch circuits each of which latches a common count value output from said counter at a trailing edge of the input pulse signal,
   and wherein said pulse with/digital conversion circuit further comprises, in correspondence with each of said plurality of trailing edge latch circuits,
   a leading edge latch circuit which latches the count value output from said counter at a leading edge of the pulse signal, and
   a subtraction circuit which operates and outputs a difference between a digital output value from said trailing edge latch circuit and a digital output value from said leading edge latch circuit.

2. The product-sum operation circuit according to claim 1, wherein said sorting circuit outputs, of the plurality of operand values, operand values not less than a predetermined value.

3. The product-sum operation circuit according to claim 1, wherein said sorting circuit outputs a constant value in place of operand values less than a predetermined value in the plurality of operand values.

4. The product-sum operation circuit according to claim 1, wherein said sorting circuit outputs, of the plurality of operand values, operand values corresponding to a predetermined ratio in descending or ascending order of magnitude.

5. The product-sum operation circuit according to claim 1, wherein said sorting circuit outputs a constant value in place of operand values except operand values corresponding to a predetermined ratio in descending or ascending order of magnitude in the plurality of operand values.

6. A product-sum operation circuit comprising:
   a pulse width/digital conversion circuit which converts a pulse signal having a pulse width representing an operand value into a digital signal;

a sorting circuit which outputs, in descending or ascending order of magnitude, a plurality of operand values converted into digital signals by said pulse width/digital conversion circuit;

a multiplication circuit which multiplies each operand value output from said sorting circuit by a corresponding operand value;

an accumulated sum circuit which calculates an accumulated sum of multiplication results by said multiplication circuit; and a D/A conversion circuit which converts each operand value output from said sorting circuit as a digital value into an analog signal and supplies the analog signal to said multiplication circuit, wherein said pulse width/digital conversion circuit comprises a first counter which counts a clock and outputs a count value as a digital signal, and a plurality of trailing edge latch circuits each of which latches a common count value output from said counter at a trailing edge of the input pulse signal, said D/A conversion circuit including a digital/pulse width conversion circuit which converts each digital operand value into a pulse signal having a pulse width corresponding to the operand value, said digital/pulse width conversion circuit comprising:

a second counter which counts a clock and outputs a count value as a digital signal, and a plurality of pulse generation circuits each of which compares the digital input value from said sorting circuit with the common count value output from said second counter and generates one of an output pulse signal having a time width from a predetermined time to a time when the input value coincides with the count value and an output pulse signal having a time width from a time when a value obtained by subtracting the input value from a predetermined maximum count value coincides with the count value to a time when the count value reaches the maximum count value.

7. The product-sum operation circuit according to claim 6, wherein each of said plurality of pulse generation circuits comprises a pulse width register which latches the input value from said sorting circuit, a timing trigger generation circuit which compares each bit of the input value latched by said pulse width register with each bit of the count value output from said second counter and generates a trigger when the bits perfectly coincide, and an output pulse inverting circuit which inverts a truth value of the output pulse signal upon generation of the trigger by said timing trigger generation circuit.

8. The product-sum operation circuit according to claim 6, wherein each of said plurality of pulse generation circuits comprises a reference value register which latches a reference value as a digital value representing a timing of a leading edge of the output pulse, an addition circuit which outputs a sum of the reference value and the input value as the digital value input from said sorting circuit, a pulse width register which latches the output value from said addition circuit, a switching circuit which selectively outputs one of the digital value latched by said reference value register and the digital value latched by said pulse width register, a timing trigger generation circuit which compares each bit of a digital value output from said switching circuit with each bit of the count value output from said second counter and generates a trigger when the bits perfectly coincide, and an output pulse inverting circuit which inverts a truth value of the output pulse signal upon generation of the trigger by said timing trigger generation circuit, and said switching circuit executes switching to output the digital value latched by said reference value register upon output of an output pulse having a false value from said output pulse inverting circuit and output the digital value latched by said pulse width register upon output of an output pulse having a true value from said output pulse inverting circuit.

9. The product-sum operation circuit according to claim 1, further comprising a plurality of operation blocks each including said multiplication circuit and said accumulated sum circuit.

10. The product-sum operation circuit according to claim 9, wherein said plurality of operation blocks execute an operation in parallel.

11. A product-sum operation circuit comprising:

a pulse width/digital conversion circuit which converts a pulse signal having a pulse width representing an operand value into a digital signal;

a sorting circuit which outputs, in descending or ascending order of magnitude, a plurality of operand values converted into digital signals by said pulse width/digital conversion circuit; and a plurality of operation blocks, each including a multiplication circuit which multiplies each operand value output from said sorting circuit by a corresponding operand value, and an accumulated sum circuit which calculates an accumulated sum of multiplication results by said multiplication circuit, wherein said pulse width/digital conversion circuit comprises a counter which counts a clock and outputs a count value as a digital signal, and a plurality of trailing edge latch circuits each of which latches a common count value output from said counter at a trailing edge of the input pulse signal, each of the plurality of operand values includes a label, and each operand value is multiplied in the operation block corresponding to the label.

12. The product-sum operation circuit according to claim 11, further comprising a switch circuit which switches a path to input each operand value to the operation circuit corresponding to the label.

13. A product-sum operation circuit comprising:

a pulse width/digital conversion circuit which converts a pulse signal having a pulse width representing an operand value into a digital signal;

a sorting circuit which outputs, in descending or ascending order of magnitude, a plurality of operand values converted into digital signals by said pulse width/digital conversion circuit;

a multiplication circuit which multiplies each operand value output from said sorting circuit by a corresponding operand value; and an accumulated sum circuit which calculates an accumulated sum of multiplication results by said multiplication circuit,
wherein said pulse width/digital conversion circuit comprises
a counter which counts a clock and outputs a count value as a digital signal, and
a plurality of trailing edge latch circuits each of which latches a common count value output from said counter at a trailing edge of the input pulse signal,
wherein said multiplication circuit executes a weighting operation of assigning a weight value to each operand value.

14. A product-sum operation circuit comprising:
a pulse width/digital conversion circuit which converts a pulse signal having a pulse width representing an operand value into a digital signal;
a sorting circuit which outputs, in descending or ascending order of magnitude, a plurality of operand values converted into digital signals by said pulse width/digital conversion circuit;
a multiplication circuit which multiplies each operand value output from said sorting circuit by a corresponding operand value; and
an accumulated sum circuit which calculates an accumulated sum of multiplication results by said multiplication circuit,
wherein said pulse width/digital conversion circuit comprises
a counter which counts a clock and outputs a count value as a digital signal, and
a plurality of trailing edge latch circuits each of which latches a common count value output from said counter at a trailing edge of the input pulse signal,
wherein the plurality of operand values are digital signals, and said sorting circuit outputs the plurality of operand values in descending or ascending order of magnitude by using an associative memory.

15. A product-sum operation circuit comprising:
a pulse width/digital conversion circuit which converts a pulse signal having a pulse width representing an operand value into a digital signal;
a sorting circuit which outputs, in descending or ascending order of magnitude, a plurality of operand values converted into digital signals by said pulse width/digital conversion circuit;
a multiplication circuit which multiplies each operand value output from said sorting circuit by a corresponding operand value;
an accumulated sum circuit which calculates an accumulated sum of multiplication results by said multiplication circuit,
wherein said pulse width/digital conversion circuit comprises
a counter which counts a clock and outputs a count value as a digital signal, and
a plurality of trailing edge latch circuits each of which latches a common count value output from said counter at a trailing edge of the input pulse signal; and
a signal output circuit which outputs a voltage signal which monotonically increases or decreases over time to said multiplication circuit in accordance with the output from said sorting circuit.

16. The product-sum operation circuit according to claim 15, wherein said signal output circuit comprises means for multiplying the voltage signal by a predetermined coefficient.

17. A product-sum operation circuit comprising:
a pulse width/digital conversion circuit which converts a pulse signal having a pulse width representing an operand value into a digital signal;
a sorting circuit which outputs, in descending or ascending order of magnitude, a plurality of operand values converted into digital signals by said pulse width/digital conversion circuit;
a multiplication circuit which multiplies each operand value output from said sorting circuit by a corresponding operand value; and
an accumulated sum circuit which calculates an accumulated sum of multiplication results by said multiplication circuit,
wherein said pulse width/digital conversion circuit comprises
a counter which counts a clock and outputs a count value as a digital signal, and
a plurality of trailing edge latch circuits each of which latches a common count value output from said counter at a trailing edge of the input pulse signal,
wherein said multiplication circuit receives a voltage value corresponding to the operand value as a control voltage of a voltage controlled current source and a voltage controlled resistive device and outputs a multiplication result as a voltage value.

18. A neural network having a plurality of stages of neuron elements, wherein
each neuron element includes a product-sum operation circuit according to claim 13,
said pulse width/digital conversion circuit receives an output value from a neuron element at a preceding stage as the operand value,
said multiplication circuit multiplies each operand value by a synaptic weight as a corresponding operand value, and
said accumulated sum circuit calculates an internal state value as the accumulated sum.

19. A method of executing a product-sum operation, comprising the steps of:
(a) converting a pulse signal having a pulse width representing an operand value into a digital signal;
(b) outputting, in descending or ascending order of magnitude, the plurality of operand values converted into the digital signals;
(c) multiplying each output operand value by a corresponding operand value; and
(d) calculating an accumulated sum of multiplication results in the step (c), wherein the step (a) comprises the steps of
(a-1) causing a counter to count a clock and output a count value as a digital signal,
(a-2) causing a plurality of trailing edge latch circuits to latch a common count value output from the counter at a trailing edge of the input pulse signal
(a-3) causing a leading edge latch circuit to latch the count value output from said counter at a leading edge of the pulse signal in correspondence with each of the plurality of trailing edge latch circuits, and
(a-4) causing a subtraction circuit to operate and output a difference between a digital output value from said trailing edge latch circuit and a digital output value from said leading edge latch circuit in correspondence with each of the plurality of trailing edge latch circuits.

20. An operation circuit which calculates an accumulation value of operation results by parallel operation processing, comprising:

a plurality of analog operation circuits each of which executes operation processing of information represented by an analog signal;
a capacitor which accumulates, as a charge amount, a sum of the operation results by said plurality of analog operation circuits;
a comparator which converts the charge amount accumulated in said capacitor into a pulse signal having a corresponding pulse width;
a pulse width/digital conversion circuit which converts the pulse signal into a digital signal; and
a digital operation circuit which calculates the accumulation value on the basis of the converted digital signal,
wherein said pulse width/digital conversion circuit comprises
a counter which counts a clock and outputs a count value as a digital signal, and
a plurality of trailing edge latch circuits each of which latches a common count value output from said counter at a trailing edge of the input pulse signal,
and wherein said pulse width/digital conversion circuit further comprises, in correspondence with each of said plurality of trailing edge latch circuits,
a leading edge latch circuit which latches the count value output from said counter at a leading edge of the pulse signal, and
a subtraction circuit which operates and outputs a difference between a digital output value from said trailing edge latch circuit and a digital output value from said leading edge latch circuit.

21. The operation circuit according to claim 20, wherein said digital operation circuit selectively executes addition processing and subtraction processing of the digital signal obtained by said pulse width/digital conversion circuit on the basis of information related to positive/negative of the operation result by said analog operation circuit to calculate the accumulation value of the digital signal.

22. The operation circuit according to claim 20, wherein said capacitor connects said plurality of analog operation circuits in parallel.

23. An operation circuit which calculates an accumulation value of operation results by parallel operation processing comprising:
a plurality of analog operation circuits each of which executes operation processing of information represented by an analog signal;
a capacitor which accumulates, as a charge amount, a sum of the operation results by said plurality of analog operation circuits;
a comparator which converts the charge amount accumulated in said capacitor into a pulse signal having a corresponding pulse width;
a pulse width/digital conversion circuit which converts the pulse signal into a digital signal; and
a digital operation circuit which calculates the accumulation value on the basis of the converted digital signal,
wherein said pulse width/digital conversion circuit comprises
a counter which counts a clock and outputs a count value as a digital signal, and
a plurality of trailing edge latch circuits each of which latches a common count value output from said counter at a trailing edge of the input pulse signal,
wherein said capacitor accumulates a charge amount corresponding to a partial sum of the calculated accumulation value on the basis of the input analog signal.

24. An operation circuit which calculates an accumulation value of operation results by parallel operation processing comprising:
a plurality of analog operation circuits each of which executes operation processing of information represented by an analog signal;
a capacitor which accumulates, as a charge amount, a sum of the operation results by said plurality of analog operation circuits;
a comparator which converts the charge amount accumulated in said capacitor into a pulse signal having a corresponding pulse width;
a pulse width/digital conversion circuit which converts the pulse signal into a digital signal; and
a digital operation circuit which calculates the accumulation value on the basis of the converted digital signal,
wherein said pulse width/digital conversion circuit comprises
a counter which counts a clock and outputs a count value as a digital signal, and
a plurality of trailing edge latch circuits each of which latches a common count value output from said counter at a trailing edge of the input pulse signal,
wherein said digital operation circuit executes processing every time the operation processing by said plurality of analog operation circuits is ended.

25. The operation circuit according to claim 20, wherein said analog operation circuit multiplies the analog signal by a predetermined weight value.

26. An operation circuit which calculates an accumulation value of operation results by parallel operation processing comprising:
a plurality of analog operation circuits each of which executes operation processing of information represented by an analog signal;
a capacitor which accumulates, as a charge amount, a sum of the operation results by said plurality of analog operation circuits;
a comparator which converts the charge amount accumulated in said capacitor into a pulse signal having a corresponding pulse width;
a pulse width/digital conversion circuit which converts the pulse signal into a digital signal; and
a digital operation circuit which calculates the accumulation value on the basis of the converted digital signal,
wherein said pulse width/digital conversion circuit comprises
a counter which counts a clock and outputs a count value as a digital signal, and
a plurality of trailing edge latch circuits each of which latches a common count value output from said counter at a trailing edge of the input pulse signal,
wherein said analog operation circuit executes predetermined nonlinear conversion for the analog signal.

27. The operation circuit according to claim 26,
wherein said analog operation circuit multiplies an output value of the nonlinear conversion by a predetermined weight value.

28. The operation circuit according to claim 20, wherein the accumulation value calculated on the basis of the analog signal is equivalent to an internal state value of a neuron included in a neural network which receives the analog signal as an input value.

29. The operation circuit according to claim 20, wherein the charge amount accumulated in said capacitor is equivalent to an internal state value of a neuron included in a neural network which receives the analog signal as an input value.

30. The operation circuit according to claim 20, wherein:
the analog signal is an image signal, and
said analog operation circuit executes the operation processing of the image signal for each row.

31. The operation circuit according to claim 20, further comprising:
a memory which holds digital data,
wherein said digital operation circuit adds the digital data held in said memory to the converted digital signal, and said memory holds a sum to calculate the accumulation value.

32. The operation circuit according to claim 20, further comprising:
a memory which holds digital data,
wherein upon output of a positive operation result from said analog operation circuit, said digital operation circuit adds the digital data held in said memory to the digital signal converted by said pulse width/digital conversion circuit, and said memory holds a sum, and
upon output of a negative operation result from said analog operation circuit, said digital operation circuit subtracts the digital signal converted by said pulse width/digital conversion circuit from the digital data held in said memory, and said memory holds a difference to calculate the accumulation value.

33. The operation circuit according to claim 21, wherein said digital operation circuit alternately executes the addition processing and the subtraction processing.

34. An operation circuit which calculates an accumulation value of operation results by parallel operation processing, comprising:
a plurality of analog operation circuits each of which executes operation processing of information represented by an analog signal;
a capacitor which accumulates, as a charge amount, a sum of the operation results by said plurality of analog operation circuits;
a comparator which converts the charge amount accumulated in said capacitor into a pulse signal having a corresponding pulse width;
a pulse width/digital conversion circuit which converts the pulse signal into a digital signal;
a digital operation circuit which calculates the accumulation value on the basis of the converted digital signal; and
a D/A conversion circuit which converts an input digital signal into the analog signal and supplies the analog signal to said plurality of analog operation circuits,
wherein said pulse width/digital conversion circuit comprises
a counter which counts a clock and outputs a count value as a digital signal, and
a plurality of trailing edge latch circuits each of which latches a common count value output from said counter at a trailing edge of the input pulse signal,
said D/A conversion circuit including a digital/pulse width conversion circuit which converts the digital signal into a pulse signal having a pulse width corresponding to the digital signal value, said digital/pulse width conversion circuit comprising:
a second counter which counts a clock and output a count value as a digital signal, and
a plurality of pulse generation circuits each of which compares the digital input value with the common count value output from said second counter and generates one of an output pulse signal having a time width from a predetermined time to a time when the input value coincides with the count value or an output pulse signal having a time width from a time when a value obtained by subtracting the input value from a predetermined maximum count value coincides with the count value to a time when the count value reaches the maximum count value.

35. The operation circuit according to claim 34, wherein each of said plurality of pulse generation circuits comprises
a pulse width register which latches the input value,
a timing trigger generation circuit which compares each bit of the input value latched by said pulse width register with each bit of the count value output from said second counter and generates a trigger when the bits perfectly coincide, and an output pulse inverting circuit which inverts a truth value of the output pulse signal upon generation of the trigger by said timing trigger generation circuit.

36. The operation circuit according to claim 34, wherein each of said plurality of pulse generation circuits comprises
a reference value register which latches a reference value as a digital value representing a timing of a leading edge of the output pulse,
an addition circuit which outputs a sum of the reference value and the input value as the input digital value,
a pulse width register which latches the output value from said addition circuit,
a switching circuit which selectively outputs one of the digital value latched by said reference value register and the digital value latched by said pulse width register,
a timing trigger generation circuit which compares each bit of a digital value output from said switching circuit with each bit of the count value output from said second counter and generates a trigger when the bits perfectly coincide, and
an output pulse inverting circuit which inverts a truth value of the output pulse signal upon generation of the trigger by said timing trigger generation circuit, and
said switching circuit executes switching to output the digital value latched by said reference value register upon output of an output pulse having a false value from said output pulse inverting circuit and output the digital value latched by said pulse width register upon output of an output pulse having a true value from said output pulse inverting circuit.

37. The operation circuit according to claim 34, further comprising:
a current source circuit which is controlled by the output pulse signal from said digital/pulse width conversion circuit, and
a second capacitor which accumulates charges from said current source circuit.

38. An operation control method for an operation circuit which calculates an accumulation value of operation results by parallel operation processing, comprising the steps of:
(a) causing a plurality of analog operation circuits to execute operation processing of information represented by an analog signal;
(b) causing a capacitor to accumulate a sum of results of the operation processing as a charge amount;
(c) converting the charge amount accumulated in the capacitor into a pulse signal having a corresponding pulse width;
(d) converting the pulse signal into a digital signal; and
(e) calculating the accumulation value on the basis of the converted digital signal, wherein the step (d) comprises the steps of (d-1) causing a counter to count a clock and output a count value as a digital signal, (d-2) causing a plurality of trailing edge latch circuits to latch a common count value output from the counter at a trailing edge of the input pulse signal (d-3) causing a leading edge latch circuit to latch the count value output from said counter at a leading edge of the pulse signal in correspondence with each of the plurality of trailing edge latch circuits, and (d-4) causing a subtraction circuit to operate and output a difference between a digital output value from said trailing edge latch circuit and a digital output value from said leading edge latch circuit in correspondence with each of the plurality of trailing edge latch circuits.

* * * * *

UNITED STATES PATENT AND TRADEMARK OFFICE
CERTIFICATE OF CORRECTION

PATENT NO. : 7,120,617 B2
APPLICATION NO. : 11/036001
DATED : October 10, 2006
INVENTOR(S) : Osamu Nomura et al.

It is certified that error appears in the above-identified patent and that said Letters Patent is hereby corrected as shown below:

TITLE PAGE:
(56) References Cited OTHER PUBLICATIONS "Kelsuke Korekado, et al." should read -- Keisuke Korekado, et al.; --.

COLUMN 1:
Line 17, "the society" should read --society--.

COLUMN 2:
Line 46, "The" should start a new paragraph.

COLUMN 3:
Line 10, "circuit 112)." should read -- circuit 112. --;
Line 13, close up right margin;
Line 14, close up left margin;
Line 17, close up right margin;
Line 18, close up left margin; and
Line 19, "desabled." should read -- disabled. --.

COLUMN 10:
Line 39, "(iÅ{0, 1, . . . , n-1})" should read -- (i$\epsilon$\{0, 1,..., n-1\}) --.

COLUMN 11:
Line 8, "(jÅ{0, 1, . . . , m-1})" should read -- (j$\epsilon$\{0, 1,..., m-1\}) --.

COLUMN 12:
Line 59, "Si=\{Si,0 to Si,m-l)" should read -- Si=\{Si,0 to Si,m-1\} --;
Line 62, "Di=(Di,0 to" should read -- Di=\{Di,0 to --;
Line 63, "Di,m-1})." should read -- Di,m-1\}. --; and
Line 64, "Di=(Di,0 to Di,m-1\}" should read -- Di=\{Di,0 to Di,m-1\} --.

COLUMN 13:
Lines 5-6, "Di=(Di,0 to Di,m-1)" should read -- Di\{Di,0 to Di, m-1\} --.

COLUMN 15:
Line 14, "ates" should read -- gates --.

COLUMN 19:
Line 5, "from." should read -- from --;
Line 29, "value xi (strictly" should read -- value xi. (Strictly --; and
Line 33, "advance)." should read -- advance.) --.

UNITED STATES PATENT AND TRADEMARK OFFICE
CERTIFICATE OF CORRECTION

PATENT NO. : 7,120,617 B2
APPLICATION NO. : 11/036001
DATED : October 10, 2006
INVENTOR(S) : Osamu Nomura et al.

It is certified that error appears in the above-identified patent and that said Letters Patent is hereby corrected as shown below:

COLUMN 21:
Line 10, "THIRT" should read -- THIRD --.

COLUMN 23:
Line 29, "voltage;" should read -- voltage. --.

COLUMN 29:
Line 3, "ht" should read -- the --.

COLUMN 32:
Line 39, "does" should read -- do --.

COLUMN 35:
Line 15, close up right margin;
Line 16, close up left margin;
Line 28, close up right margin; and
Line 29, close up left margin, and "15. Referring" should read -- Referring --.

COLUMN 40:
Line 54, "digital-memory" should read -- digital memory --.

COLUMN 41:
Line 62, "voltage." should read -- voltage --.

COLUMN 50:
Line 14, "operation circuit" should read -- operation circuit, --;
Lines 15 and 35, "with/digital" should read -- width/digital --; and
Line 64, "operation circuit" should read -- operation circuit, --.

COLUMN 52:
Lines 27 and 56, "operation circuit" should read -- operation circuit, --.

COLUMN 53:
Lines 14 and 39, "operation circuit" should read -- operation circuit, --.

COLUMN 54:
Line 1, "operation circuit" should read -- operation circuit, --; and
Line 55, "signal" should read -- signal, --.

COLUMN 56:
Lines 2 and 31, "processing" should read -- processing, --.

UNITED STATES PATENT AND TRADEMARK OFFICE
CERTIFICATE OF CORRECTION

PATENT NO. : 7,120,617 B2
APPLICATION NO. : 11/036001
DATED : October 10, 2006
INVENTOR(S) : Osamu Nomura et al.

It is certified that error appears in the above-identified patent and that said Letters Patent is hereby corrected as shown below:

COLUMN 57:
Line 61, "output" should read -- outputs --.

COLUMN 58:
Line 8, "each" should start a new paragraph; and
Line 14, "an" should start a new paragraph.

COLUMN 59:
Line 6, "signal" should read -- signal, --.

Signed and Sealed this

Fourth Day of September, 2007

JON W. DUDAS
*Director of the United States Patent and Trademark Office*

UNITED STATES PATENT AND TRADEMARK OFFICE
CERTIFICATE OF CORRECTION

PATENT NO.       : 7,120,617 B2
APPLICATION NO.  : 11/036001
DATED            : October 10, 2006
INVENTOR(S)      : Osamu Nomura et al.

It is certified that error appears in the above-identified patent and that said Letters Patent is hereby corrected as shown below:

COVER PAGE:
(56) References Cited OTHER PUBLICATIONS "Kelsuke Korekado, et al.;" should read -- Keisuke Korekado, et al.; --.

COLUMN 1:
Line 17, "the society" should read --society--.

COLUMN 2:
Line 46, "The" should start a new paragraph.

COLUMN 3:
Line 10, "circuit 112)." should read -- circuit 112. --;
Line 13, close up right margin;
Line 14, close up left margin;
Line 17, close up right margin;
Line 18, close up left margin; and
Line 19, "desabled." should read -- disabled. --.

COLUMN 10:
Line 39, "(iÅ{0, 1, . . . , n-1})" should read -- (i∈{0, 1, . . . , n-1}) --.

COLUMN 11:
Line 8, "(jÅ{0, 1, . . . , m-1})" should read -- (j∈{0, 1, . . . , m-1}) --.

COLUMN 12:
Line 59, "Si={Si,0 to Si,m-1)" should read -- Si={Si,0 to Si,m-1} --;
Line 62, "Di=(Di,0 to" should read -- Di={Di,0 to --;
Line 63, "Di,m-1])." should read -- Di,m-1}. --; and
Line 64, "Di=(Di,0 to Di,m-1}" should read -- Di={Di,0 to Di,m-1} --.

COLUMN 13:
Lines 5-6, "Di=(Di,0 to Di,m-1)" should read -- Di={Di,0 to Di,m-1} --.

COLUMN 15:
Line 14, "ates" should read -- gates --.

COLUMN 19:
Line 5, "from." should read -- from --;
Line 29, "value xi (strictly" should read -- value xi. (Strictly --; and
Line 33, "advance)." should read -- advance.) --.

UNITED STATES PATENT AND TRADEMARK OFFICE
CERTIFICATE OF CORRECTION

PATENT NO. : 7,120,617 B2
APPLICATION NO. : 11/036001
DATED : October 10, 2006
INVENTOR(S) : Osamu Nomura et al.

It is certified that error appears in the above-identified patent and that said Letters Patent is hereby corrected as shown below:

COLUMN 21:
Line 10, "THIRT" should read -- THIRD --.

COLUMN 23:
Line 29, "voltage;" should read -- voltage. --.

COLUMN 29:
Line 3, "ht" should read -- the --.

COLUMN 32:
Line 39, "does" should read -- do --.

COLUMN 35:
Line 15, close up right margin;
Line 16, close up left margin;
Line 28, close up right margin; and
Line 29, close up left margin, and "15. Referring" should read -- Referring --.

COLUMN 40:
Line 54, "digital-memory" should read -- digital memory --.

COLUMN 41:
Line 62, "voltage." should read -- voltage --.

COLUMN 50:
Line 14, "operation circuit" should read -- operation circuit, --;
Lines 15 and 35, "with/digital" should read -- width/digital --; and
Line 64, "operation circuit" should read -- operation circuit, --.

COLUMN 52:
Lines 27 and 56, "operation circuit" should read -- operation circuit, --.

COLUMN 53:
Lines 14 and 39, "operation circuit" should read -- operation circuit, --.

COLUMN 54:
Line 1, "operation circuit" should read -- operation circuit, --; and
Line 55, "signal" should read -- signal, --.

UNITED STATES PATENT AND TRADEMARK OFFICE
CERTIFICATE OF CORRECTION

PATENT NO. : 7,120,617 B2
APPLICATION NO. : 11/036001
DATED : October 10, 2006
INVENTOR(S) : Osamu Nomura et al.

It is certified that error appears in the above-identified patent and that said Letters Patent is hereby corrected as shown below:

COLUMN 56:
Lines 2 and 31, "processing" should read -- processing, --.

COLUMN 57:
Line 61, "output" should read -- outputs --.

COLUMN 58:
Line 8, "each" should start a new paragraph; and
Line 14, "an" should start a new paragraph.

COLUMN 59:
Line 6, "signal" should read -- signal, --.

Signed and Sealed this

Eighteenth Day of September, 2007

JON W. DUDAS
*Director of the United States Patent and Trademark Office*